(12) United States Patent
Kabeshita et al.

(10) Patent No.: US 7,077,262 B2
(45) Date of Patent: Jul. 18, 2006

(54) DEVICE AND METHOD FOR CONVEYING AND HOLDING PLATE-LIKE MEMBER

(75) Inventors: Akira Kabeshita, Hirakata (JP); Osamu Okuda, Yamanashi (JP); Naoto Mimura, Yamanashi (JP)

(73) Assignee: Matsushita Electric Industrial Co., Ltd, Osaka (JP)

( * ) Notice: Subject to any disclaimer, the term of this patent is extended or adjusted under 35 U.S.C. 154(b) by 0 days.

(21) Appl. No.: 11/035,997

(22) Filed: Jan. 18, 2005

(65) Prior Publication Data

US 2005/0133346 A1 Jun. 23, 2005

Related U.S. Application Data

(62) Division of application No. 09/979,221, filed as application No. PCT/JP00/03212 on May 19, 2000, now Pat. No. 6,988,612.

(30) Foreign Application Priority Data

May 21, 1999 (JP) .................................. 11-141597

(51) Int. Cl.
 *B65G 15/10* (2006.01)
(52) U.S. Cl. .................... 198/817; 198/586; 198/369.1
(58) Field of Classification Search ............. 198/369.1, 198/817, 586, 345.1, 345.2, 346.2, 346.3; 414/609; 29/740, 832
See application file for complete search history.

(56) References Cited

U.S. PATENT DOCUMENTS

| | | | |
|---|---|---|---|
| 4,315,705 A * | 2/1982 | Flint ........................ | 198/346.2 |
| 4,638,985 A | 1/1987 | Maeda et al. | |
| 5,368,643 A * | 11/1994 | Kuster ....................... | 198/817 |
| 5,452,509 A | 9/1995 | Suzuki et al. | |
| 5,520,276 A * | 5/1996 | Aoki et al. ............... | 198/345.1 |
| 5,729,892 A | 3/1998 | Umemura et al. | |
| 5,749,698 A | 5/1998 | Miyoshi | |
| 5,778,524 A | 7/1998 | Stridsberg | |
| 5,813,514 A * | 9/1998 | Keith ....................... | 198/346.2 |
| 5,850,689 A | 12/1998 | Mogi et al. | |
| 5,855,059 A | 1/1999 | Togami et al. | |
| 5,894,657 A | 4/1999 | Kanayama et al. | |
| 6,032,788 A | 3/2000 | Smithers et al. | |
| 6,378,198 B1 | 4/2002 | Asai et al. | |
| 6,663,712 B1 | 12/2003 | Doyle et al. | |
| 6,688,458 B1 | 2/2004 | Prentice et al. | |
| 6,826,821 B1 * | 12/2004 | Geiger et al. .................. | 29/563 |

FOREIGN PATENT DOCUMENTS

| | | |
|---|---|---|
| DE | 197 07 267 | 8/1998 |
| EP | 0 149 469 | 7/1985 |
| EP | 0 826 612 | 3/1998 |
| EP | 0 862 356 | 9/1998 |
| JP | 6-310898 | 11/1994 |
| JP | 8-8594 | 1/1996 |
| JP | 9-97999 | 4/1997 |
| JP | 9-183502 | 7/1997 |
| JP | 10-93294 | 4/1998 |
| JP | 10-135684 | 5/1998 |

* cited by examiner

*Primary Examiner*—James R. Bidwell
(74) *Attorney, Agent, or Firm*—Wenderoth, Lind & Ponack, L.L.P.

(57) ABSTRACT

In a component mounting work area, two electronic circuit boards are placed in a zigzag manner and components are mounted independently on each board. Two sets of working their drive units, board conveying/holding devices recognition cameras and so forth are also arranged. The board conveying/holding devices for holding boards are moved to positions close to component feed units, and components are mounted in respective mounting areas.

16 Claims, 33 Drawing Sheets

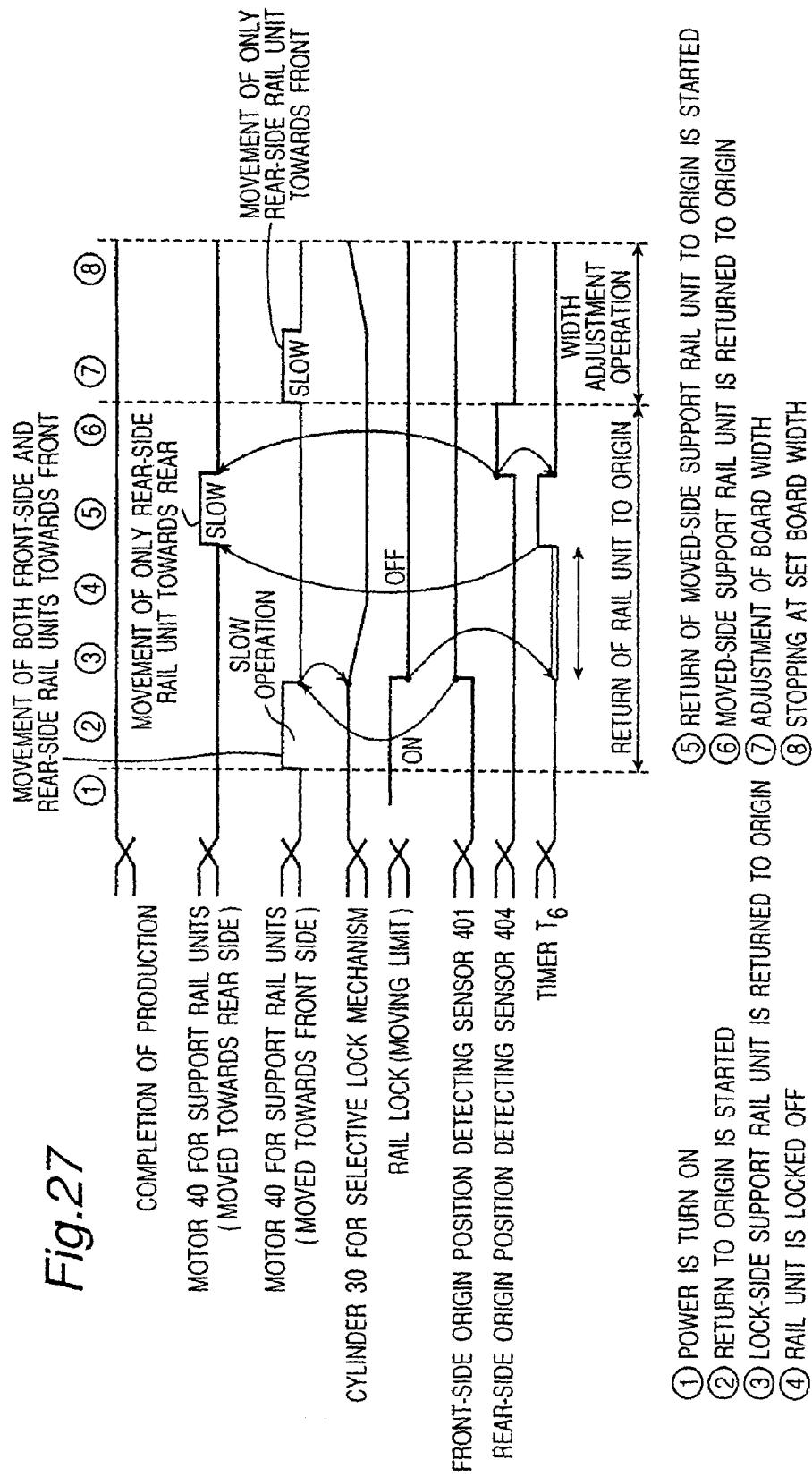

Fig.28

- CONTROL UNIT ~1000
  - BOARD PASSAGE DETECTING SENSOR ~31(31-1,31-2)
  - BOARD ARRIVAL DETECTING SENSOR ~33(33-1,33-2)
  - SENSOR FOR DETECTING UPPER LIMIT POSITION OF CYLINDER FOR DRIVING SUPPORT PLATE ~S39U
  - SENSOR FOR DETECTING LOWER LIMIT POSITION OF CYLINDER FOR DRIVING SUPPORT PLATE ~S39L
  - SENSOR FOR DETECTING FRONT-SIDE LIMIT POSITION ~400
  - SENSOR FOR DETECTING FRONT-SIDE ORIGIN POSITION ~401
  - SENSOR FOR PREVENTING COLLISION ~406
  - SENSOR FOR DETECTING REAR-SIDE ORIGIN POSITION ~404
  - SENSOR FOR DETECTING REAR-SIDE LIMIT POSITION ~405
  - RECOGNITION CAMERA ~9,19
  - XY ROBOT ~5,15
  - WORKING HEAD ~4,14
  - LOADER ~1
  - UNLOADER ~11
  - MOTOR FOR MOVING SUPPORT RAIL UNITS ~40
  - MOTOR FOR DRIVING BELT ~42
  - CYLINDER FOR DRIVING BOARD STOPPER ~32D
  - CYLINDER FOR DRIVING SUPPORT PLATE ~39
  - CYLINDER FOR SELECTIVE LOCK MECHANISM ~30
  - DATABASE ~1001
  - OPERATION UNIT ~1002
  - TIMER ~T1,T2,T3,T4,T6

DEVICE AND METHOD FOR CONVEYING AND HOLDING PLATE-LIKE MEMBER

This is a divisional application of U.S. patent application Ser. No. 09/979,221, filed Nov. 20, 2001, now U.S. Pat. No. 6,988,612, which is a national stage application of International application No. PCT/JP00/03212, filed May 19, 2000.

TECHNICAL FIELD

The present invention relates to an apparatus and method for conveying and holding a plate-like member, wherein a carried-in plate-like member can be held and, after prescribed operations such as printing, processing, component mounting, and so forth, the held plate-like member can be carried out. In particular, the present invention relates to a work apparatus such as a component mounting apparatus or the like equipped with a plate-like member conveying/holding device such as a board conveying/holding device for holding a board when the board onto which components are mounted is used as an example of a plate-like member and components are mounted on the board.

BACKGROUND ART

In recent years, while electronic circuit boards vary in sizes widely from a small size type including a portable telephone to a large size board such as a server computer or the like, it is being required to produce them most efficiently in a minimum process time. As a form of a mounting apparatus, a robot-type mounting apparatus, in which a working head for sucking electronic components is moved by using an XY robot to mount the electronic components, is becoming mainstream.

Hereafter, an example of a conventional electronic component mounting apparatus is explained with reference to FIG. 35.

In the figure, reference numerals 1201, 1202 and 1203 denote component feed units for taping components. Reference numeral 204 denotes a component feed unit for components housed on a tray. Reference numeral 1204 denotes a component feed unit for components housed on a tray. Reference numerals 1205 and 1206 denote recognition cameras for picking up an image of a suction attitude of an electronic component in a working head before mounted. Reference numeral 1207 denotes a nozzle station for housing a plurality of kinds of nozzles suitable for a plurality of kinds of electronic components. Reference numeral 1208 denotes a loader for carrying an electronic circuit board 1211 into a component mounting work area. Reference numeral 1209 denotes a board conveying/holding device composed of support rails 1209a, 1209b for supporting an electronic circuit board 1212. The board conveying/holding device 1209 is constituted such that one support rail 1209b can be moved as far as a position 1210 according to the maximum size of the electronic circuit board to be applied. Reference numeral 1213 denotes an unloader for carrying the electronic circuit board 1211 out of the component mounting work area.

Operations in the conventional electronic component mounting apparatus are explained with reference to FIG. 35. An electronic circuit board 1211 is supported by support rails 1209a, 1209b via a loader 1208. A working head (not shown) is moved by an XY robot along a path shown with A in FIG. 35. An electronic component is sucked by a component suction nozzle attached to the working head from a taping component feed unit 1201. The working head is moved and a suction attitude of the sucked component is measured by a recognition camera 1205. After the calculation for a position correction, the sucked and recognized component is mounted onto the electronic circuit board 1212 by movement of the working head while its position is corrected. Meanwhile, a component feed unit for feeding electronic components is also disposed in the rear of the component mounting work area of the mounting apparatus as shown with reference numerals 1203 and 1204. An image of an electronic component sucked from the taping component feed unit 1203 or the components housed on a tray 1204 is also picked up by a recognition camera 1206 so that its attitude at a suction position is recognized. After the calculation for a position correction, the sucked and recognized component is mounted onto the electronic circuit board 1212 by a nozzle. This path is shown with B.

In recent years, electronic circuit boards vary from a small size type to a large size type. In an electronic component mounting apparatus, support rails 1209a, 1209b are designed in a size in which a board of up to the maximum size can be supported. Therefore, the support rails 1209a, 1209b are constituted such that the support rail 1209a on the front side of the mounting apparatus is fixed while the support rail 1209b in the rear can be moved depending on the board size. Consequently, the component feed units 1203, 1204 in the rear are disposed further behind the furthest rear position 1210 of the support rail 1209b. In a small size board, this seriously hinders reduction of a mounting time since the moving distance of the working head from suction of the electronic component to mounting through recognition is increased, resulting in the longer moving time as shown with path B. While the mounting time needs to be reduced to reduce costs of mounting electronic components, the distances between three processes, that is, a suction process, recognition process, and mounting process of electronic components needs to be minimized to reduce this mounting time. To minimize the distances between the three processes, there is a method of integrally moving support rails 1209a, 1209b, support pins which are disposed below the support rails 1209a, 1209b and support the electronic circuit board from downward, and a support plate, on which the support pins are disposed, depending on the electronic component to be fed. However, a mechanism for moving the support pins and the support plate is required and the movement amount of these members itself is little. Thus, this method is not very effective. In view of the mounting quality, moving the electronic circuit board more than necessary during component mounting is not a good method.

Accordingly, the object of the present invention is to provide an apparatus and method for conveying and holding a plate-like member, wherein the plate-like member can be carried in to a conveying position and then moved to a desired work position to perform a desired work efficiently while being held irrespective of the size of the plate-like member and, after the desired work, can be moved to a conveying position and carried out so that the plate-like member is carried in, held, and carried out efficiently and rapidly, and thus the above issue is solved.

Furthermore, the present invention provides a component mounting apparatus equipped with the plate-like member conveying/holding device as a board conveying/holding device, wherein the moving distances of a component holding member between component holding, component recognition, and component mounting can be reduced irrespective of the size of the board to shorten the mounting time and thereby improve mounting efficiency.

SUMMARY OF THE INVENTION

In order to achieve the above object, the present invention has the following constitutions.

According to a first aspect of the present invention, there is provided a device for conveying and holding a plate-like member, comprising:

a first rail-like holding member and a second rail-like holding member, each including a conveying member for conveying the plate-like member so that the plate-like member can be carried in and out and held;

a ball screw shaft which extends in a direction perpendicular to a longitudinal direction of the first rail-like holding member and the second rail-like holding member and moves the second rail-like holding member or moves the first rail-like holding member and second rail-like holding member in parallel;

a rotation drive unit which drives rotation of the ball screw shaft;

a first nut which is attached rotatably relative to the first rail-like holding member and screw-threaded with the screw shaft;

a second nut which is fixedly attached to the second rail-like holding member and screw-threaded with the screw shaft; and a selective lock mechanism which can alternatively select an operation of engaging with the first nut of the first rail-like holding member to stop rotation of the first nut and an operation of releasing the engagement with the first nut of the first rail-like holding member to allow the first nut to rotate relative to the first rail-like holding member.

After the selective lock mechanism releases the engagement with the first nut of the first rail-like holding member to allow the first nut to rotate relative to the first rail-like holding member, only the second rail-like holding member is moved by rotating the screw shaft, and a position of the second rail-like holding member relative to the first rail-like holding member is changed, while, after the selective lock mechanism is engaged with the first nut of the first rail-like holding member, the first rail-like holding member and the second rail-like holding member are integrally moved in parallel by rotating the screw shaft.

According to a second aspect of the present invention, there is provided a device for conveying and holding a plate-like member according to the first aspect, wherein the rotation drive unit is one motor for driving forward and reverse rotation of the screw shaft.

According to a third aspect of the present invention, there is provided a device for conveying and holding a plate-like member according to the first aspect, wherein the second nut screw-threaded with the screw shaft is not attached fixedly to the second rail-like holding member, but attached rotatably relative to the second rail-like holding member. Meanwhile, the selective lock mechanism can select alternatively an operation of engaging with the second nut of the second rail-like holding member to stop rotation of the second nut or an operation of releasing engagement with the second nut of the second rail-like holding member to allow the second nut to rotate.

The selective lock mechanism releases the engagement with the first nut of the first rail-like holding member to allow the first nut to rotate relative to the first rail-like holding member and then rotates the screw shaft to move only the second rail-like holding member relative to the first rail-like holding member, or the selective lock mechanism releases the engagement with the second nut of the second rail-like holding member to allow the second nut to rotate relative to the second rail-like holding member and then rotates the screw shaft to move only the first rail-like holding member relative to the second rail-like holding member so that a gap distance between the first rail-like holding member and the second rail-like holding member is changed. Meanwhile, the selective lock mechanism engages with the first nut of the first rail-like holding member and the second nut of the second rail-like holding member and then rotates the screw shaft so that the first rail-like holding member and the second rail-like holding member are integrally moved in parallel.

According to a fourth aspect of the present invention, there is provided a device for conveying and holding a plate-like member according to any one of the first to third aspects, further comprising a linear guide mechanism which extends in parallel to the screw shaft in a direction perpendicular to an axial direction of each of the rail-like holding members and guides parallel movement of the two rail-like holding members.

According to a fifth aspect of the present invention, there is provided a device for conveying and holding a plate-like member according to any one of the first to fourth aspects, wherein the selective lock mechanism engages with the first nut of the first rail-like holding member to rotate the screw shaft and then the first rail-like holding member and the second rail-like holding member are integrally moved in parallel so that, first, the first rail-like holding member is positioned at a reference position and then the selective lock mechanism releases the engagement with the first nut of the first rail-like holding member to allow the first nut to rotate relative to the first rail-like holding member and then rotates the screw shaft so that only the second rail-like holding member is moved and a position of the second rail-like holding member relative to the first rail-like holding member at the reference position is changed to adjust the gap between the first rail-like holding member and the second rail-like holding member.

Then, the selective lock mechanism engages with the first nut of the first rail-like holding member and then rotates the screw shaft so that the first rail-like holding member and the second rail-like holding member are integrally moved in parallel while the adjusted gap is maintained.

According to a sixth aspect of the present invention, there is provided a device for conveying and holding a plate-like member according to any one of the first to fifth aspects, further comprising a stopper which is brought into contact with the plate-like member to position and hold the plate-like member at the prescribed position when the plate-like member is conveyed between the first rail-like holding member and the second rail-like holding member by the conveying member.

According to a seventh aspect of the present invention, there is provided a component mounting apparatus equipped with a device for conveying and holding a plate-like member, wherein the plate-like member is a board onto which components are to be mounted. Two of the devices for conveying and holding a plate-like member according to any one of the first to sixth aspects are used as board conveying/holding devices for conveying and holding the board in the component mounting apparatus for mounting the components onto the board. A component mounting work area in the component mounting apparatus, in which the components are mounted, is divided into a first mounting area and a second mounting area along the board conveying direction, one of the devices for conveying and holding a plate-like member being used as a first board conveying/holding device in the first mounting area and the other device for conveying/holding a plate-like member being used as a second board conveying and holding device in the second mounting area. Each board conveying/holding device is independently driven in each mounting area.

According to an eighth aspect of the present invention, there is provided a component mounting apparatus equipped with a device for conveying and holding a plate-like member according to the seventh aspect, wherein a first component mounting position of the first board conveying/holding device in the first mounting area and a second component mounting position of the second board conveying/holding device in the second mounting area are disposed in zigzag so as to be diagonally opposed to each other.

According to a ninth aspect of the present invention, there is provided a component mounting apparatus equipped with a device for conveying and holding a plate-like member according to the seventh or eighth aspect, wherein a first component feed unit for feeding the components to be mounted onto the board at an end edge portion in the first mounting area on an opposite side of the second mounting area, and a first component recognition unit is disposed in the vicinity of the first component feed unit. A second component feed unit for feeding the components is to be mounted onto the board at an end edge portion in the second mounting area on an opposite side of the first mounting area, and a second component recognition unit is disposed in the vicinity of the second component feed unit.

According to a tenth aspect of the present invention, there is provided a component mounting apparatus equipped with a device for conveying and holding a plate-like member according to the ninth aspect, wherein the first component feed unit, the first component recognition unit, the second component feed unit, and the second component recognition unit are disposed substantially point-symmetrically with respect to a center of the whole component mounting work area combining the first mounting area and the second mounting area.

According to an 11th aspect of the present invention, there is provided a component mounting apparatus equipped with a device for conveying and holding a plate-like member according to the ninth or tenth aspect, wherein the first component mounting position of the first board conveying/holding device in the first mounting area is determined in consideration to a distance between the first component feed unit and the first component recognition unit, while the second component mounting position of the second board conveying/holding device in the second mounting area is determined in consideration to a distance between the second component feed unit and the second component recognition unit.

According to a 12th aspect of the present invention, there is provided a component mounting apparatus equipped with a device for conveying and holding a plate-like member according to any one of the ninth to 11th aspects, wherein the first component feed unit and the second component feed unit are component feed units for housing taping components to be mounted onto the board, which are the components housed and held in a tape.

According to a 13th aspect of the present invention, there is provided a component mounting device equipped with a device for conveying and holding a plate-like member according to any one of the seventh to 12th aspects, wherein the first component mounting position of the first board conveying/holding device in the first mounting area and the second component mounting position of the second board conveying/holding device in the second mounting area are disposed in a zigzag manner so as to be diagonally opposed to each other. A tray-type component feed unit in which the components to be mounted onto the board are housed on a tray, is disposed at a position other than the first component mounting position in the first mounting area, and another tray-type component feed unit in which the components to be mounted onto the board are housed on a tray, is disposed at the second component mounting position in the second mounting area.

According to a 14th aspect of the present invention, there is provided a component mounting apparatus equipped with a device for conveying and holding a plate-like member according to any one of the seventh to 13th aspects, wherein, when the board is conveyed between the first rail-like holding member and the second rail-like holding member by the conveying member, each board conveying/holding device further comprises a stopper which is brought into contact with the board and positions and holds the board in a vicinity of a center of the whole component mounting work area combining the first mounting area and the second mounting area.

According to a 15th aspect of the present invention, there is provided a component mounting apparatus equipped with a device for conveying/holding a plate-like member according to any one of the seventh to 14th aspects, wherein, when the first board conveying/holding device and the second board conveying/holding device are positioned adjacent to each other in one line, the board can be conveyed from the first board conveying/holding device towards the second board conveying/holding device.

According to a 16th aspect of the present invention, there is provided a component mounting apparatus equipped with a device for conveying and holding a plate-like member according to any one of the seventh to 14th aspects, further comprising a loader for carrying the board into each board conveying/holding device and an unloader for carrying the board out from each board conveying/holding device, wherein the first board conveying/holding device and the second board conveying/holding device can independently perform carrying-in of the board from the loader and carrying-out the board to the unloader, respectively.

According to a 17th aspect of the present invention, there is provided a method for conveying and holding a plate-like member, wherein, when a ball screw shaft disposed to extend in a direction perpendicular to a longitudinal direction of a first rail-like holding member and a second rail-like holding member rotates in a plate-like member conveying/holding device equipped with the first rail-like holding member and the second rail-like holding member, which can carry in and out and hold a plate-like member, rotation of a nut which is screw-threaded to the ball screw shaft and attached to each of the first rail-like holding member and the second rail-like holding member is regulated so that the first rail-like holding member and the second rail-like holding member are integrally moved in parallel to convey the plate-like member.

Regulation of rotation of the nut of either one rail-like holding member of the first rail-like holding member and the second rail-like holding member is released so that the nut is rotated together with the ball screw shaft upon rotation of the ball screw shaft. Movement of the one rail-like holding member is regulated and the other rail-like holding member of the first rail-like holding member and the second rail-like holding member, of which rotation of the nut is regulated, is moved during rotation of the ball screw shaft so that only the other rail-like holding member is moved in parallel with respect to the one rail-like holding member to adjust a gap between the first rail-like holding member and the second rail-like holding member.

According to an 18th aspect of the present invention, there is provided a method for mounting components, comprising:

carrying in a board from a loader to a first board conveying/holding device by the loader and the first board conveying/holding device;

moving the first board conveying/holding device holding the carried-in board to a side of one component feed unit;

mounting components in the one component feed unit onto the board held by the first board conveying/holding device;

carrying the board carried from the first board conveying/holding device to a second board conveying/holding device by the first conveying/holding device and the second board conveying/holding device;

moving the second board conveying/holding device holding the carried-in board to a side of the other component feed unit;

mounting components in the other component feed unit onto the board held by the second board conveying/holding device;

carrying the board from the second board conveying/holding device to an unloader by the second board conveying/holding device and the unloader.

According to a 19th aspect of the present invention, there is provided a method for mounting components according to the 18th aspect, wherein the component mounting in the first board conveying/holding device and the component mounting in the second board conveying/holding device are simultaneously performed.

According to a 20th aspect of the present invention, there is provided a method for mounting components according to the 18th aspect, wherein, while the board conveyance from the loader to the first board conveying/holding device, the board conveyance from the first board conveying/holding device to the second board conveying/holding device, and the board conveyance from the second board conveying/holding device to the unloader are performed on a board conveyance path in one line. The one component feed unit and the other component feed unit are opposed to each other in a direction perpendicular to an extending direction of the board conveyance path. The components are mounted on a half area of the board on a side of the one component feed unit in the first board conveying/holding device and the components are mounted on a half area of the board on a side of the other component feed unit in the second board conveying/holding device.

According to a 21st aspect of the present invention, there is provided a method for mounting components according to the 18th aspect, wherein the board conveyance from the loader to the first board conveying/holding device, the board conveyance from the first board conveying/holding device to the second board conveying/holding device, and the board conveyance from the second board conveying/holding device to the unloader are simultaneously performed.

According to a 22nd aspect of the present invention, there is provided a work device for a plate-like member, comprising:

a first plate-like member conveying/holding device which can carry in and out a plate-like member at a plate-like member conveying position and hold the carried-in plate-like member;

a second plate-like member conveying/holding device which can be adjacent to the first plate-like member conveying/holding device at the plate-like member conveying position, carry in the plate-like member by the first plate-like member conveying/holding device via the first plate-like member conveying holding device, hold the carried-in plate-like member carried in by the first plate-like member conveying/holding device, and carry out the held plate-like member at the plate-like member conveying position;

a first moving device for moving the first plate-like member conveying/holding device in a direction crossing the plate-like member conveying direction between the plate-like member conveying position and a first work position at which a prescribed work is performed for the plate-like member held by the first plate-like member conveying/holding device; and a second moving device for moving the second plate-like member conveying/holding device in a direction crossing the plate-like member conveying direction between the plate-like member conveying position and a second work position at which a prescribed work is performed for the plate-like member held by the second plate-like member conveying/holding device.

The plate-like member is carried in and held by the first plate-like member conveying/holding device positioned at the plate-like member conveying/holding position by the first plate-like member conveying/holding device, the first plate-like member conveying/holding device is moved to the first work position by the first moving device, and the prescribed work is performed for the plate-like member held by the first plate-like member conveying/holding device. The plate-like member held by the first plate-like member conveying/holding device is carried in from the first plate-like member conveying/holding device positioned at the plate-like member conveying/holding position to the second plate-like member conveying/holding device positioned at a position adjacent to the first plate-like member conveying/holding device by the first plate-like member conveying/holding device the second plate-like member conveying/holding device and held by the second plate-like member conveying/holding device. The second plate-like member conveying/holding device is moved to the second work position by the second moving device, and the prescribed work is performed to the plate-like member held by the second plate-like member conveying/holding device.

The plate-like member held by the second plate-like member conveying/holding device is carried out from the second plate-like member conveying/holding device at the plate-like member conveying/holding position by the second plate-like member conveying/holding device.

According to a 23rd aspect of the present invention, there is provided a work device for a plate-like member according to the 22nd aspect, wherein a work area of the work device is divided into two, a first work area and a second work area, assuming the plate-like member conveying direction at the plate-like member conveying position as a border. During work for the plate-like member, the first moving device moves the first plate-like member conveying/holding device to the first work position in the first work area in which the prescribed work is performed for the plate-like member held by the first plate-like member conveying/holding device, while the second moving device moves the second plate-like member conveying/holding device to the second work position in the second work area in which the prescribed work is performed for the plate-like member held by the second plate-like member conveying/holding device.

According to a 24th aspect of the present invention, there is provided a work device for a plate-like member according to the 22nd or 23rd aspect, wherein the plate-like member is a board onto which components are to be mounted, the work device for performing the work for the plate-like member is a component mounting apparatus for mounting the components onto the board and the first and second plate-like member conveying/holding devices are first and second board conveying/holding device.

A component mounting work area in the component mounting apparatus, in which the components are mounted, is divided into a first mounting area and a second mounting area along a board conveying direction. The first board conveying/holding device can be moved to a first component mounting position as the first work position in the first mounting area by the first moving device, while the second board conveying/holding device can be moved to a second component mounting position as the second work position in the second mounting area by the second moving device. The components are independently mounted onto a board held by each board conveying/holding device in each mounting area.

According to a 25th aspect of the present invention, there is provided a work device for a plate-like member according to the 24th aspect, wherein a first component feed unit for feeding the components to be mounted onto the board is disposed at an end edge portion in the first mounting area on an opposite side of the second mounting area, and a first component recognition unit is disposed in a vicinity of the first component feed unit and on a side of the first work position. The work device further comprises a working head which can move in the first mounting area, holds the components from the first component feed unit, and mounts the components onto the board held by the first board conveying/holding device positioned at the first component mounting position after the components are recognized by the first component recognition unit.

A second component feed unit for feeding the components to be mounted onto the board is disposed at an end edge portion in the second mounting area on an opposite side of the first mounting area, and a second component recognition unit is disposed in a vicinity of the second component feed unit and on a side of the second work position. The work device further comprises a working head which can move in the second mounting area, holds the components from the second component feed unit, and mounts the components onto the board held by the second board conveying/holding device positioned at the second component mounting position after the components are recognized by the second component recognition unit.

According to a 26th aspect of the present invention, there is provided a work method for a plate-like member, comprising:

while a first plate-like member conveying/holding device which can carry in and out and hold a plate-like member, and a second plate-like member conveying/holding device which can carry in and out and hold a plate-like member, are positioned adjacent to each other at a plate-like member conveying position, carrying the plate-like member into the first plate-like member conveying/holding device by the first plate-like member conveying/holding device, carrying in and holding the carried-in plate-like member by the second plate-like member conveying/holding device via the first plate-like member conveying/holding device by the first plate-like member conveying/holding device, and carrying in and holding a subsequent plate-like member by the first plate-like member conveying/holding device by the first plate-like member conveying/holding device;

moving the first plate-like member conveying/holding device from the plate-like member conveying position to a first work position in a direction crossing a plate-like member conveying direction, and moving the second plate-like member conveying/holding device from the plate-like member conveying position to a second work position in a direction crossing the plate-like member conveying direction;

performing a prescribed work for the plate-like member held by the first plate-like member conveying/holding device at the first work position, and performing a prescribed work for the plate-like member held by the second plate-like member conveying/holding device at the second work position;

moving the first plate-like member conveying/holding device from the first work position to the plate-like member conveying position in a direction crossing to the plate-like member conveying direction, while moving the second plate-like member conveying/holding device from the second work position to the plate-like member conveying position in a direction crossing to the plate-like member conveying direction; and while the first plate-like member conveying/holding device and the second plate-like member conveying/holding device are positioned adjacent to each other at the plate-like member conveying position, carrying out the plate-like member held by the second plate-like member conveying/holding device from the second plate-like member conveying/holding device by the second plate-like member conveying/holding device, while carrying out the plate-like member held by the first plate-like member conveying/holding device from the first plate-like member conveying/holding device to the second plate-like member conveying/holding device by the first plate-like member conveying/holding device and the second plate-like member conveying/holding device.

According to a 27th aspect of the present invention, there is provided a work method for a plate-like member according to the 26th aspect, wherein, when a work area of the work device is divided into two, a first work area and a second work area assuming the plate-like member conveying direction at the plate-like member conveying position as a border and the plate-like member conveying/holding devices are moved to the work positions.

The first plate-like member conveying/holding device is moved to the first work position in the first work area, in which the prescribed work is performed for the plate-like member held by the first plate-like member conveying/holding device, while the second plate-like member conveying/holding device is moved to the second work position in the second work area, in which the prescribed work is performed for the plate-like member held by the second plate-like member conveying/holding device.

According to a 28th aspect of the present invention, there is provided a work method for a plate-like member according to the 26th or 27th aspect, wherein, when the plate-like member is a board onto which components are to be mounted, the work device for performing the work for the plate-like member is a component mounting apparatus for mounting the components onto the board, the first and second plate-like member conveying/holding devices are first and second board conveying/holding devices, and a component mounting work area in the component mounting apparatus, in which components are mounted is divided into a first mounting area and a second mounting area along a board conveying direction.

The first board conveying/holding device can be moved to a first component mounting position as the first work position in the first mounting area, while the second board conveying/holding device can be moved to a second component mounting position as the second work position in the second mounting area by the second moving device, and components are independently mounted onto a board held by each board conveying/holding device in each mounting area.

According to a 29th aspect of the present invention, there is provided a work method for a plate-like member according to the 28th aspect, wherein, in the first mounting area, the components are held by a working head from a first component feed unit installed at an end edge portion on an opposite side of the second mounting area in the first mounting area during the prescribed work. After the components held by the working head are recognized by a first component recognition unit disposed in a vicinity of the first component feed unit and on a side of the first work position, the components held by the working head are mounted onto the first board conveying/holding device positioned at the first component mounting position.

While independent from the above component holding, component recognition, and component mounting, in the second mounting area, the components are held by a working head from a second component feed unit installed at an end edge portion on an opposite side of the second mounting area in the second mounting area. After the components held by the working head are recognized by a second component recognition unit disposed in a vicinity of the second component feed unit and on a side of the second work position, the components held by the working head are mounted onto the second board conveying/holding device positioned at the second component mounting position.

According to a 30th aspect of the present invention, there is provided a work method for a plate-like member according to the 28th aspect, wherein the plate-like member is held across both the first and second plate-like member conveying/holding devices, and the first and second plate-like member conveying/holding devices are synchronously moved in parallel to either one of the first mounting area and the second mounting area to mount the components.

According to a 31st aspect of the present invention, there is provided a method for mounting components according to the 18th aspect, wherein, while the board conveyance from the loader to the first board conveying/holding device, the board conveyance from the first board conveying/holding device to the second board conveying/holding device, and the board conveyance from the second board conveying/holding device to the unloader are performed on a board conveyance path in one line, the one component feed unit and the other component feed unit are opposed to each other in a direction perpendicular to an extending direction of the board conveyance path and each component recognition unit is disposed in a vicinity of each component feed unit on a side of the board conveyance path. The component mounting of the first board conveying/holding device is performed by holding the components from the one component feed unit, recognizing them by the component recognition unit disposed in the vicinity of the one component feed unit on the side of the board conveyance path, and then mounting them on a half area on the side of the one component feed unit of the board held by the first board conveying/holding device in the first board conveying/holding device. Component mounting of the second board conveying/holding device is performed by holding the components from the other component feed unit, recognizing them by the component recognition unit disposed in the vicinity of the other component feed unit on the side of the board conveyance path, and then mounting them on a half area of the board on the side of the other component feed unit of the board held by the second board conveying/holding device in the second board conveying/holding device.

BRIEF DESCRIPTION OF DRAWINGS

These and other aspects and features of the present invention will become clear from the following description taken in conjunction with the preferred embodiments thereof with reference to the accompanying drawings, in which:

FIG. 20 is an explanatory view showing a state of the support rail units of the respective board conveying/holding devices in the component mounting apparatus of FIG. 1 when boards are carried in;

FIG. 27 is a timing chart of the support rail unit of each of the board conveying/holding devices in the component mounting apparatus of FIG. 1 when the support rail unit is returned to the origin and adjusted according to the board width;

FIG. 28 is a block diagram showing a connection relationship of a control unit to respective drive units and sensors in the component mounting apparatus of FIG. 1;

DETAILED DESCRIPTION OF THE INVENTION

Figure 1:
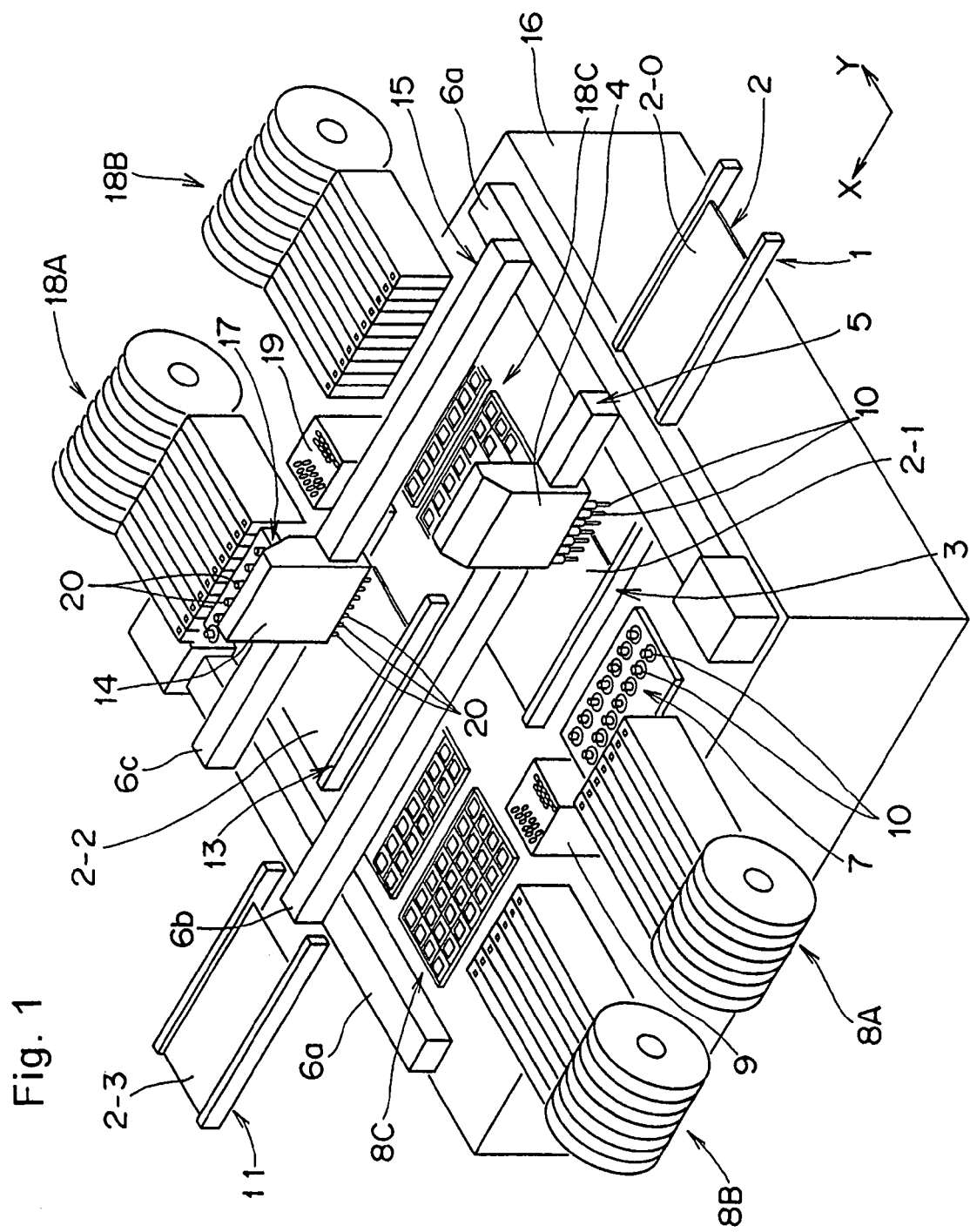
FIG. 1 is a general schematic perspective view showing a component mounting apparatus having a board conveying/holding device according to an embodiment of the present invention.

Before the description of the present invention proceeds, it is to be noted that like parts are designated by like reference numerals throughout the accompanying drawings.

Figure 2:
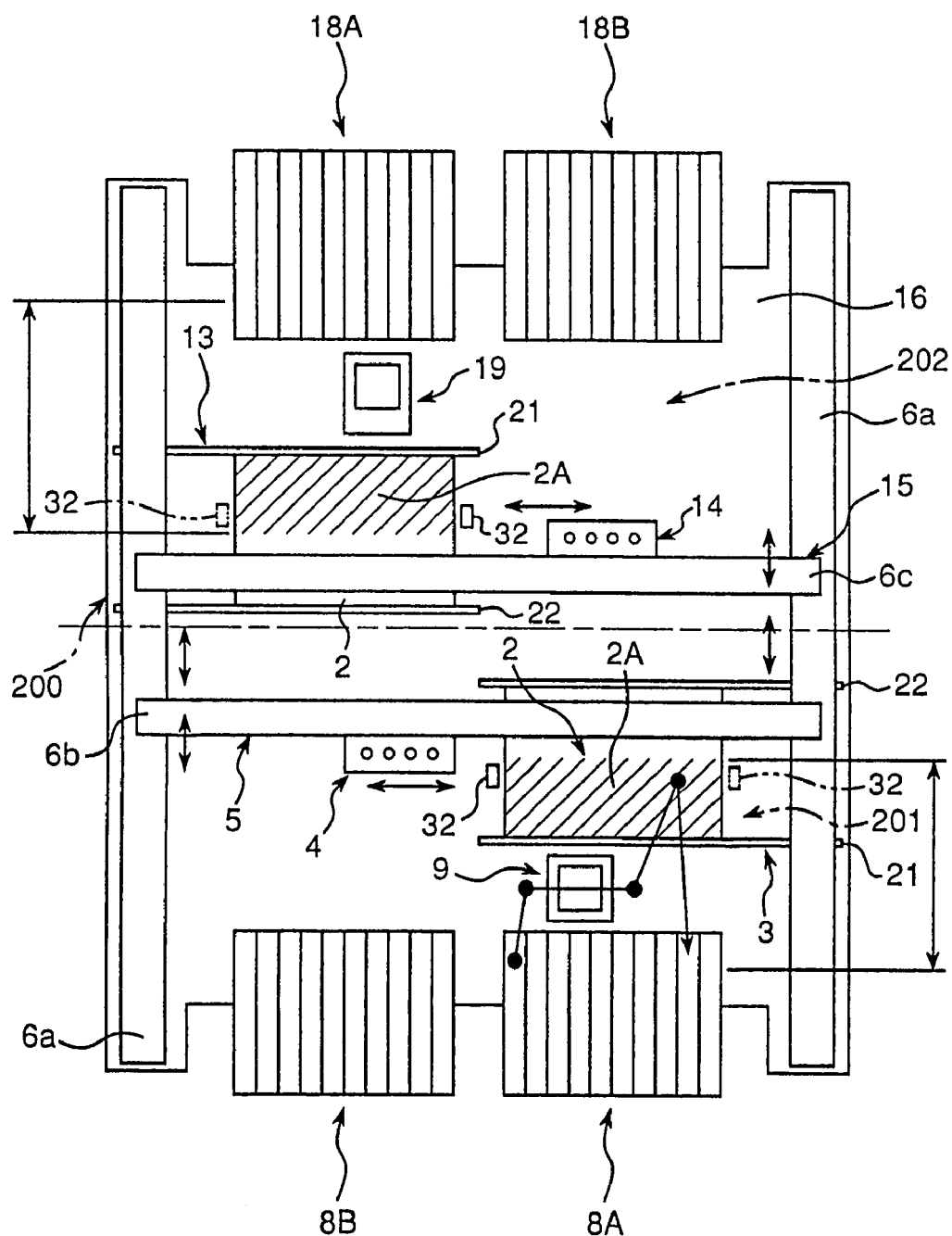
FIG. 2 is a general schematic layout plan of the component mounting apparatus of FIG. 1.
Figure 3:
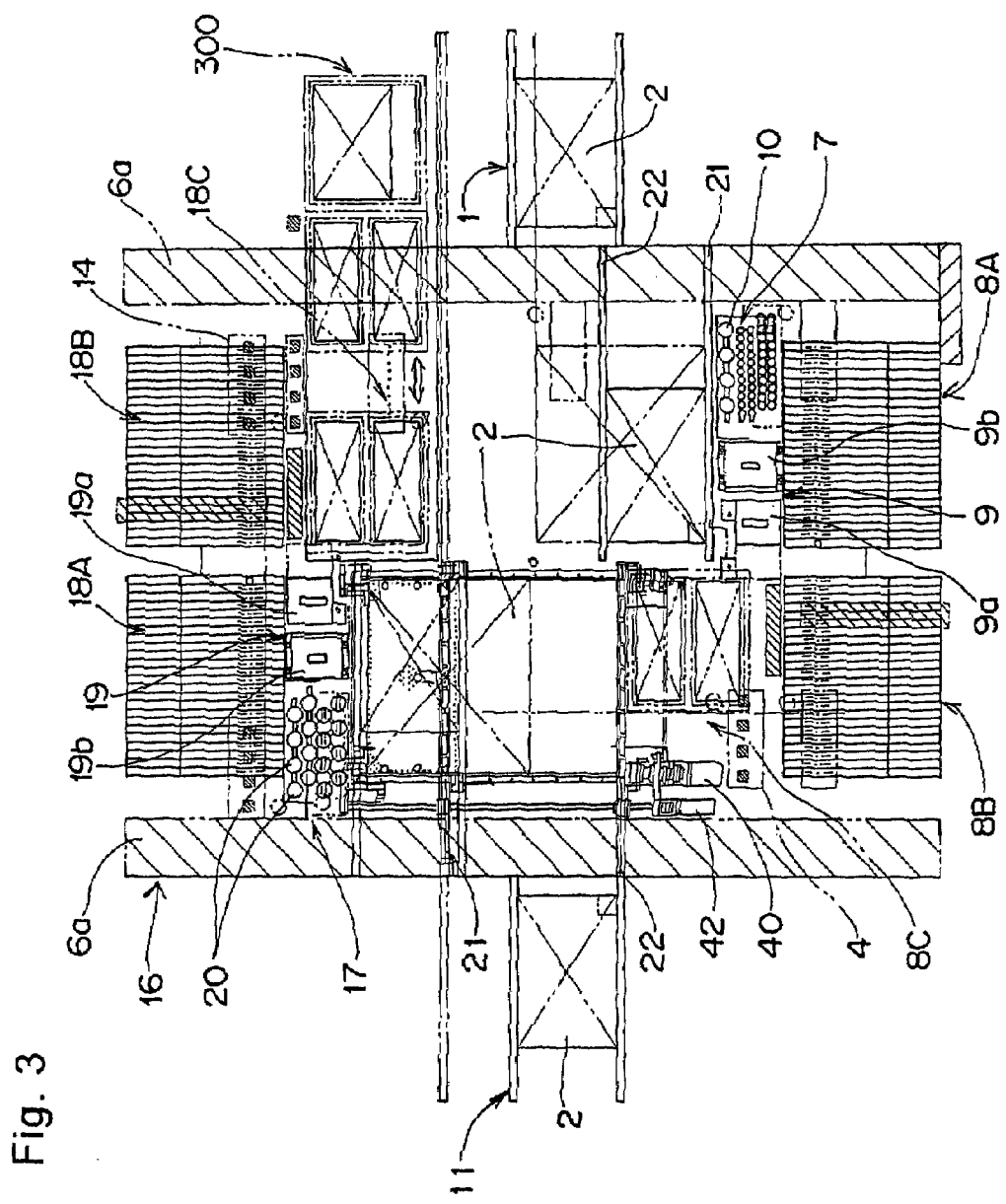
FIG. 3 is a general detail plan view showing the component mounting apparatus of FIG. 1.
Figure 4:
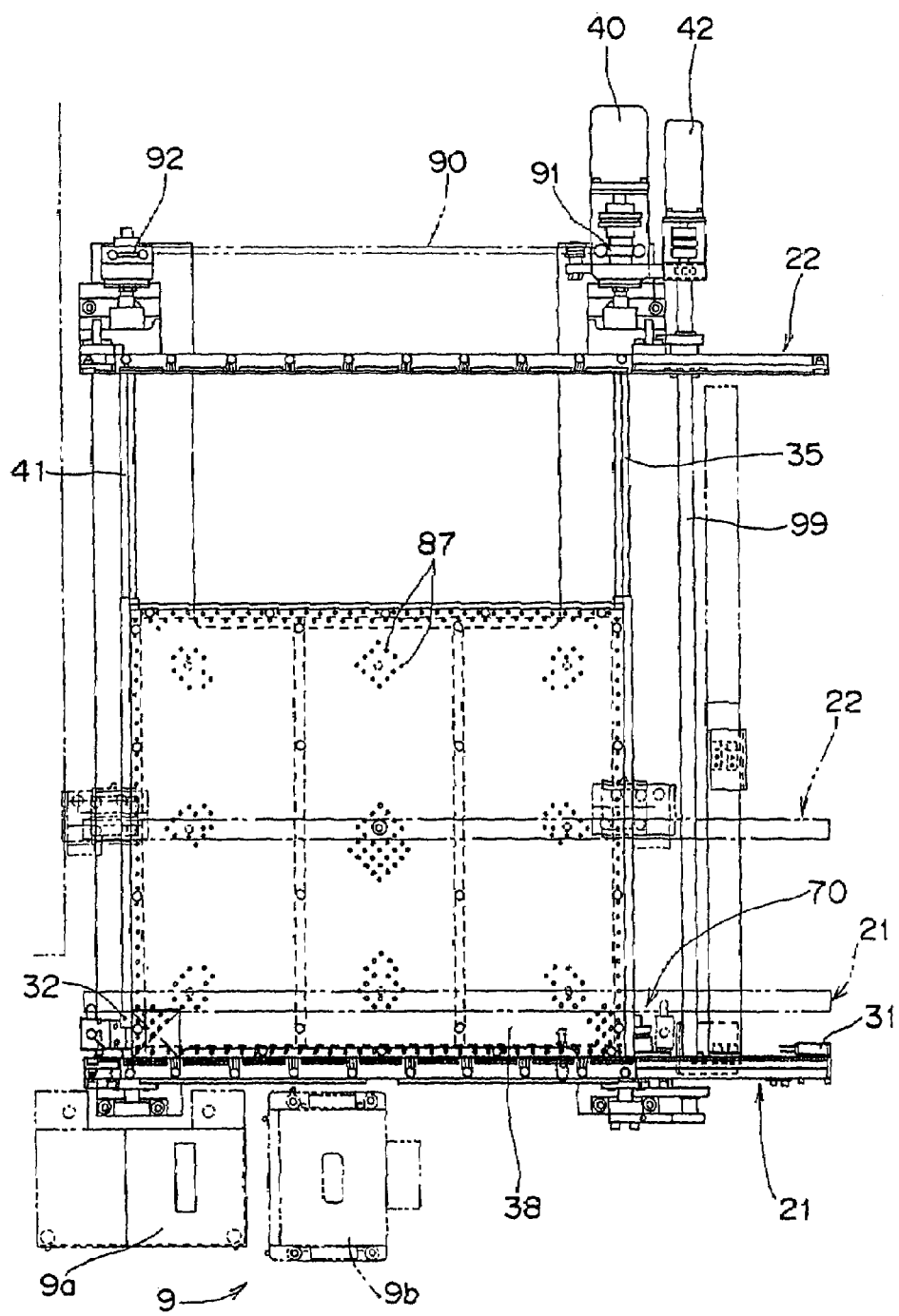
FIG. 4 is a detail plan view showing the board conveying/holding device of FIG. 1.
Figure 5:
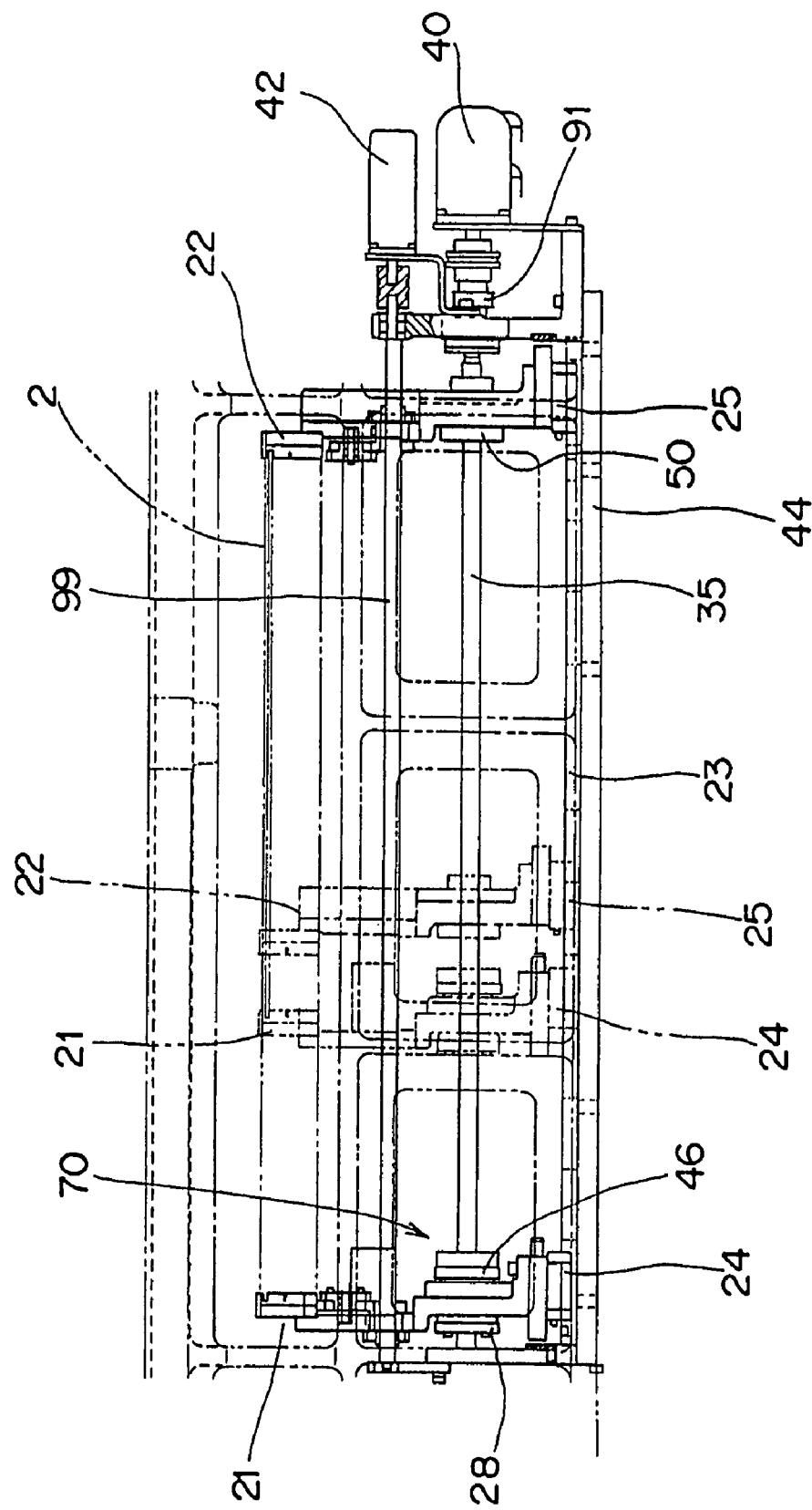
FIG. 5 is a detail right side view showing the board conveying/holding device of FIG. 1.

In a component mounting apparatus equipped with a plate-like member conveying/holding device and a method therefor according to a first embodiment of the present invention, as shown in FIGS. 1 to 3, components are mounted onto a board 2 onto which components are mounted (a board referred to irrespective of its position is designated by reference numeral 2, while boards at specific positions are designated by reference numerals 2-0, 2-1, 2-2, 2-3 or the like) as an example of a plate-like member. A case where this embodiment is applied to such a board conveying/holding device and a method for holding the board 2 is explained below.

The component mounting apparatus is outlined first before being explained in detail.

In the above component mounting apparatus, in a component mounting work area in one component mounting apparatus, two electronic circuit boards 2 are diagonally disposed in a zigzag manner so as to be opposed to each other. Components can be mounted independently on the respective boards. Therefore, two sets of working heads, drive units thereof, board conveying/holding devices, recognition cameras, and so forth are disposed. Furthermore, the board conveying/holding device holding the electronic circuit board 2 is moved to a position closer to a component feed unit in each mounting area to mount components. The reference for adjusting the board conveying/holding device according to the width of the board 2 (distance adjustment according to the board width) in a front-side mounting area closer to an operator of the two divided component mounting work areas is an edge portion on the front side, while that of the other mounting area, which is further from the operator, is an edge portion on the rear side. Consequently, the mounting time can be shortened by minimizing the movement distance of the working head from component feeding, component recognition to component mounting. Board 2 carried into the respective board conveying/holding devices are once positioned in a central portion and then the board on the board conveying/holding device on the right hand side in FIG. 2 is positioned to the left, while the board on the board conveying/holding device on the left side is positioned to the right so that the mounting movement distance can be reduced and thus the time can be shortened. Furthermore, when the two boards 2, 2 are positioned in a zigzag manner so as to be diagonally opposed to each other, two tray feed units can be disposed in a zigzag manner so as to be diagonally opposed to each other. Therefore, the successively disposed number of cassette feed units does not need to be reduced and the tray feed unit and the recognition position can be positioned closely, thereby shortening the mounting time. Thus, this mounting apparatus has various advantages.

A constitution of the component mounting apparatus according to one embodiment of the present invention is explained in detail with reference to FIGS. 1 to 9. Through these figures, like component members are designated by like reference numerals.

FIGS. 1 and 2 are a general schematic perspective view and a plan view, respectively, showing an electronic component mounting apparatus in the above embodiment of the present invention. A component mounting work area 200 of the mounting apparatus is divided into two areas, a first mounting area 201 and a second mounting area 202, in a plate-like member conveying direction at a board conveying position, that is, divided assuming a component conveyance path as a border. In FIGS. 1 and 2, reference numeral 1 denotes a loader, which is disposed on the board carrying-in side of the component mounting work area 200, and the loader carries an electronic circuit board 2 into the component conveyance path on the component mounting work area 200, in which the first mounting area 201 and the second mounting area 202 are disposed adjacent to each other. Reference numeral 11 is an unloader, which is disposed on the board carrying-out side of the component conveyance path on the component mounting work area 200 and carries the electronic circuit board 2 out from the component conveyance path on the component mounting work area 200, in which the first mounting area 201 and the second mounting area 202 are disposed adjacent to each other. In the electronic component mounting apparatus of the above embodiment, various component members are positioned point-symmetrically with respect to a central point 102 of the component mounting work area 200 (see FIG. 10) as described below.

That is, reference numeral 3 denotes a first board conveying/holding device equipped with a pair of support rail units 21, 22 (when support rail units are referred to irrespective of their positioned, reference numerals 21, 22 are used while reference numerals 21-1, 21-2, 22-1 and 22-2 are used for support rail units at specific positions) for conveying and holding the electronic circuit board 2 carried in from the loader 1 at the board conveying position. Reference numeral 4 denotes a working head, to which a plurality of, for example, ten component suction nozzles 10 for sucking and holding an electronic component are replaceably attached in the first mounting area 201. Reference numeral 5 denotes an XY robot, which positions the working head 4 in the first mounting area 201 at a prescribed position in X-Y directions, which are two directions perpendicular to each other in the first mounting area 201. Reference numeral 7 denotes a nozzle station, which is disposed in the vicinity of a component feed unit 8A described later in the first mounting area 201, houses a plurality of kinds of nozzles 10 suitable for a plurality of kinds of electronic components and replaces these nozzles with nozzles 10 attached to the working head 4 as required. Reference numerals 8A, 8B denote component feed units, which are positioned at an end portion on the front side of the operator with respect to the first mounting area 201, that is, in front of the operator, and house taping components, which are components housed and held in a tape and are to be mounted on the board 2. Reference numeral 8C denotes a component feed unit, which is disposed in the vicinity of the component feed unit 8B in the first mounting area 201 and houses tray components, which are components housed and held on a tray and are to be mounted on the board 2. Reference numeral 9 denotes a recognition camera, which is disposed on the side closer to the center of the component mounting work area in the vicinity of the component feed unit 8A in the first mounting area 201 and picks up an image of a suction attitude of an electronic component sucked by the nozzle 10 of the working head 4. Reference numeral 9a in FIG. 3 denotes a two-dimensional camera in the recognition camera 9. Reference numeral 9b denotes a three-dimensional camera in the recognition camera 9.

Meanwhile, reference numeral 13 denotes a second board conveying/holding device equipped with a pair of support rail units 21, 22 for conveying and holding the electronic circuit board 2 carried in from the first board conveying/holding device 3 in the first mounting area 201. Reference numeral 14 denotes a working head, to which a plurality of, for example, ten component suction nozzles 20 for sucking and holding an electronic component are replaceably attached in the second mounting area 202. Reference numeral 15 denotes an XY robot, which positions the working head 14 in the second mounting area 202 at a prescribed position in X-Y directions, which are two directions perpendicular to each other in the second mounting area 202. Reference numeral 17 denotes a nozzle station, which is disposed in the vicinity of a component feed unit 18A described later in the second mounting area 202, houses a plurality of kinds of nozzles 20 suitable for a plurality of kinds of electronic components and replaces these nozzles with nozzles 20 attached to the working head 14 as required. Reference numerals 18A, 18B denote component feed units, which are positioned at an end portion on the side furthest from the operator of the second mounting area 202, that is, in the rear side with respect to the operator, and house taping components, which are components housed and held in a tape and are to be mounted on the board 2. Reference numeral 18C denotes a component feed unit, which is disposed in the vicinity of the component feed unit 18B in the second mounting area 202 and houses tray components, which are components housed and held on a tray and are to be mounted on the board 2. Reference numeral 19 denotes a recognition camera, which is disposed on the side closer to the center of the component mounting work in the vicinity of the component feed unit 18A in the second mounting area 202 area and picks up an image of a suction attitude of an electronic component sucked by the nozzle 20 of the working head 14. Reference numeral 19a in FIG. 3 denotes a two-dimensional camera in the recognition camera 19. Reference numeral 19b denotes a three-dimensional camera in the recognition camera 19.

There is further included a first moving device composed of a ball screw shaft 35, first nut 27, second nut 48, motor 40 for moving a support rail unit, selective lock mechanism 70, and so forth, which are described later. The first board conveying/holding device 3 is moved by the first moving device in a direction crossing the board 2 conveying direction between the board conveying position and a first work position, at which a prescribed work for the board 2 held by the first board conveying/holding device 3, for example, component mounting, is performed in the first mounting area 201, for example, a first component mounting position. There is also included a second moving device composed of a ball screw shaft 35, first nut 27, second nut 48, motor 40 for moving support rail unit, selective lock mechanism 70, and so forth, which are described later. The second board conveying/holding device 13 is moved by the second moving device in a direction crossing the board 2 conveying direction between the board conveying position and a second work position, at which a prescribed work for the board 2 held by the second board conveying/holding device 13, for example, component mounting, is performed in the second mounting area 202, for example, a second component mounting position.

The XY robot 5, 15 is constituted as follows. Two Y-axis drive units 6a, 6a of an XY robot device 6 are fixed and disposed at front and rear end edges in the board conveying direction of the component mounting work area 200 on a mounting apparatus base 16. Two X-axis drive units 6b, 6c are disposed across these two Y-axis drive units 6a, 6a so as to move independently in the Y-axis direction and avoid collision. Furthermore, the working head 4 for moving in the first mounting area 201 is disposed in the X-axis drive unit 6*b* movably in the X-axis direction. The working head 14 for moving in the second mounting area 202 is disposed in the X-axis drive unit 6*c* movably in the X-axis direction. Therefore, the XY robot 5 is constituted by the two Y-axis drive units 6*a*, 6*a* fixed to the mounting apparatus base 16, the X-axis drive unit 6*b* movable in the Y-axis direction on the Y-axis drive units 6*a*, 6*a*, and the working head 4 movable in the X-axis direction in the X-axis drive unit 6*b*. The XY robot 15 is constituted by the two Y-axis drive units 6*a*, 6*a* fixed to the mounting apparatus base 16, the X-axis drive unit 6*c* movable in the Y-axis direction on the Y-axis drive units 6*a*, 6*a*, and the working head 14 movable in the X-axis direction in the X-axis drive unit 6*c*.

The above embodiment of the present invention is characterized by, first of all, the structure of the first and second board conveying/holding devices 3, 13 equipped with the front and rear support rail units 21, 22, respectively. The first and second board conveying/holding devices 3, 13 have exactly the same structure, except that the first board conveying/holding device 3 and the second board conveying/holding device 13 are positioned point-symmetrically with respect to the central point 102 of the component mounting work area 200. Therefore, the structure of each board conveying/holding device is explained below with reference to FIGS. 4 to 8.

Figure 6:
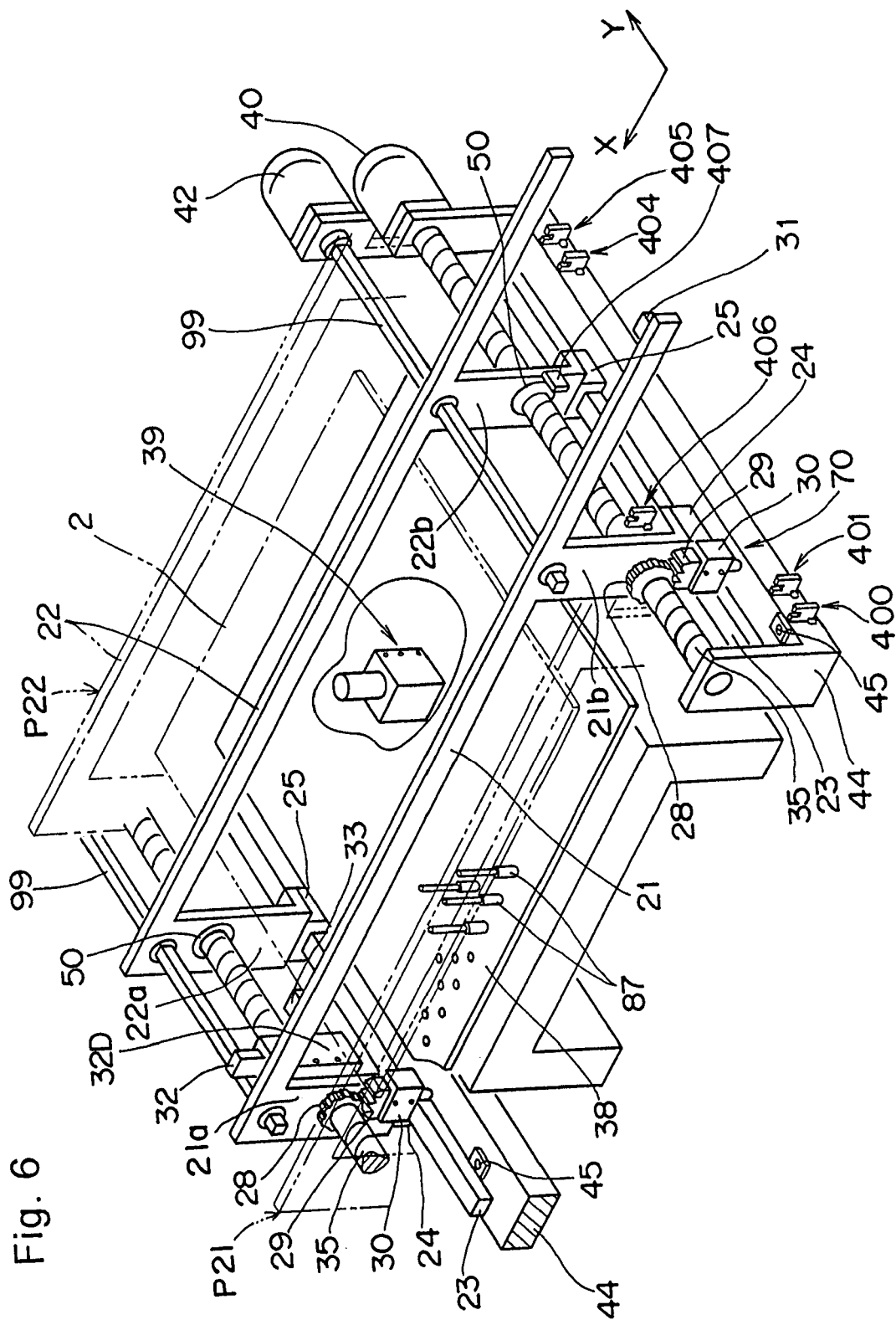
FIG. 6 is a perspective view showing the board conveying/holding device of FIG. 1.
Figure 7:
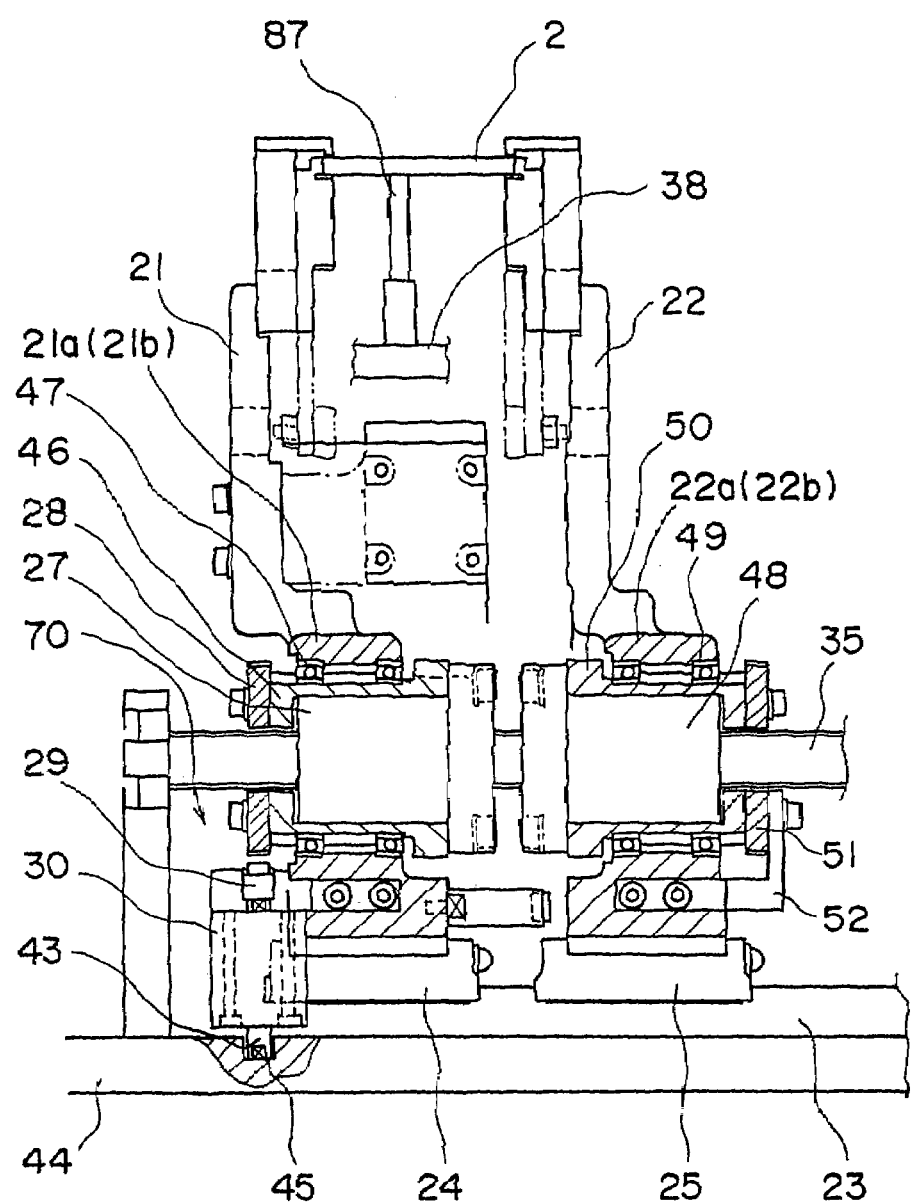
FIG. 7 is a detail enlarged right side view showing a selective lock mechanism of the board conveying/holding device of FIG. 1.
Figure 8:
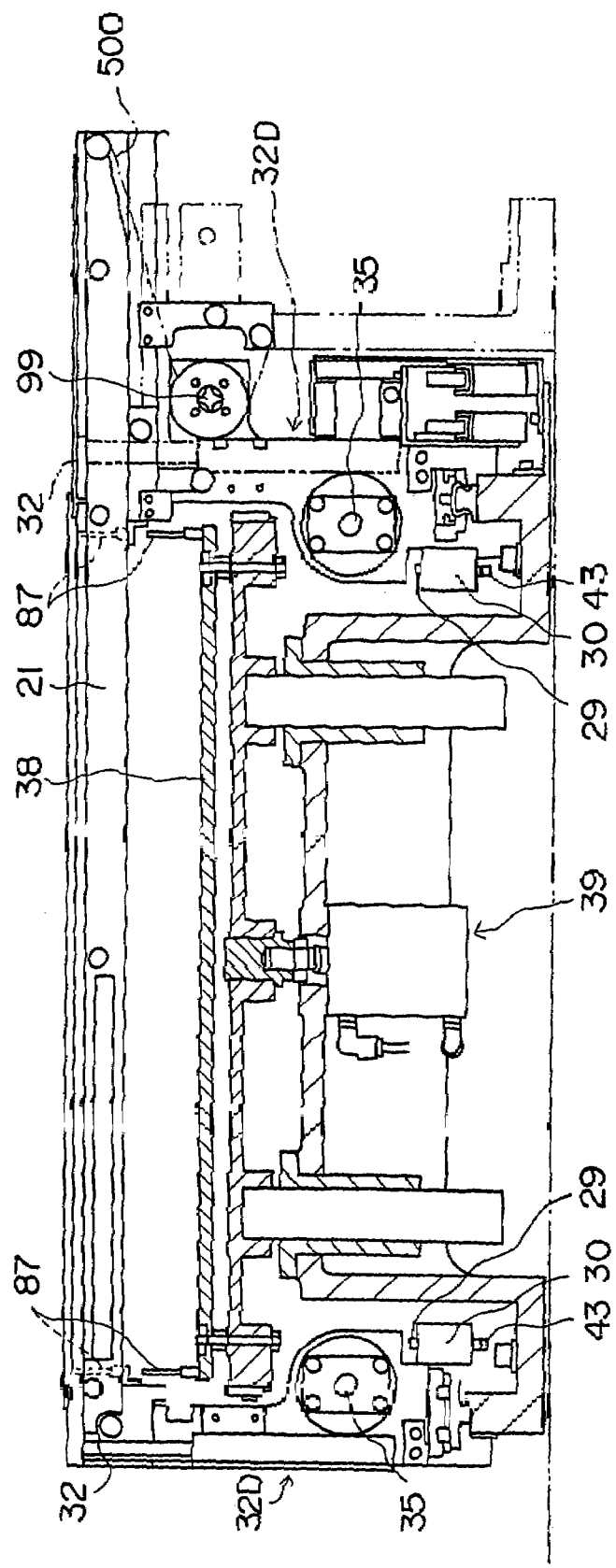
FIG. 8 is a detail front view showing the board conveying/holding device of FIG. 1.

In FIGS. 4 to 8, reference numerals 21, 22 denote a pair of support rail units, which extend along the X direction, and are each equipped with a belt 500 for conveying and holding a board, and convey and hold an electronic circuit board 2. The front-side support rail unit 21 of the pair of support rail units 21, 22 functions as a support rail unit on the reference side when the distance between the support rail units 21, 22 is adjusted (distance adjustment according to the board width) according to the width of board 2, that is, the locked side. The rear side support rail unit 22 functions as a support rail unit on the moved side, which is moved according to the width of the board 2. Furthermore, in FIGS. 4 to 8, reference numeral 23 denotes a linear guide member, which is disposed in the vicinity of both left and right end portions of the board conveying/holding device 3, 13 in FIG. 6 and extends in a direction (Y direction) perpendicular to the longitudinal direction (X direction) of the support rail units 21, 22. Reference numeral 24 denotes a front side slider, which is disposed at each lower end portion of a left end support pole 21*a* and a support pole 21*b* in the vicinity of a right end of the front side support rail unit 21 in FIG. 6, and moves linearly on each linear guide member 23 to guide so that the support rail unit 21 can move in parallel along the Y direction. Reference numeral 25 denotes a rear side slider, which is disposed at each lower end portion of a left end support pole 22*a* and a support pole 22*b* in the vicinity of a right end of the rear side support rail unit 22 in FIG. 6, and moves linearly on each linear guide member 23 to guide so that the support rail unit 22 can move in parallel along the Y direction. Reference numeral 35 denotes a ball screw shaft, which is disposed above each linear guide member 23 in the vicinity of both left and right end portions of the board conveying/holding device 3, 13 in FIGS. 4 and 6 and extends in a direction (Y direction) perpendicular to the longitudinal direction (X direction) of the support rail units 21, 22, and both ends of the ball screws shaft 35 are rotatably supported by a board conveying device base 44. Reference numeral 40 denotes a motor for moving a support rail unit, which drives rotation of the ball screw shaft 35 in the forward and reverse rotation directions. The linear guide member 23, the front side slider 24, and the rear slider 25 constitute a linear guide mechanism. Reference numeral 27 denotes a nut, which is rotatably attached to each end portion of the support pole 21*a* at the left end of the support rail unit 21 and the support pole 21*b* in the vicinity of the right end via each bearing 47 as shown in FIG. 7, and is screw-threaded with the ball screw shaft 35. The nut 27 rotates integrally with a sleeve 46 while the whole body thereof is covered with the sleeve 46 from outside with the nut 27 disabling relative rotation and is rotatably supported at the bearing 47 by the sleeve 46. A gear 28 is fixed to one end portion in the axial direction of the sleeve 46. Reference numeral 30 denotes a cylinder for a selective lock mechanism, which is attached to each support pole 21*a*, 21*b* of the support rail unit 21 and moves a piston rod up and down. A rack gear 29 engagable with the gear 28 is fixed to an upper end of the piston rod of the cylinder 30 for the selective lock mechanism. When the piston rod rises and is positioned at the upper end position, the rack gear 29 is engaged with the gear 28 to stop rotation of the nut 27. On the other hand, when the piston rod lowers and is positioned at the lower end position, a pin 43 at the lower end of the piston rod penetrates the cylinder 30 downwards and is engaged with a hole 45 of the board conveying device base 44 to fix the support rail unit 21 at the position and disable its movement. The hole 45 of the board conveying device base 44 is provided only at a position at which each pin 43 can be inserted when the support rail unit 21 is positioned at the position of the origin P21 as an example of a reference position (the position of the support rail unit 21 shown with a dotted line in FIG. 6). A pulley 92, 91 is connected to the left and right ball screw shafts 35, 35, while a belt 90 is placed across these pulleys 92, 91 so that the left and right ball screw shafts 35, 35 rotate in the same direction synchronously by a rotation drive of the motor 40, via the pulleys 92, 91 and the belt 90. When each ball screw shaft 35 rotates, the nut 27, which is rotatably supported by the bearing 47 and screw-threaded with each ball screw shaft 35, also rotates. Thus, while the nut 27 is rotating, no force along the Y-axis direction acts on the front-side support rail unit 21. Therefore, the front-side support rail unit 21 is not moved in the Y-axis direction. On the other hand, when the cylinder 30 is driven to raise the piston rod and thereby the rack gear 29 is engaged with the gear 28, rotation of the nut 27 is regulated via the gear 28 and the sleeve 46. Therefore, a force along the Y-axis direction acts on the nut 27 in response to rotation of each ball screw shaft 35, and the front-side support rail unit 21 is moved in the Y-axis direction. Thus, each selective lock mechanism 70 is constituted by the gear 28, the rack gear 29, and the cylinder 30. As a result, the front-side support rail unit 21 is moved in parallel in the Y-axis direction when the rack gears 29, 29 are engaged with the gears 28, 28 by the left and right selective lock mechanisms 70, 70 to stop the rotation of the nuts 27, 27. On the other hand, when the piston rod of the cylinder 30 is lowered by the selective lock mechanism 70, 70 and positioned at the lower end position, the pin 43 at the lower end of the piston rod penetrates the cylinder 30 downwards. When the support rail unit 21 is positioned at the origin position P21, the pin 43 is engaged with the hole 45 of the board conveying device base 44. Thus, the front-side support rail unit 21 is fixed so that the support rail unit 21 cannot be moved from the origin position P21. When engagement of the rack gear 29, 29 and the gear 28, 28 is released to allow the rotation of the nut 27, 27, the front-side support rail unit 21 is not moved along the Y-axis direction but is kept at the position. Therefore, the distance between one pair of the support rail units 21, 22 is adjusted according to the width of the board 2, and the front-side support rail unit 21 is not moved along the Y-axis direction by the selective lock mechanism 70, 70 of the support rail unit 21 but is kept at the position. Thus, the front-side support rail unit 21 can function as a support rail unit 21 on the reference side, that is, the locked side.

On the other hand, reference numeral 48 denotes a nut, which is provided rotatably via each bearing 49 at each of lower end portions of a support pole 22a at a left end of the rear-side support rail unit 22 and a support pole 22b in the vicinity of a right end thereof and screw-threaded with the ball screw shaft 35 as shown in FIG. 7. Each nut 48 rotates integrally with a sleeve 50 disabling relative rotation while the whole body thereof is covered with the sleeve 50 from outside and is supported rotatably at the bearing 48 by sleeve 50. A gear 51 is fixed at one end portion of each sleeve 50 in the axial direction. The gear 51, 51 is connected to each lower end portion of the support pole 22a at the left end of the rear-side support rail unit 22 and the support pole 22b in the vicinity of the right end thereof by a bracket 52, 52. Therefore, when the ball screw shafts 35, 35 rotate the rear-side support rail unit 22 is guided by the linear guide members 23, 23 and the sliders 24, 24 and can be moved in parallel along the Y-axis direction.

Furthermore, reference numeral 99 denotes a belt drive shaft, which extends along the Y-axis direction, and which is provided to each support rail unit 21, 22 in the longitudinal direction thereof and drives a belt 500 for placing and conveying a board 2 via a pulley or the like synchronously in the forward and reverse directions. Reference numeral 42 denotes a belt drive motor, which drives the belt 500 for placing and conveying the board 2 synchronously in the forward and backward directions by driving forward and reverse rotation of the belt drive shafts 99.

Furthermore, the board conveying device base 44 on the right side is equipped with a front-side limit position detecting sensor 400 for detecting a front-side limit position of the front-side support rail unit 21, a front-side origin position detecting sensor 401 for detecting the origin position P21 of the front-side support rail unit 21, a collision avoiding sensor 406 for stopping the rear-side support rail unit 22 from approaching the front-side support rail unit 21 so as to prevent a collision of the front-side support rail unit 21 and the rear-side support rail unit 22 when a dog 407 projected from the support pole 22b in the vicinity of the right end of the rear-side support rail unit 22 is detected, a rear-side origin position detecting sensor 404 for detecting the origin position P22 as an example of the reference position of the rear-side support rail unit 22, and a rear-side limit position detecting sensor 405 for detecting the rear-side limit position of the rear-side support rail unit 22. All of these sensors 400, 401, 406, 404, 405 are connected to a control unit 1000 to input their respective detection results thereinto.

Figure 9:
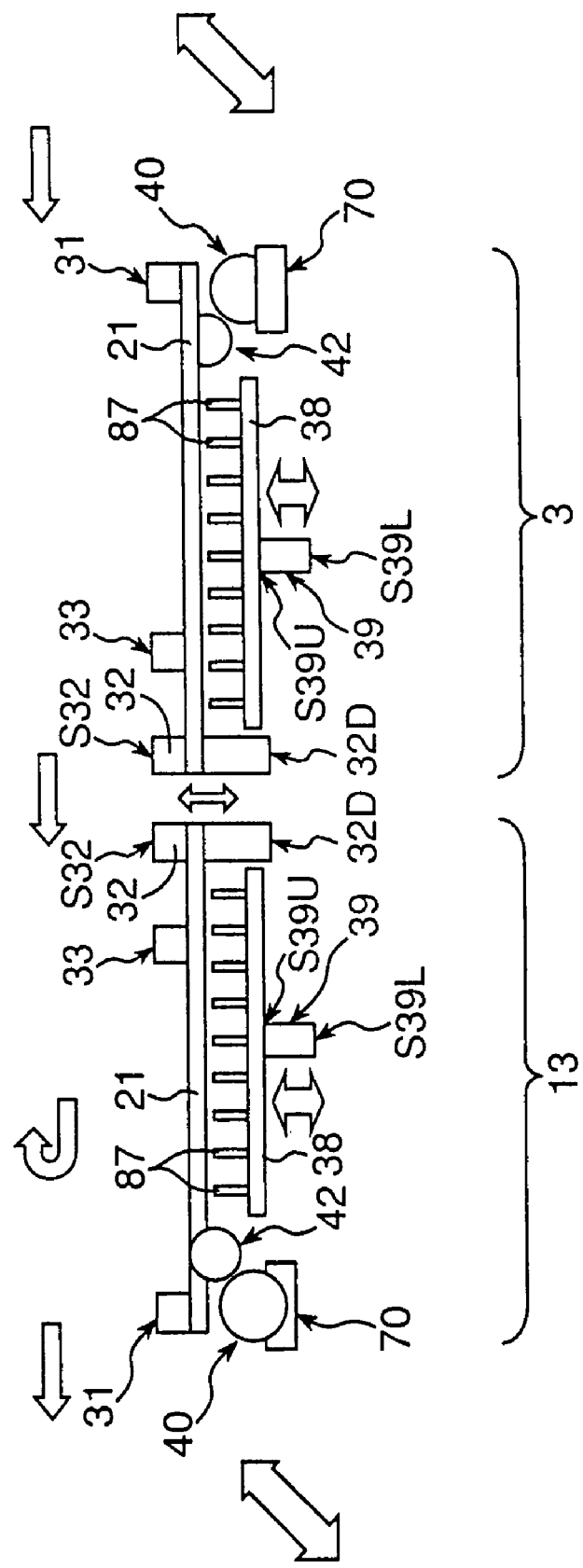
FIG. 9 is an explanatory view showing an operation of conveying a board by two board conveying/holding devices in the component mounting apparatus of FIG. 1.

On the support rail unit 21, a board passage detecting sensor 31 for detecting passage of an electronic circuit board 2 is disposed at a right end portion, that is, at an end portion on the loader 1 side. A board stopper 32 for stopping the electronic circuit board 2 at a prescribed position is disposed at a left end portion, that is, at an end portion on the unloader 11 side. A board arrival detecting sensor 33 for detecting the approach and arrival of the electronic circuit board 2 at the prescribed position in the board conveying direction from the loader 1 towards the unloader 11 side is provided in the vicinity of the board stopper 32. As shown in FIG. 9, a cylinder 32D for the board stopper drive has an upper end position detecting sensor S32 for detecting an upper end position of the piston rod. The board stopper 32 is positioned at the raised position and kept in contact with the board 2 while components are being mounted.

As shown in FIG. 9, the support plate drive cylinder 39 has an upper limit position detecting sensor S39U for detecting an upper limit position of the piston rod and a lower limit position detecting sensor S39L for detecting a lower limit position thereof.

To mount electronic components on an electronic circuit board 2 in high quality, the board 2 needs to be supported from the lower direction. Accordingly, the board conveying/holding device has a support plate 38 which is equal to the maximum-size board in size or larger and can be moved up and down. The required number of support pins 87 are provided on the support plate 38. The support plate 38 is raised by the support plate drive cylinder 39. The lower surface of the electronic circuit board 2 is supported by the support pins 87, and the board 2 is interposed between the support rail units 21, 22 at both side portions thereof and held at a prescribed position.

As shown in FIG. 28, each of the sensors and the drive units is connected to the control unit 1000. Drive of each drive unit is controlled based on a prescribed mounting program. That is, those connected to the control unit 1000 include at least the board passage detecting sensor 31 (31-1, 31-2), board arrival detecting sensor 33 (33-1, 33-2), upper limit position detecting sensor S39U of the support plate drive cylinder 39, lower limit position detecting sensor S39L of the support plate drive cylinder 39, front-side limit position detecting sensor 400, front-side origin position detecting sensor 401, collision avoiding sensor 406, rear-side origin position detecting sensor 404, rear-side limit position detecting sensor 405, recognition camera 9, 19, XY robot 5, 15, working head 4, 14, loader 1, unloader 11, motor 40 for moving support rail units, belt drive motor 42, board stopper drive cylinder 32D, support plate drive cylinder 39, cylinder 30 for selective lock mechanism, database 1001 for storing information related to mounting operations or the like such as information about the size of a board onto which components are to be mounted or the like, information about the shape, height, and so forth of the components, information about positions at which the components to be mounted are to be mounted onto the board, mounting order, or the like, the shape of a component suction nozzle, information about the board conveying position of each support rail unit or the like, and operation unit 1002 for performing desired operations and so forth.

Operations of the electronic component mounting apparatus of the above embodiment constituted as above are explained with reference to operation explanatory views in FIGS. 10 to 17 and a timing chart in FIG. 27. The electronic component mounting apparatus is operated under the control of the control unit 1000.

Figure 10:
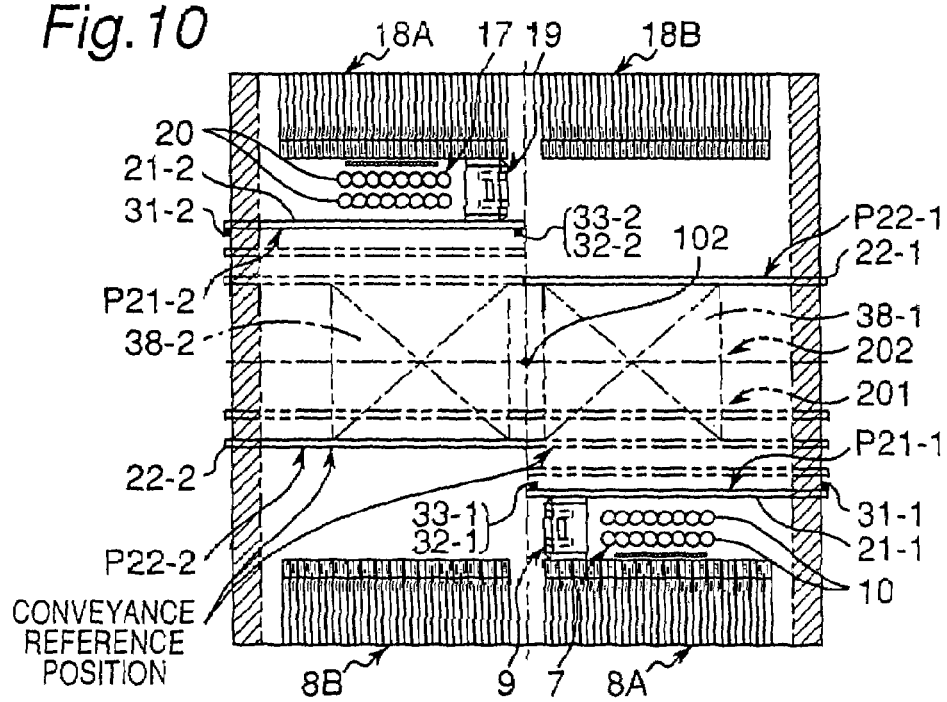
FIG. 10 is an explanatory view showing operations of returning to the origin and mounting of support rail units in the board conveying/holding devices in the component mounting apparatus of FIG. 1.

FIG. 10 is a general layout plan showing operation of the support rail units 21, 22 to return to the origin and mounting operation thereof. The component feed units 8A, 8B, 18A, 18B, recognition cameras 9,19 for picking up of an image of a suction attitude of an electronic component, working heads 4, 14 having suction nozzles 10, 20 each having a shape suitable to an electronic component to be sucked (see FIG. 17), and board conveying devices 3, 13 having the support rail units 21, 22 (see FIG. 18) are disposed point-symmetrically with respect to the central point 102 of the component mounting work area 200. As described above, the component mounting work area 200 is divided by a straight line passing through the central point 102 along the board conveying direction into two areas; the first mounting area 201 (lower half of the component mounting work area 200 in FIG. 10) and the second mounting area 202 (upper half of the component mounting work area 200 in FIG. 10). The support rail units 21, 22, board passage detecting sensor 31, board stopper 32, board arrival detecting sensor 33, and support plate 38 are shown in the first mounting area 201 as the support rail units 21-1, 22-1, board passage detecting sensor 31-1, board stopper 32-1, board arrival detecting sensor 33-1, and support plate 38-1, respectively, while shown in the second mounting area 202 as the support rail units 21-2, 22-2, board passage detecting sensor 31-2, board stopper 32-2, board arrival detecting sensor 33-2, and support plate 38-2, respectively.

In the first mounting area 201, the support rail unit 21-1 on the locked side is moved in a range to the origin position P21-1 shown with a lower right solid line. The support rail unit 22-1 on the moved side is moved in a range to the origin position P22-1 shown with an upper right solid line. Meanwhile, in the second mounting area 202, the support rail unit 21-2 on the locked side is moved in a range to the origin position P21-2 shown with an upper left solid line. The support rail unit 22-2 on the moved side is moved in a range to the origin position P22-2 shown with a lower left solid line.

Figure 11:
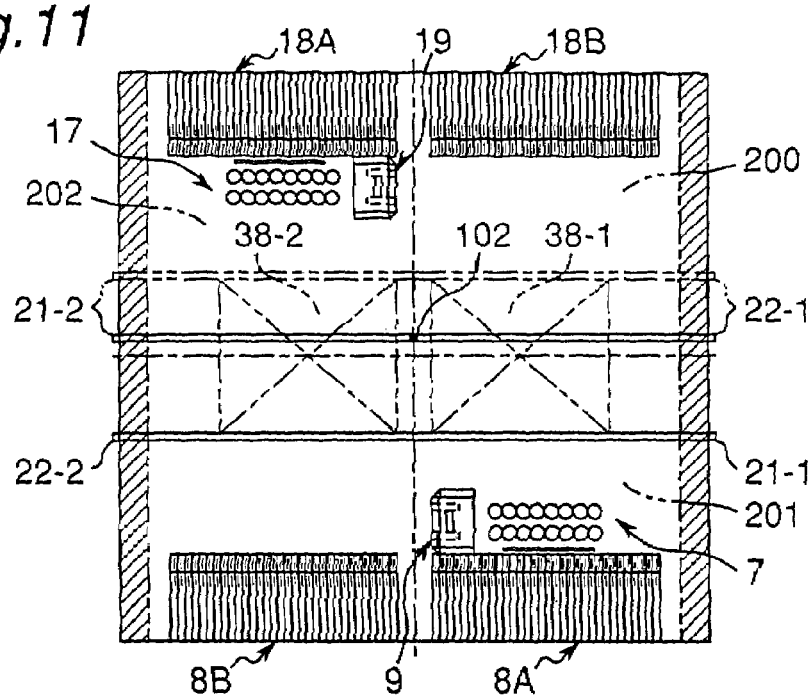
FIG. 11 is an explanatory view showing an initial state of the support rail units of the board conveying/holding devices in the component mounting apparatus of FIG. 1.

FIG. 11 shows a state where the support rail units 21-1, 21-2 on the locked side and the support rail units 22-1, 22-2 on the moved side are not positioned at the origins while the component mounting apparatus is turned on.

Figure 12:
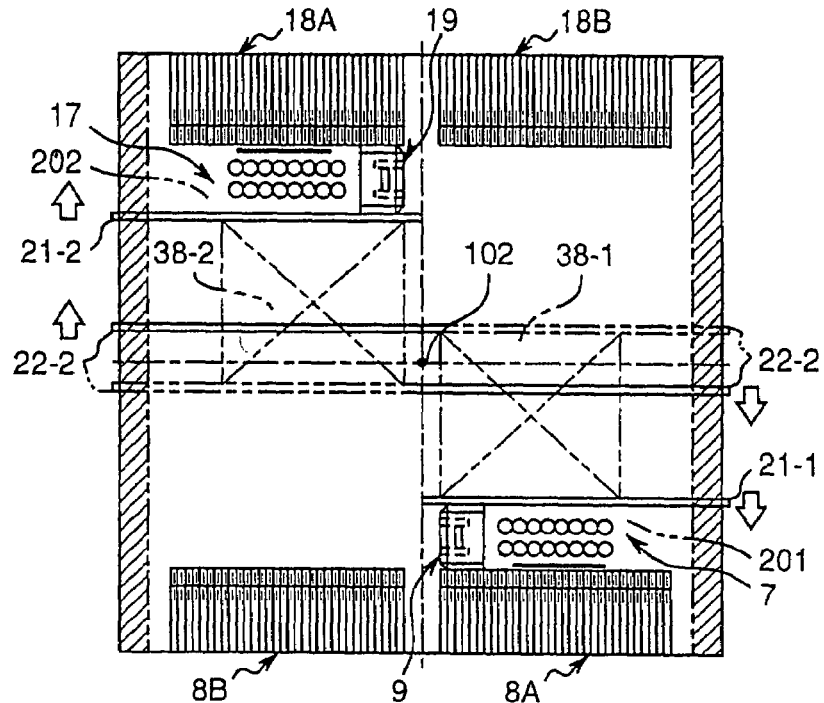
FIG. 12 is an explanatory view showing an operation of returning to the origins of support rail units on the locked sides of the board conveying/holding devices in the component mounting apparatus of FIG. 1.

FIG. 12 shows a state where, after the component mounting apparatus is turned on, the support rail units 21-1, 21-2 on the locked side are moved to their respective origin positions P21-1, P21-2 at a low speed to return to the origins and locked at the origin positions P21-1, P21-2, and then the support rail units 22-1, 22-2 on the moved side are moved towards their respective origin positions P22-1, P22-2 at a low speed.

That is, in FIG. 12, in each mounting area 201, 202, the motor 40 for moving support rail units is driven and the ball screw shafts 35, 35 rotate synchronously. The rack gears 29, 29 are engaged with the gears 28, 28 by the selective lock mechanisms 70, 70 to regulate the rotation of the nuts 27, 27. Therefore, the support rail unit 21-1 on the locked side on the front side of the first mounting area 201 (that is, the lower right side of FIG. 10) and the support rail unit 21-2 on the locked side on the rear side of the second mounting area 202 (that is, the upper left side of FIG. 10) are independently moved to the origin positions, at which the holes 45 of the board conveying device base 44 are formed as shown in FIGS. 6 and 7 (lower right origin position P21-1 shown with the solid line in FIG. 10 for the first mounting area 201 and upper left origin position P21-2 shown with the solid line in FIG. 10 for the second mounting area 202) at a low speed. The respective origin positions P21-1, P21-2 of the support rail units 21-1, 21-2 on the locked side are positioned closest to the recognition cameras 9,19 and the component feed units 8A, 18A. That is, in the first mounting area 201, the support rail unit 21-1 on the locked side and the support rail unit 22-1 on the moved side are integrally moved downward at a low speed as shown with a downward arrow in FIG. 12. Then, the movement of both the support rail units 21-1, 22-1 is stopped when the support rail unit 21-1 on the locked side is positioned at the origin position P21-1. In the second mounting area 202, the support rail unit 21-2 on the locked side and the support rail unit 22-2 on the moved side are integrally moved upward at a low speed as shown with an upward arrow in FIG. 12. Then, the movement of both the support rail units 21-2, 22-2 is stopped when the support rail unit 21-2 on the locked side is positioned at the origin position P21-2.

Subsequently, when the support rail units 21-1, 21-2 on the locked side are completely returned to their origins, the cylinders 30, 30 of the support rail unit 21-1, 21-2 on the locked side are driven and the pins 43, 43 at a lower end of each piston rod are engaged with the holes 45, 45 of the board conveying device bases 44, 44. Thus, the support rail units 21-1, 21-2 on the locked side are locked at their respective origin positions P21-1, P21-2. That is, after the support rail units 21-1, 21-2 on the locked side are moved to their respective origin positions P21-1, P21-2, engagement of the rack gears 29, 29 with the gears 28, 28 is released by the selective lock mechanisms 70, 70 on the respective support rail units 21-1, 21-2 on the locked side and free rotation of the nuts 27, 27 is allowed, and the pin 43 at the lower end of the piston rod of the selective lock mechanism cylinder 30 is inserted and engaged with the hole 45 of the board conveying device base 44. The support rail units 21-1, 21-2 on the locked side are fixed at the positions immovably.

Subsequently, when the front-side origin position detecting sensor 401, 401 detects that the support rail units 21-1, 21-2 on the locked side are positioned at their respective origin positions P21-1, P21-2 (when the rail lock (furthest position) is switched from on to off in FIG. 27), a prescribed time period is measured by a timer T6 and then the motor 40 for moving support rail units is reverse-driven so that the support rail units 22-1, 22-2 on the moved side start moving towards their respective origin position P22-1, P22-2 in a direction reverse to the above at a low speed. That is, the support rail units 22-1, 22-2 on the moved side are first moved integrally with the support rail units 21-1, 21-2 on the locked side in the same arrow direction at a low speed by the low-speed movement of the support rail units 21-1, 21-2 on the locked side to their origin position side. Then, after the support rail units 21-1, 21-2 on the locked side are positioned at their respective origin positions P21-1, P21-2, the motor 40 for moving support rail units is driven to rotate in the reverse direction to rotate the ball screw shafts 35, 35 synchronously in the reverse direction. Then, the support rail units 22-1, 22-2 on the moved side are moved at a low speed in a direction reverse to the previous movement and moved to their respective origin positions (the upper right origin position P22-1 shown with the solid line in FIG. 10 for the first mounting area 201 and the lower left origin position P22-2 shown with the solid line in FIG. 10 for second mounting area 202).

Figure 13:
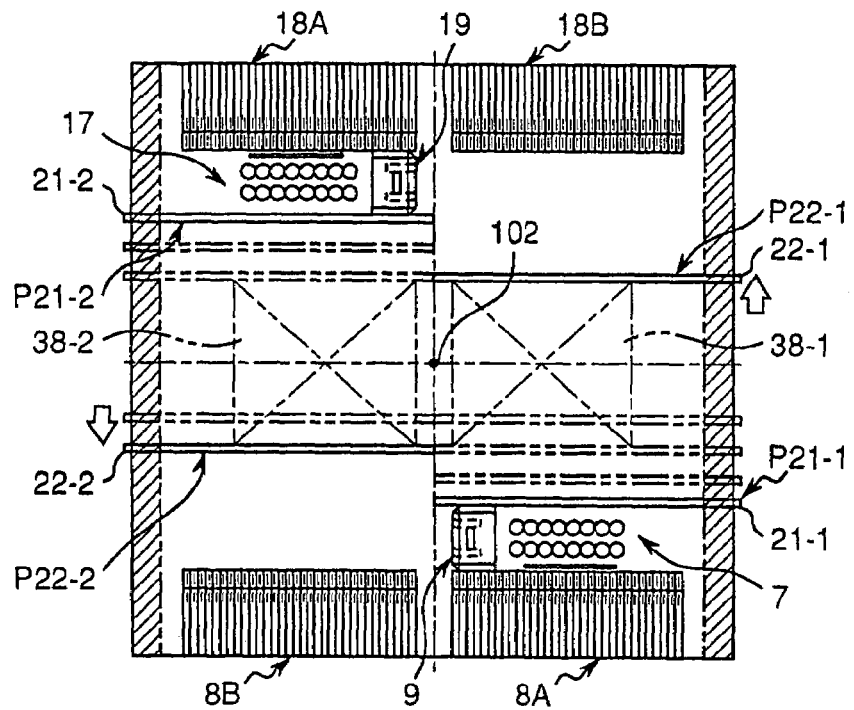
FIG. 13 is an explanatory view showing an operation of returning to the origins of support rail units on the always moved sides of the board conveying/holding devices in the component mounting apparatus of FIG. 1.
Figure 25:
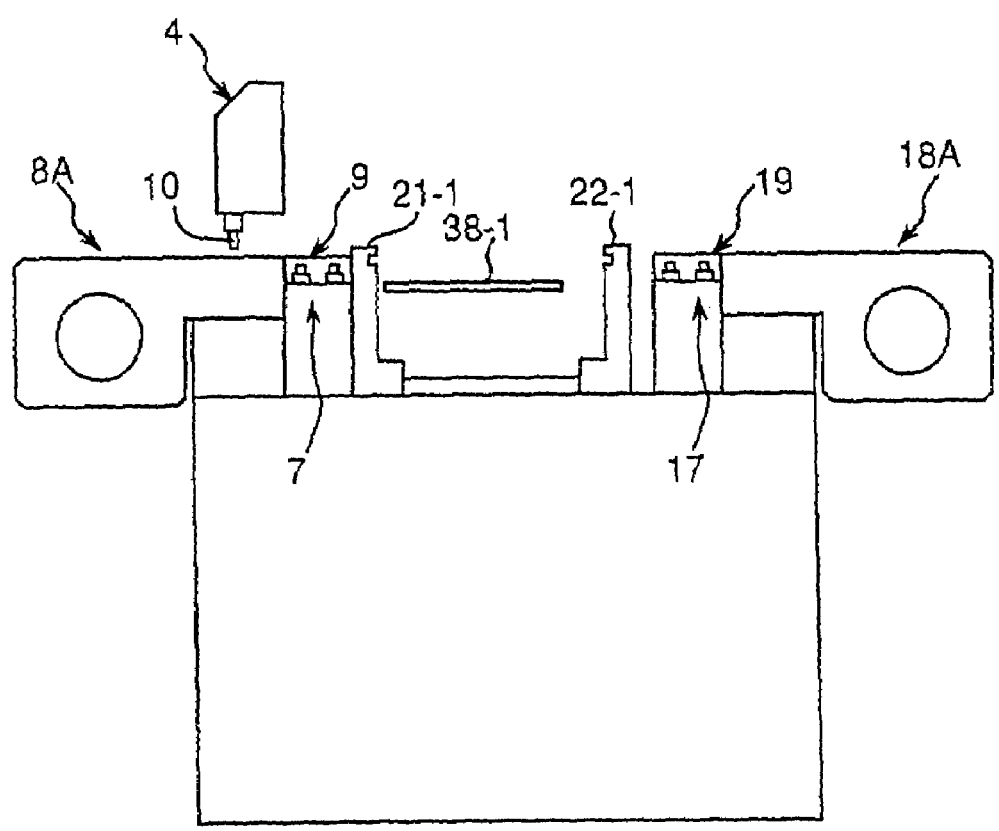
FIG. 25 is a schematic right side view showing a state of the board conveying/holding device in the component mounting apparatus of FIG. 1 when the support rail unit is returned to the origin as shown in FIG. 13.

Subsequently, in FIGS. 13 and 25, when the rear-side origin position detecting sensors 404, 404 detect that the support rail units 22-1, 22-2 on the moved side are moved to the outermost side (that is, reach their origin positions P22-1, P22-2) and are positioned at the respective origin positions P22-1, P22-2 of the support rail units 22-1, 22-2 on the moved side, the movement of the support rail units 22-1, 22-2 on the moved side is stopped and their return to the origin is completed. As a result, the support rail units 21-1, 21-2 on the locked side and the support rail units 22-1, 22-2 on the moved side return to their respective origin positions P21-1, P21-2, P22-1, P22-2 in FIG. 13.

Figure 14:
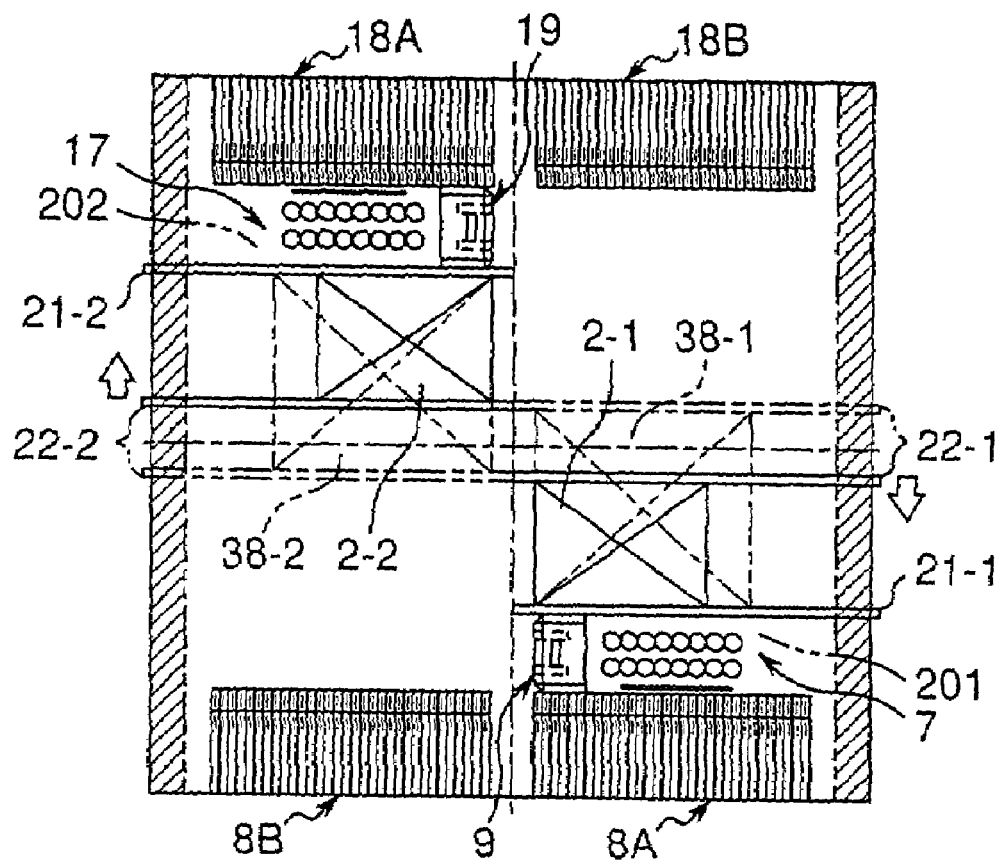
FIG. 14 is an explanatory view showing an operation of adjusting the support rail units on the always moved sides of the board conveying/holding devices in the component mounting apparatus of FIG. 1 according to the board width.

Subsequently, while the support rail units 21-1, 21-2 on the locked side are fixed to their respective origin positions P21-1, P21-2 in FIG. 14 similar to FIG. 13, the support rail units 22-1, 22-2 on the moved side are moved from their origin positions P22-1, P22-2 towards the support rail units 21-1, 21-2 on the locked side according to the width of boards 2-1, 2-2 onto which components are to be mounted. Thus, adjustment of the distances between the support rail units 21-1, 22-1 and the support rail units 21-2, 22-2 is completed. At this time, since the widths of the boards 2-1, 2-2, onto which components are to be mounted subsequently, are stored in advance in the database 1001, the movement amounts of the support rail units 22-1, 22-2 on the moved side are calculated in the operation unit 1002 based on this information and information such as movement amounts of the support rail units 22-1, 22-2 on the moved side by rotation by the motor 40 for moving support rail units or the like. The amount of rotation of the motor 40 for moving support rail units is calculated, and the rotation driven by the motor 40 for moving support rail units based on this calculation result is controlled. The above operation can be performed in advance, and only the operation result information can be stored in the database 1001. The rotation driven by the motor 40 for moving support rail units can also be controlled by utilizing this information.

Figure 15:
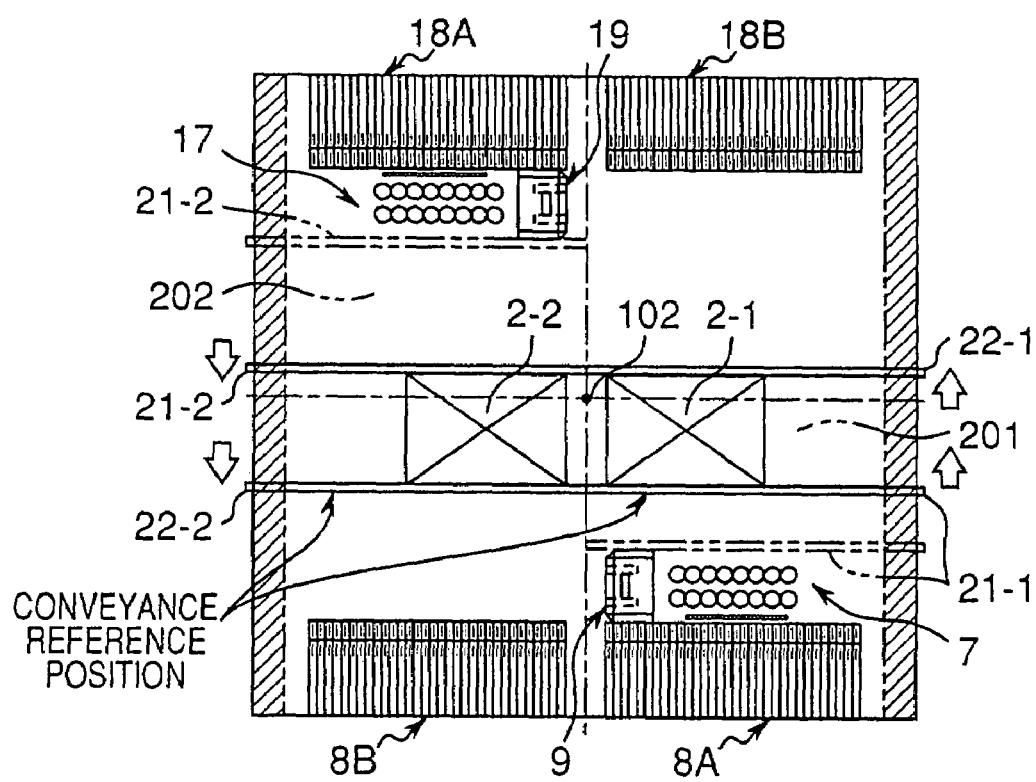
FIG. 15 is an explanatory view showing a state of the support rail units of the board conveying/holding devices in the component mounting apparatus of FIG. 1 when a board is being conveyed.

Subsequently, after the adjustment of the distances between the support rail units 21-1, 22-1 and the support rail units 21-2, 22-2 is finished according to the widths of the boards 2-1, 2-2, onto which components are to be mounted, each rack gear 29 is engaged with each gear 28 by each selective lock mechanism 70 and then the support rail units 21-1 on the locked side and 22-1 on the moved side are synchronously moved in one direction (that is, upward in FIG. 15 by rotation of the ball screw shafts 35, 35 in the first board conveying/holding device 3 as shown in FIG. 15). Similarly, in the second board conveying/holding device 13, each rack gear 29 is engaged with each gear 28 by a respective lock mechanism 70 and then the support rail units 21-2 on the locked side and 22-2 on the moved side are synchronously moved in one direction (that is, downward in FIG. 15) by rotation of the ball screw shafts 35, 35 in the second board conveying/holding device 13. Then, the support rail units 21-1 on the locked side and 22-1 on the moved side and the support rail units 21-2 on the locked side and 22-2 on the moved side are moved to a position (conveying position), at which the left and right board conveying/holding devices 3, 13 are aligned in one line in the center of the component mounting work area 200 in the mounting apparatus. Then, the second board conveying/holding device 13 waits for the board 2-1 to be carried in from the first board conveying/holding device 3, while the first board conveying/holding device 3 waits for a board 2-0 to be carried in from the loader 1.

Figure 16:
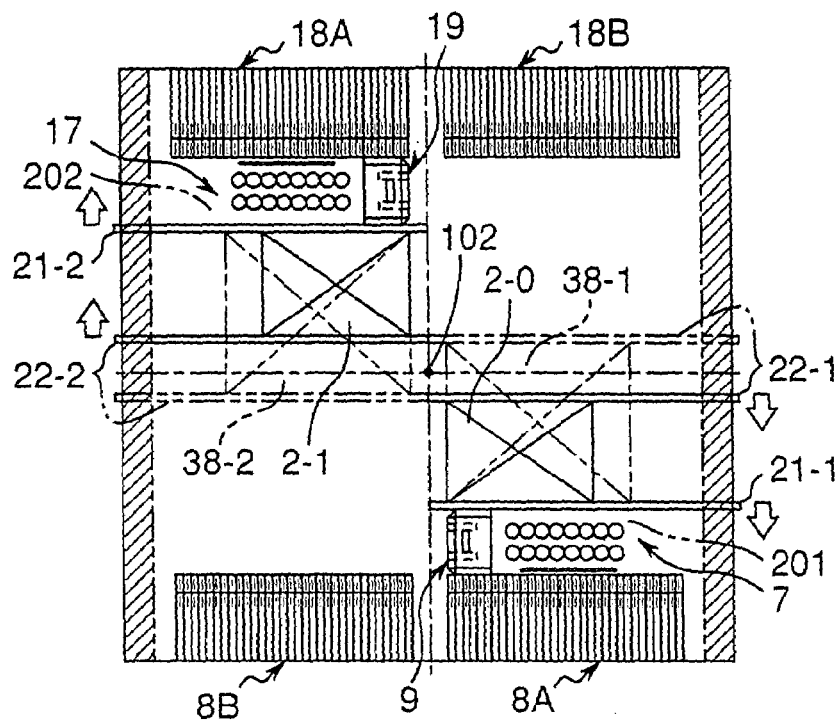
FIG. 16 is an explanatory view showing a state of the support rail units of the board conveying/holding devices in the component mounting apparatus of FIG. 1 when components are being mounted.
Figure 24:
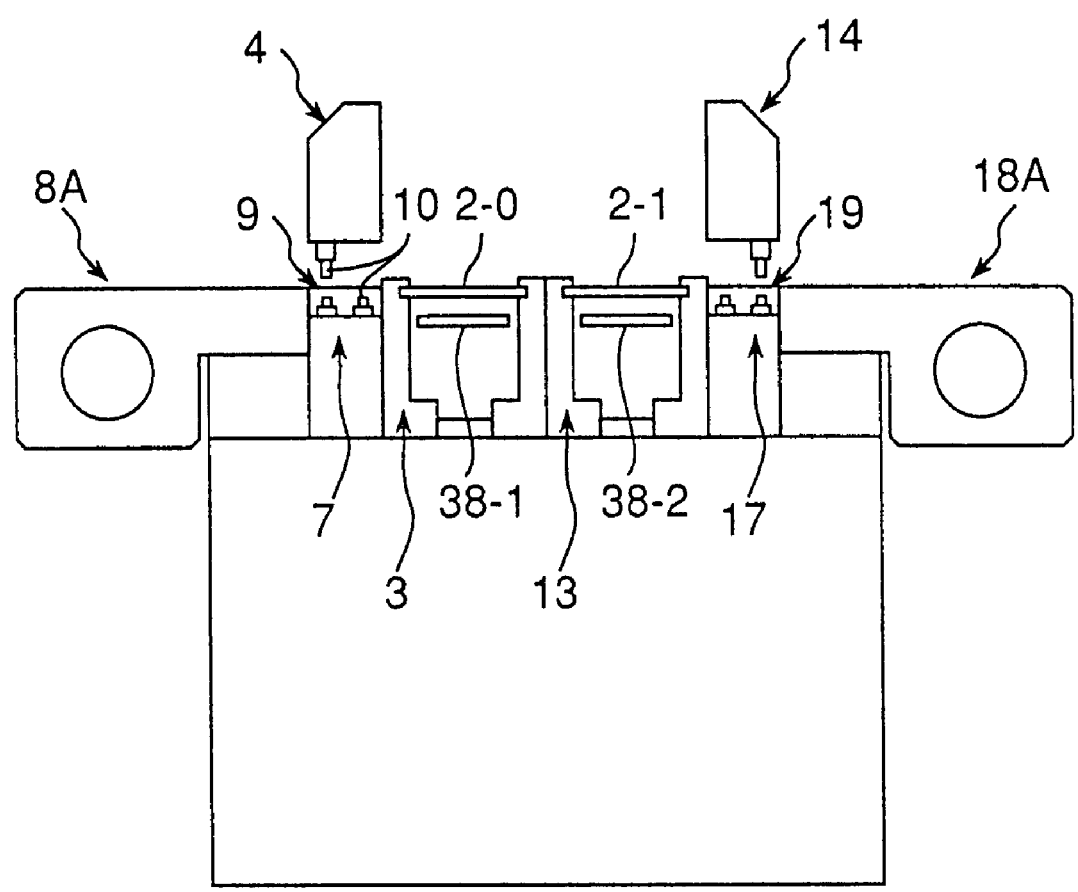
FIG. 24 is a schematic right side view showing a state of the board conveying/holding devices in the component mounting apparatus of FIG. 1 when components are being mounted as shown in FIG. 16.

Subsequently, as shown in FIGS. 16 and 24, the first board conveying/holding device 3 and the second board conveying/holding device 13 are driven under the control of the control unit 1000 so that the carrying-in of the board 2-1 from the first board conveying/holding device 3 to the second board conveying/holding device 13 is completed. Also, the loader 1 and the first board conveying/holding device 3 are driven under the control of the control unit 1000 so that the carrying-in of the board 2-0 from loader 1 to the first board conveying/holding device 3 is completed. Subsequently, the support rail units 21-1, 22-1 of the first board conveying/holding device 3 holding the board 2-0 are moved downward in FIG. 16 to a position closest to the recognition camera 9. The support rail units 21-2, 22-2 of the second board conveying/holding device 13 holding the board 2-1 are moved upward in FIG. 16 to each component mounting position (position, at which the support rail units 21-1, 22-1 on the locked side are positioned at their respective origin positions P21-1, P22-1) as an example of a work position positioned closest to the recognition camera 19. Here, the working heads 4, 14 suck desired components from the component feed units 8A or 8B, 18A or 18B by the respective nozzles 10, 20. Then, the suction attitudes of these components are image-picked up by the recognition cameras 9, 19, and then calculated and corrected. Then, the components are mounted onto the electronic circuit boards 2-0, 2-1. In the above embodiment, since the recognition camera 9, 19 and the electronic circuit board 2-0, 2-1 are positioned at positions closest to each other irrespective of the size of the electronic circuit board 2 when mounting is performed, the moving distance of the working head 4, 14 can be reduced and thus the mounting time can be shortened.

Figure 17:
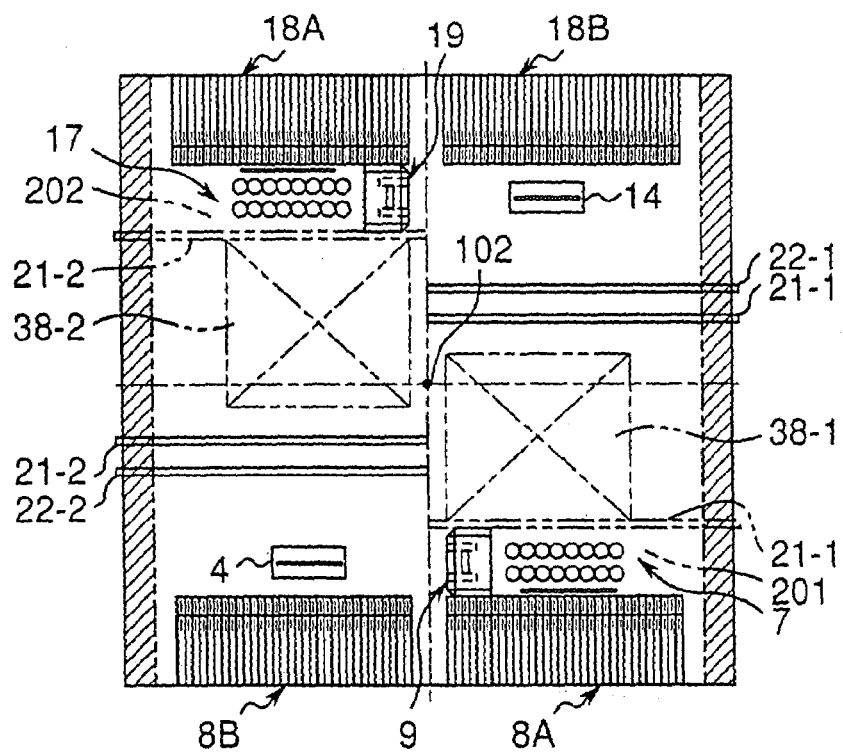
FIG. 17 is an explanatory view showing a state of the support rail units of the board conveying/holding devices in the component mounting apparatus of FIG. 1 during maintenance thereof, replacement of support pins or support plates, or change of nozzles.
Figure 26:
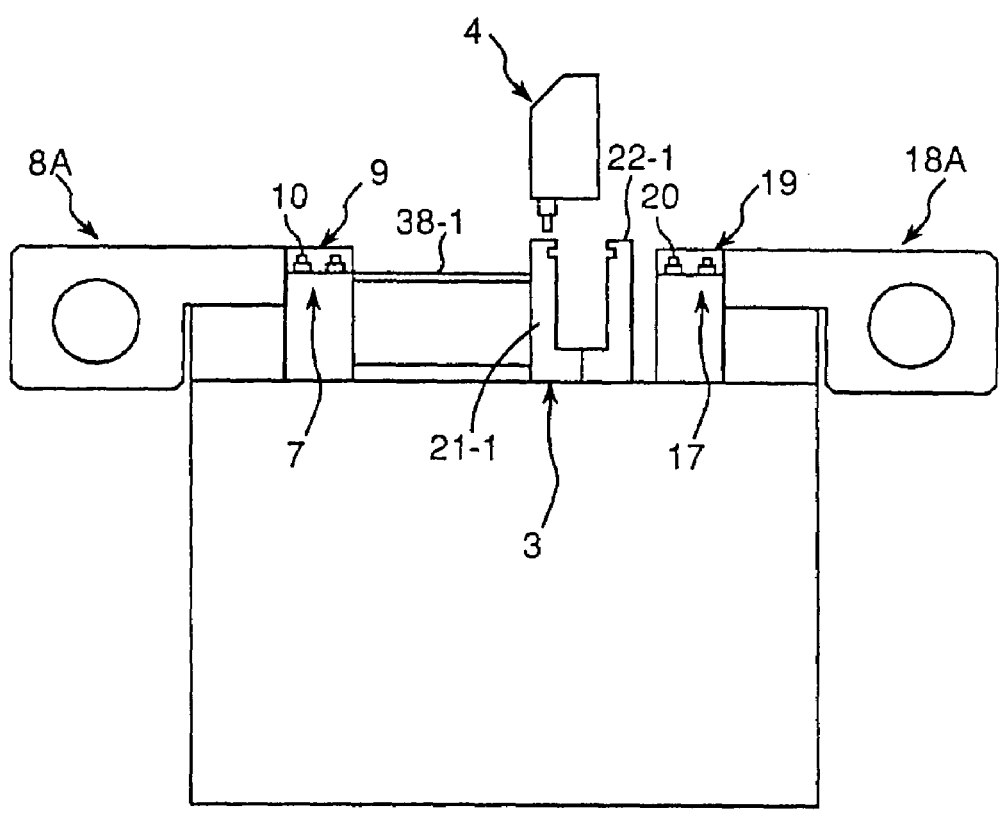
FIG. 26 is a schematic right side view showing a state of the board conveying/holding device in the component mounting apparatus of FIG. 1 during the maintenance in FIG. 17.
Figure 29:
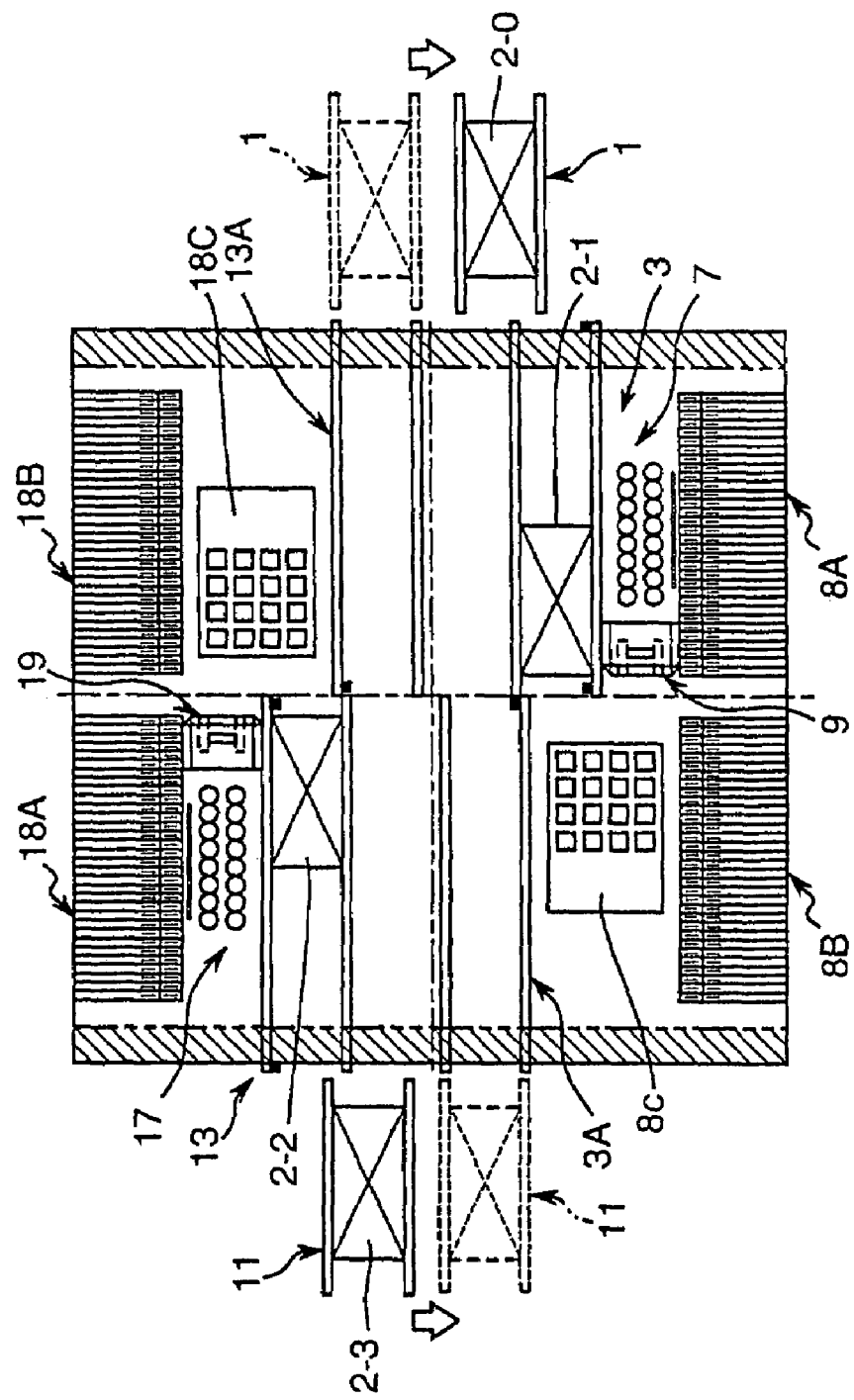
FIG. 29 is a plan view showing a component mounting apparatus according to another embodiment of the present invention.
Figure 30:
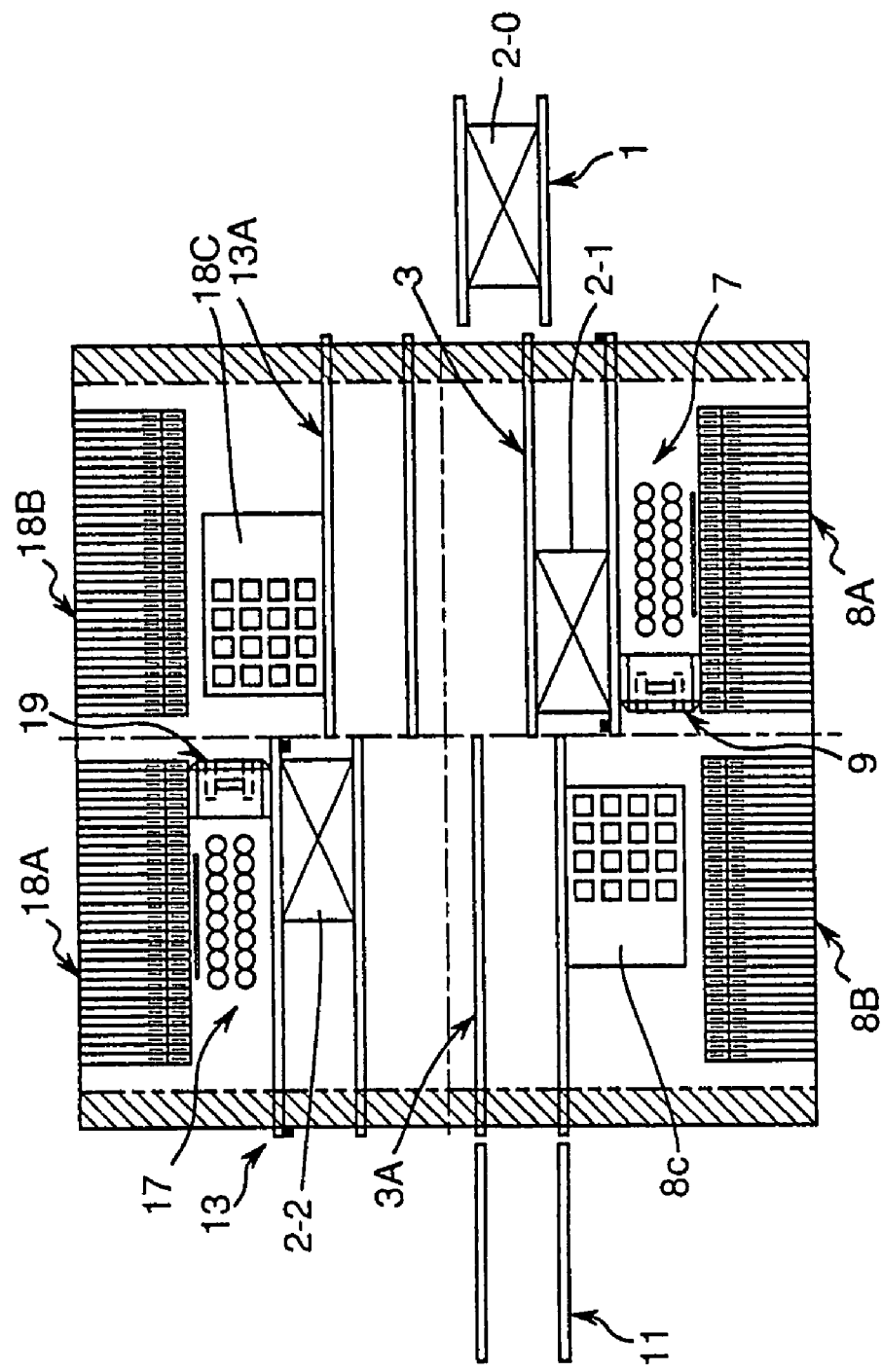
FIG. 30 is a plan view showing a state of the component mounting apparatus of FIG. 29 during component mounting.

On the other hand, when maintenance of the mounting apparatus is performed, the support rail units 21-1, 21-2 on the locked side and the support rail units 22-1, 22-2 on the moved side are moved to positions distant from the first and second component mounting positions and receded from above the support plate 38-1, 38-2 in FIGS. 17 and 26. Consequently, various maintenance works for the mounting apparatus, for example, replacement of support pins 87 or support plates 38-1, 38-2 for supporting an electronic circuit board 2 from downward or replacement of nozzles 10, 20 in the nozzle station 7, 17, can be easily performed without trouble.

The conveyance flow of boards under the control of the control unit 1000 is described in detail below with reference to FIGS. 18 to 21.

Figure 22:
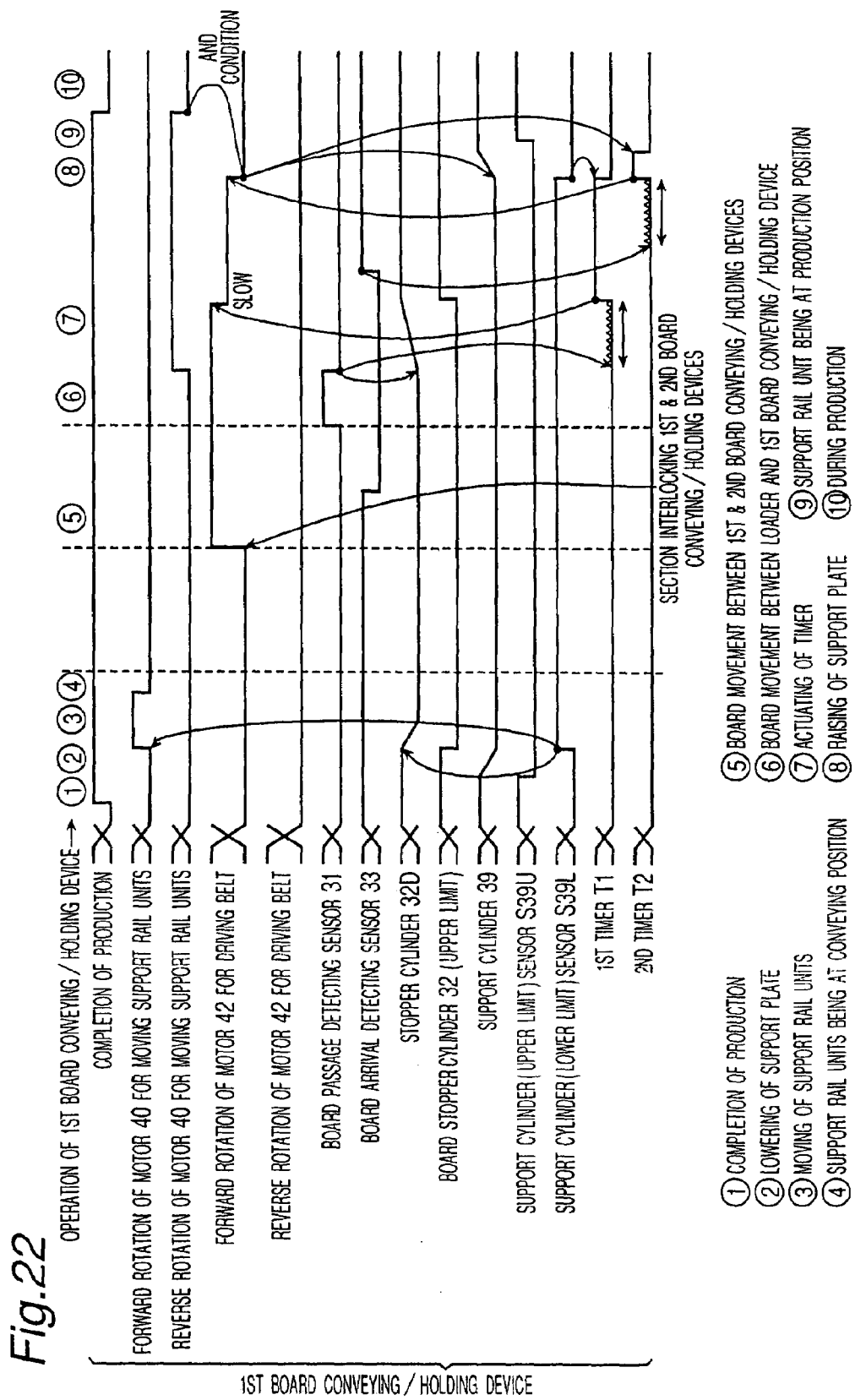
FIG. 22 is a timing chart of a board conveying operation in a first board conveying/holding device in the component mounting apparatus of FIG. 1.
Figure 23:
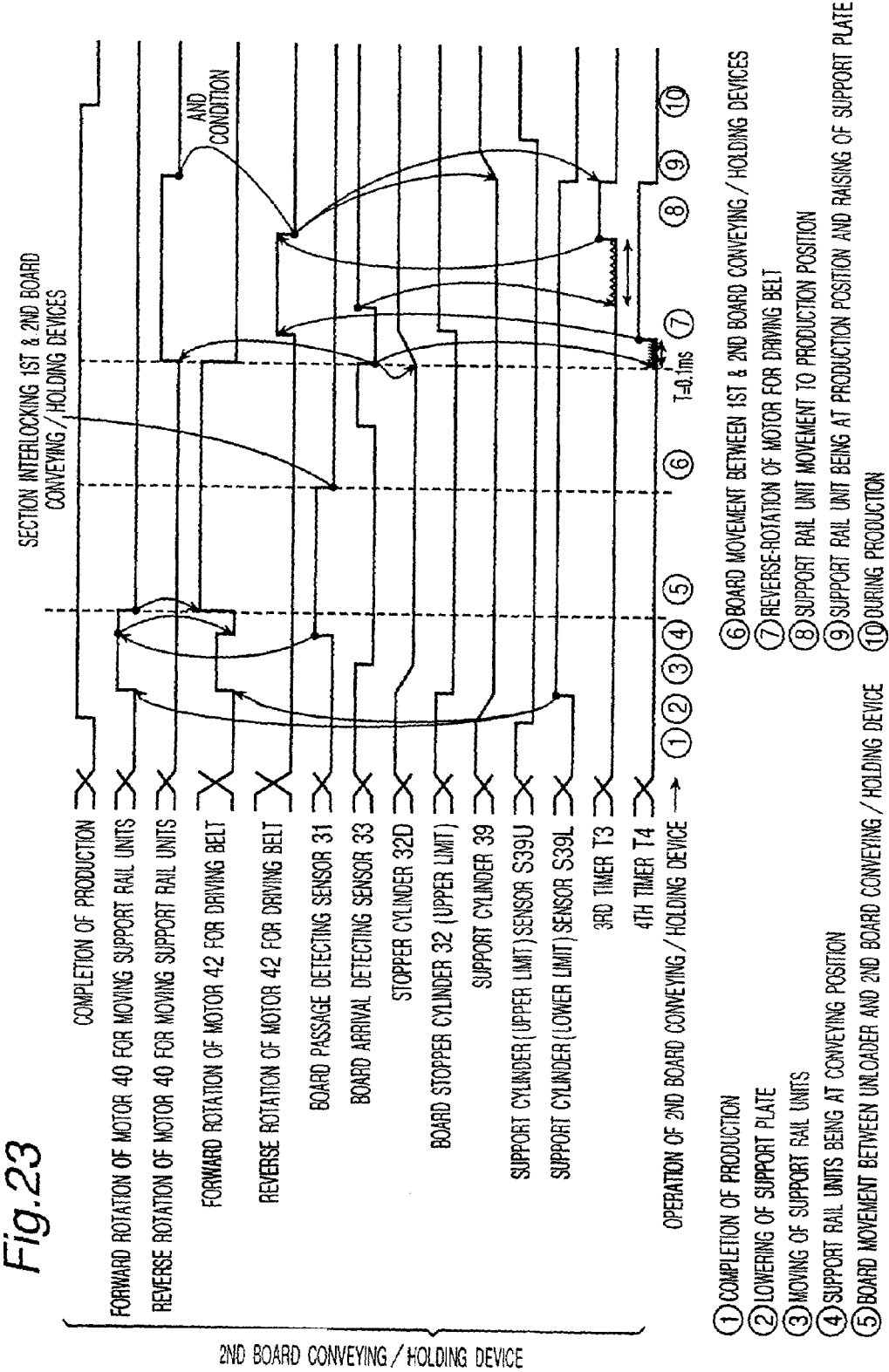
FIG. 23 is a timing chart of a board conveying operation in a second board conveying/holding device in the component mounting apparatus of FIG. 1.

FIGS. 18 to 21 show a flow of electronic circuit boards 2 during production (component mounting). At a stage where the production is started, the support rail units 21-1, 21-2 on the locked side and the support rail units 22-1, 22-2 on the moved side are synchronously driven together. FIGS. 22 and 23 show timing charts in the board conveying operation.

Figure 18:
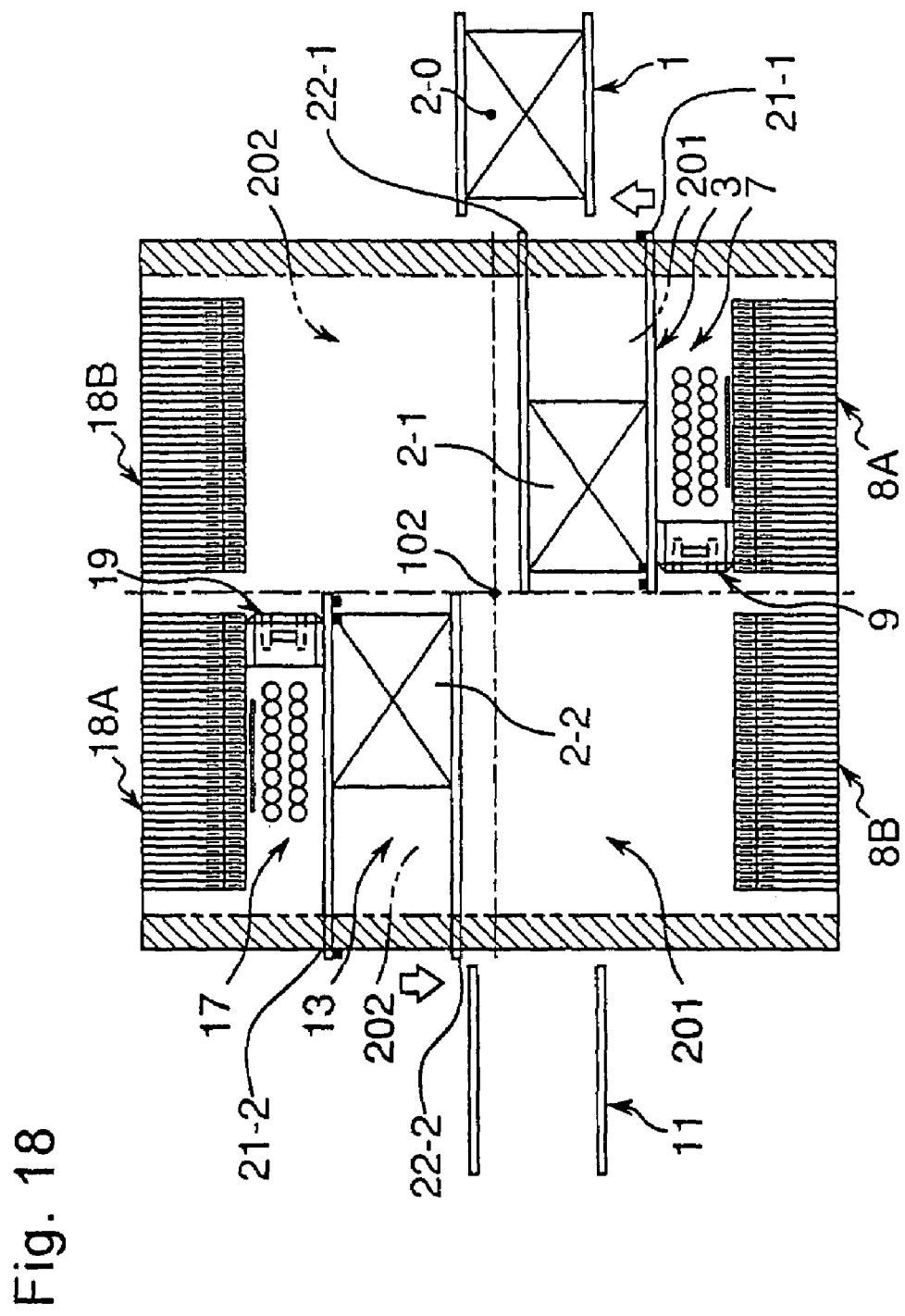
FIG. 18 is an explanatory view showing a state of the support rail units of the board conveying/holding devices in the component mounting apparatus of FIG. 1 when a mounting operation is completed.

FIG. 18 shows positional relationship when component mounting production is finished. At this time, the electronic circuit board 2-0 to be produced next is ready on the loader 1.

First, as shown in the timing charts in FIGS. 22 and 23, after the component mounting production is finished, the lower limit position detecting sensors S39L, S39L detect that the support plates 38-1, 38-2 of the first and second board conveying/holding devices 3, 13, start lowering by drive of the support plate drive cylinders 39, 39 under the control of the control unit 1000, and are positioned at their respective lower limit positions. When detection signals from the lower limit position detecting sensors S39L, S39L are input in the control unit 1000, the board stopper drive cylinder 32D is driven and a stopper 32-1, which is provided on the support rail unit 21-1 on the locked side of the first board conveying/holding device 3 and positioned at a raised position during a mounting operation, lowers in the first board conveying/holding device 3 so that the board 2 reaches a state where the board 2 can be carried out. A stopper 32-2, which is provided on the support rail unit 21-2 on the locked side of the second board conveying/holding device 13 and positioned at a raised position during a mounting operation, also lowers so that the board 2 becomes in a state where the board 2 can be carried out.

When the detection signals from the lower limit position detecting sensors S39L, S39L are input in the control unit 1000, the board stopper drive cylinder 32D is driven in the first board conveying/holding device 3 as described above. In addition to this, in the first board conveying/holding device 3, the motor 40 for moving support rail units is driven, and the ball screw shafts 35, 35 rotate synchronously. The support rail units 21-1, 22-1 start moving from a first component mounting position towards the board conveying position in the central portion of the component mounting work area 200 as shown upward in FIG. 18. In the second board conveying/holding device 13 as well, the motor 40 for moving support rail units is driven and the ball screw shafts 35, 35 rotate synchronously. The support rail units 21-2, 22-2 start moving from a second component mounting position towards the board conveying position in the central portion of the component mounting work area 200 as shown downward in FIG. 18. At this time, in the second board conveying/holding device 13, when the motor 40 for moving support rail units is driven, the belt drive motor 42 is also driven at the same time and conveyance is started so that the board 2-2 positioned on the right end portion side in the second board conveying/holding device 13 is moved towards the left end portion. When the board passage detecting sensor 31-2 detects the board 2-2, it is determined whether the motor 40 for moving support rail units is driven. When this motor 40 is driven, drive of the belt drive motor 42 is stopped. When this motor 40 is not driven, drive of the belt drive motor 42 may be continued. This is for the purpose of conveying the board 2-2 only on the support rail units 21-2, 22-2 of the second board conveying/holding device 13 to shorten the conveying time from the second board conveying/holding device 13 to the unloader side. Consequently, the board 2-2 does not protrude from the support rail units 21-2, 22-2 during the movement of the support rail units 21-2, 22-2. Also, after the motor 40 for moving support rail units is driven and then a prescribed time passes (that is, before the support rail units 21-2, 22-2 are positioned at the board conveying position), drive of the belt drive motor 42 is suspended once and the motor gets ready for the subsequent board conveying operation at the board conveying position.

Figure 19:
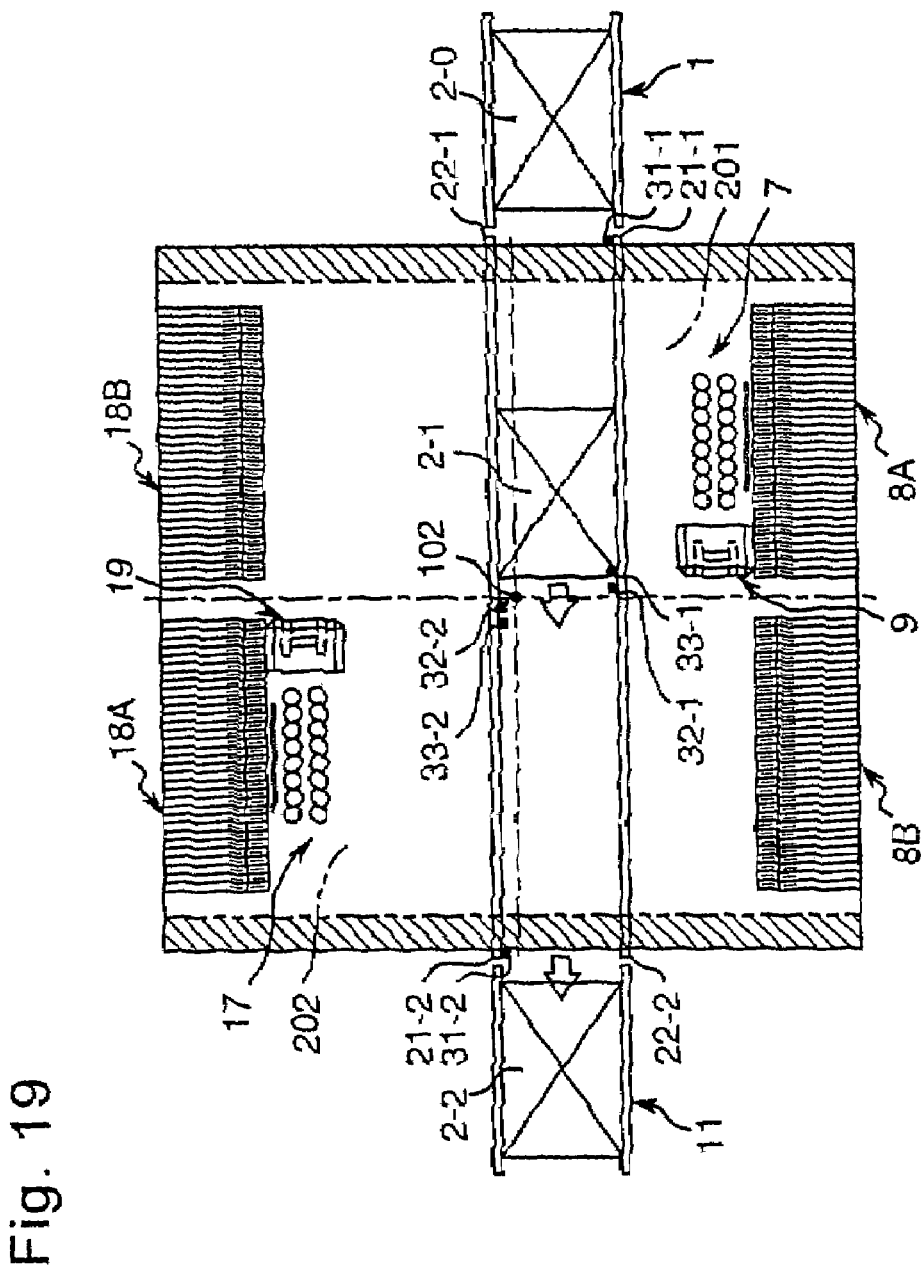
FIG. 19 is an explanatory view showing a state of the support rail units of the respective board conveying/holding devices in the component mounting apparatus of FIG. 1 when boards are carried out after the completion of the mounting operation.

FIG. 19 shows a state where the support rail units 21-1, 22-1 of the first board conveying/holding device 3 and the support rail units 21-2, 22-2 of the second board conveying/holding device 13 arrive at the board conveying positions in the central portion of the component mounting work area 200 and are stopped at their respective board conveying positions. In this state, the loader 1, the support rail units 21-1, 22-1 of the first board conveying/holding device 3, the support rail units 21-2, 22-2 of the second board conveying/holding device 13, and the unloader 11 are aligned in one line. Here, the electronic circuit board 2 flows from right to left.

Subsequently, it is detected that the support rail units 21-2, 22-2 of the second board conveying/holding device 13 are moved from the second component mounting position to the board conveying position (that is, drive of the motor 40 for moving support rail units of the second board conveying/holding device 13 is stopped). Then, the belt drive motor 42 is driven and the board 2-2 produced (components-mounted) in the second board conveying/holding device 13 is carried out from the second board conveying/holding device 13 to the unloader 11. Completion of the carrying-out is determined when the board passage detecting sensor 31-2 detects that the board 2-2 passes and is not present.

When the completion of the carrying-out of the board is determined by the control unit 1000, the motor 40 for moving support rail units of the first board conveying/holding device 3 is driven and conveyance of the board 2-1 produced in the first board conveying/holding device 3 from the first board conveying/holding device 3 to the second board conveying/holding device 13 is started.

Figure 20:
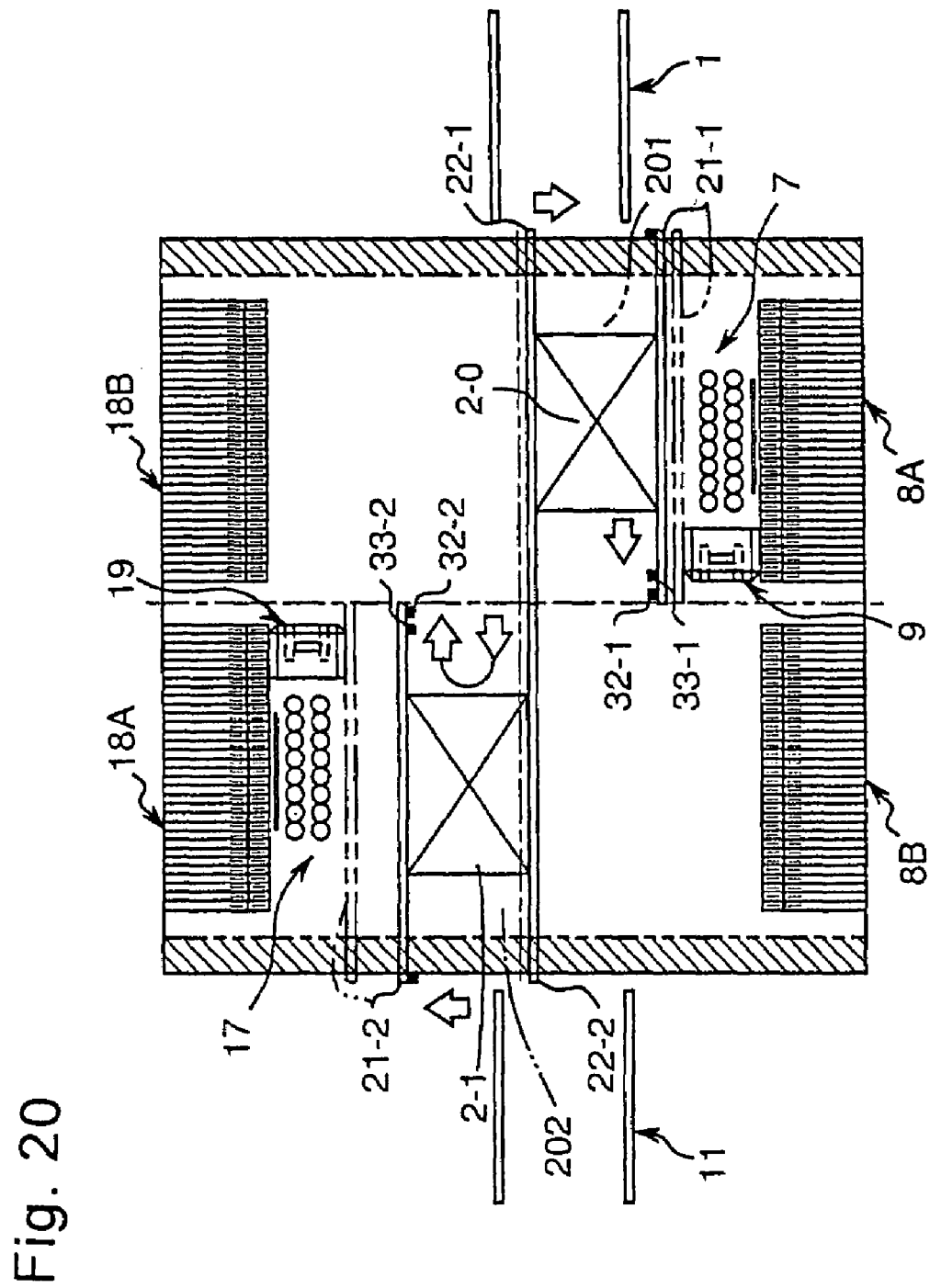

Subsequently, as shown in FIG. 20, when the board arrival detecting sensor 33-2 detects arrival and passage of the board 2-1 in the second board conveying/holding device 13, drive of the belt drive motor 42 is stopped, while the board stopper drive cylinder 32D is driven and the board stopper 32-2 is raised to the upper limit position. The upper end position detecting sensor S32 detects that the board stopper 32-2 reaches the upper limit position and is prepared to stop the board 2-1. Meanwhile, the board 2-1 is conveyed in a direction from right to left by drive of the belt drive motor 42. After the board arrival detecting sensor 33-2 detects the arrival and passage of the board 2-1 and a lapse of a prescribed time (for example, 0.1 ms) is measured by a timer T4 so that a delay is achieved by the time required for the board stopper 32-2 to be raised to the upper limit position, rotation of the belt drive motor 42 is driven in the reverse direction so that the belt 500 attached to the support rail units 21-2, 22-2 of the second board conveying/holding device 13 is run in a direction from left to right and the board 2-1 is conveyed in the reverse direction. Then, the right side end edge of the board 2-1 is brought into contact with the board stopper 32-2 and the board arrival detecting sensor 33-2 detects arrival of the board 2-1. After the arrival is detected and a prescribed time period is measured by the timer T3, drive of the belt drive motor 42 is stopped. The belt drive motor 42 is thus driven in excess so that the right side end edge of the board 2-1 can be brought into contact with the board stopper 32-2 more reliably.

Meanwhile, after the board arrival detecting sensor 33-2 detects the arrival and passage of the board 2-1, the motor 40 for moving support rail units is driven and the support rail units 21-2, 22-2 of the second board conveying/holding device 13 start moving from the board conveying position to the second component mounting position, that is, towards the recognition camera 19. That is, conveyance of the board 2-1 on the support rail units 21-2, 22-2 and movement of the support rail units 21-2, 22-2 themselves from the board conveying position to the second component mounting position are carried out at the same time. Thus, the arrival of the board 2-1 on the support rail units 21-2, 22-2 at the prescribed position and the arrival of the support rail units 21-2, 22-2 at the second component mounting position are both finished and the board conveying operation is finished. That is, when the reverse drive of the belt drive motor 42 is stopped and the drive of the motor 40 for moving support rail units is stopped, a termination of the board conveying operation is determined and the support plate drive cylinder 39 is driven so that the support plate 38-2 is raised. Then, the board 2-2 is supported by the support plate 38-2.

Some time period is required between the board conveying operations. During this time period, replacement of nozzles 20 required for production or the like is performed in the nozzle station 17 or the like. In general, nozzle replacement is performed a plurality of times to produce one electronic circuit board 2, and nozzle replacement is performed since the nozzles are always returned to original nozzles at the beginning of the production of boards 2.

Meanwhile, in the first board conveying/holding device 1, when the board passage detecting sensor 31-1 confirms passage of the board 2-0 from the loader 1, the board stopper drive cylinder 32D is driven and the board stopper 32-1 is raised to the upper limit position. The upper end position detecting sensor S32 detects that the board stopper 32-2 reaches the upper limit position and preparation for carrying in the board is completed. Meanwhile, after a lapse of a prescribed time is measured by a timer T1, the rotation speed of the belt drive motor 42 is reduced so that an impact is reduced when the board 2-0 is brought into contact with the board stopper 32-1. Then, the left end edge of the board 2-0 is brought into contact with the board stopper 32-1 and arrival of the board 2-0 is detected and confirmed by the board arrival detecting sensor 33-1. After the arrival of the board is detected by the board arrival detecting sensor 33-1 and a lapse of a prescribed time is measured by the timer T1, drive of the belt drive motor 42 is stopped. The belt drive motor 42 is thus driven in excess so that the left side end edge of the board 2-0 is brought into contact with the board stopper 32-1 more reliably.

Meanwhile, after the board passage detecting sensor 31-1 confirms the passage of the board 2-0, the motor 40 for moving support rail units is driven and the support rail units 21-1, 22-1 start moving from the board conveying position towards the first component mounting position, that is, towards the recognition camera 9. As in the case of the support rail units 21-2, 22-2 of the second board conveying/holding device 13, conveyance of the board 2-0 and movement of the support rail units 21-1, 22-1 are carried out at the same time. When both the operations are completed, the board conveying operation is finished. That is, when drive of the belt drive motor 42 is stopped and drive of the motor 40 for moving support rail units is stopped, a termination of the board conveying operation is determined and the support plate drive cylinder 39 is driven so that the support plate 38-1 is raised. Then, the board 2-0 is supported by the support plate 38-1.

Some time period is required during the board conveying operations. During this time period, replacement of nozzles 10 required for production or the like is performed in the nozzle station 7 or the like.

Figure 21:
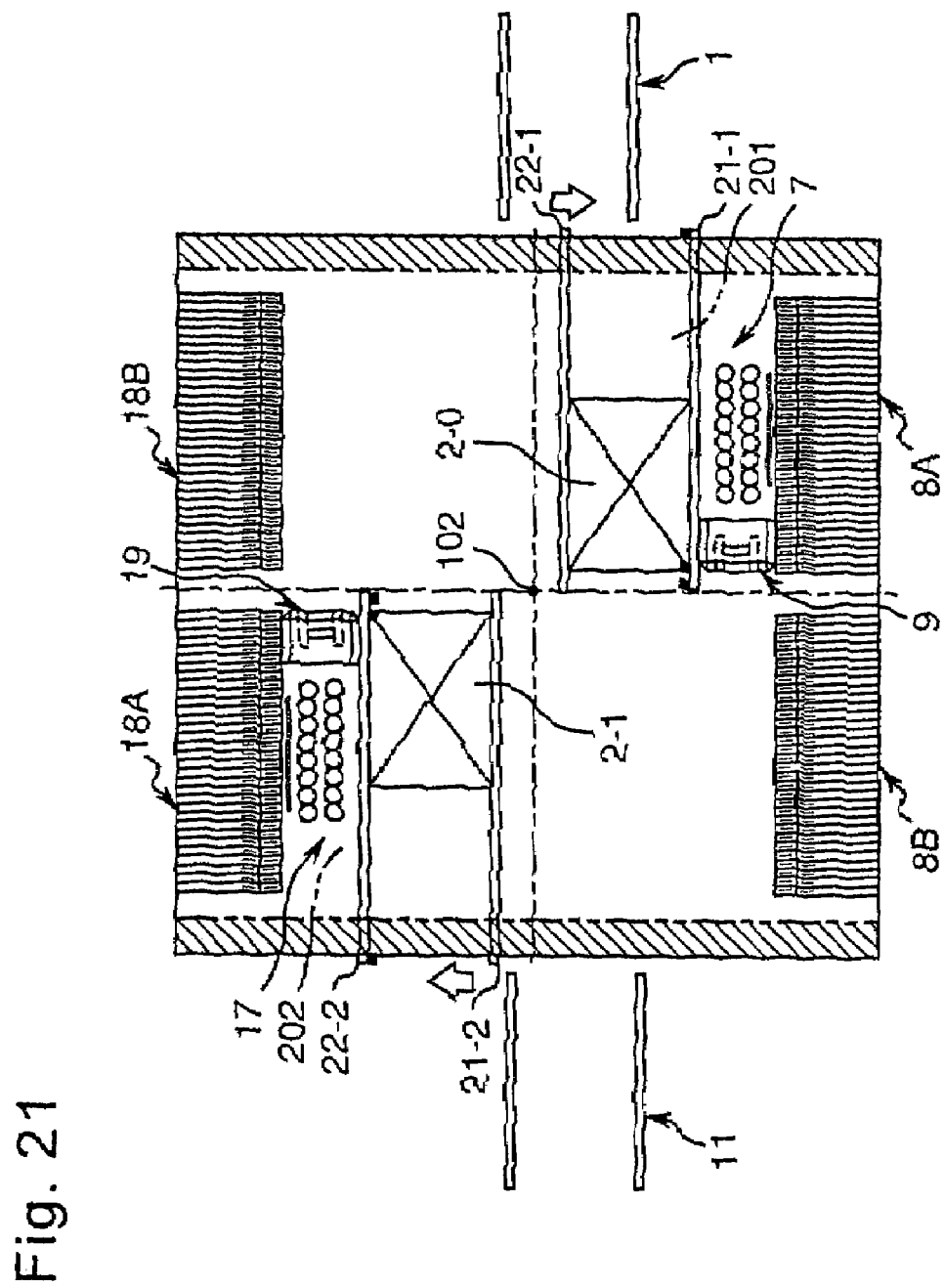
FIG. 21 is an explanatory view showing a state of the support rail units of the board conveying/holding devices in the component mounting apparatus of FIG. 1 when mounting of components is started after completion of carrying-in of the boards.

FIG. 21 shows a state where the board conveying operation is completed and the production of the board (that is, the component mounting operation) is started as in the case shown FIG. 16.

Subsequently, when production is completed as explained with reference to FIGS. 18 to 20, the support rail units 21, 22 of each board conveying/holding device 3, 13 are moved from the first and second component mounting positions to the board conveying position so that the produced board is carried out. After a subsequent board is carried in, the state is returned to the mounting state in FIG. 21, and the mounting operation is continued. Thus, components are successively mounted onto boards.

According to the above embodiment, in one component mounting apparatus, the component mounting work area 200 of the board 2 is divided into two areas, the first mounting area 201 and the second mounting area 202, assuming the board conveyance path from the board carrying-in side to the board carrying-out side as a center. In the first mounting area 201, the board 2-1 is carried in from the loader 1 to the first mounting area 201. The board 2-1 is positioned and held for a mounting operation at a portion closest to the component feed unit 8A and the recognition camera 9 as an example of the first component recognition unit disposed at an end portion of the first mounting area 201 along a direction of the board conveyance path. Subsequently, in the first mounting area 201, components are sucked and held from the component feed units 8A, 8B and mounted on at least a half area (a shaded area 2A in FIG. 2) of the board 2-1 on the front-side with respect to an operator on the side closer to the first component feed unit 8A. Subsequently, after the mounting work in the first mounting area 201 is finished, the board 2-1 is positioned and held for a mounting operation at a portion closest to the component feed unit 18A of the second mounting area 202 and the recognition camera 19 as an example of the second component recognition unit to mount components onto the board 2-1. Subsequently, in the second mounting area 202, components are sucked and held from the component feed units 18A, 18B and mounted at least on a half area (a shaded area 2A in FIG. 2) on the rear side viewed from the operator on the side closer to the component feed unit 18A of the board 2-1. Subsequently, after the mounting work is finished in the second mounting area 202, the board 2-1 is carried out from the second mounting area 202. As a result, the shortest distances between the board 2 positioned at each mounting area 201, 202, each component feed unit 8A, 18A, and each recognition camera 9, 19 can be substantially reduced as compared with a conventional case where a board is held on the board conveyance path in the component mounting work area. Thus, the mounting time can be shortened and productivity can be improved.

That is, one component mounting work area 200 of one mounting apparatus is divided into two areas, the first mounting area 201 and the second mounting area 202 so that two boards 2 are placed and components can be mounted. Then, the boards are moved back and forth in each mounting area so that components are fed, recognized, and mounted on the end edge side of the mounting area close to the component feed unit. For example, the board 2 in the first mounting area 201 is positioned at the front-side end edge of the mounting area while the board 2 in the second mounting area 202 is positioned at the rear-side end edge of the mounting area. Therefore, the recognition camera 9, 19 and the electronic circuit board 2-0, 2-1 approach each other to have the shortest distance therebetween irrespective of the size of the electronic circuit board 2 when mounting operations are performed. Consequently, the moving distance of the working head 4, 14 (that is, the distances between positions for three operations—suction, recognition, and mounting operations of components) is minimized. Thus the mounting time can be shortened and the production efficiency can be improved. In particular, when components are conventionally mounted onto a board in the vicinity of the board conveying position, the distances between positions for three operations—suction, recognition, and mounting, of components are long for a small board and thus the mounting time is long. In this embodiment, however, whether the board is small or large, the board is positioned at such a position for mounting operation that the distances between positions for three operations—suction, recognition, and mounting, of components become short. Therefore, the mounting time can be substantially reduced. In particular, in each mounting area, the component feed units 8A, 8B, 18A, 18B are disposed almost at the entirety of the end edges along the board conveying direction in the component mounting work area as shown in FIGS. 2 and 3. Therefore, the recognition cameras 9, 19 are disposed on the central side of the component mounting work area 200 while the position where the board 2 is to be positioned is located on the central side of the component mounting work area 200 in the board conveying/holding device 3, 13 so that the distances between positions for three operations—suction, recognition, and mounting of components become shorter. Thus, the mounting time can be further improved. Since one component mounting work area 200 is divided into two, the moving distance of the working heads 4, 14 is reduced and thus the mounting time can be improved. For example, in the mounting apparatus of this embodiment, the time required to mount one component can be reduced to about a half of that required in a conventional device. Thus, mounting time can be substantially improved.

Since two boards 2, 2 are positioned diagonally, that is, in a zigzag manner, in the component mounting work area 200 in one component mounting apparatus, a mounting efficiency per unit area can be improved as compared with a conventional device in which only one board 2 is positioned.

Furthermore, due to the zigzag positions of the boards 2, 2 in one component mounting apparatus, for example, other component feed units such as the tray-type component feed unit 8C, 18C, in which semiconductor chips or the like can be housed without reducing the successively disposed number of already positioned component feed unit, for example, cassette feed units, or the like can be positioned in a zigzag manner in an area in which no board 2 is placed. The component feed unit constituted by the tray-type component feed unit or the like can be located closer to the board and thus component feeding efficiency can be improved.

Furthermore, according to the above embodiment, when maintenance of the mounting apparatus is performed, the support rail units 21-1, 21-2 on the locked side and the support rail units 22-1, 22-2 on the moved side are moved to positions that are distant from the first and second component mounting positions, respectively, and receded from above the support plates 38-1, 38-2. Consequently, when various maintenance work for the mounting apparatus such as, for example, replacement of the support pins 87 or the support plates 38-1, 38-2 for supporting the electronic, circuit board 2 from below or replacement of the nozzles 10, 20 in the nozzle station 7, 17 are performed, the various maintenance work can be easily performed without trouble. Furthermore, the support plates 38 can be easily replaced in a batch and thus the time required to change positions of the support pins 87 can be shortened.

Furthermore, if operations are controlled and the sensors and the stoppers are arranged so that the board is placed in the board conveying direction in the second board conveying/holding device 13 once, and then the board 2 is moved in a direction reverse to the board conveying direction and positioned when only arrangement of the first board conveying/holding device 3 and the second board conveying/holding device 13 is changed point-symmetrically and the board 2 is positioned in the second board conveying/holding device 13, the first board conveying/holding device 3 and the second board conveying/holding device 13 can have exactly the same structure and become in common with each other.

Furthermore, by the locking operation and the unlocking operation of the selective lock mechanism 70, a Y-direction moving operation, in which the support rail unit 21 on the locked side is moved integrally with the support rail unit 22 on the moved side, and a distance adjusting operation according to the board width, in which the support rail unit 21 on the locked side is fixed and only the support rail unit 22 on the moved side is moved, can be selected. The drive shaft for the distance adjustment according to the board width for adjusting the distance between the support rail units 21, 22 according to the board width and the drive shaft for conveying the board can be commonly used. Therefore, the number drive shafts can be reduced. Thus, the drive mechanism for the distance adjustment according to the board width and the drive mechanism for conveying the board can be simplified.

Furthermore, the locking operation and the unlocking operation of the selective lock mechanism 70, 70 can be selectively performed by drive of the selective lock mechanism cylinder 30. As a result, the Y-direction moving operation, in which the support rail unit 21 on the locked side is moved integrally with the support rail unit 22 on the moved side, and the distance adjusting operation according to the board width, in which the support rail unit 21 on the locked side is fixed and only the support rail unit 22 on the moved side is moved, can be easily and reliably selected.

Furthermore, since one motor 40 is driven to drive rotation of two ball screw shafts 35, 35 synchronously so that the support rail units 21, 22 are easily moved, the two ball screw shafts 35, 35 can be easily driven synchronously and the support rail units 21, 22 can be more reliably moved in parallel.

Furthermore, since the support plate 38 having the support pins 87 and the support rail units 21, 22 are separated and independently driven, the movement mechanism is made lighter and simplified as compared with the case where the support plate 38 and the support rail unit are integrally moved. Thus, the moving operation can be faster at a lower cost.

When the board positioning stopper 32 and the board arrival detecting sensor 33 are disposed at the front and rear end portions in the board conveying direction in each board conveying/holding device 3, 13, the board 2 can be positioned at both front and rear end portions in the board conveying direction. Therefore, in each mounting area 201, 202, a board positioning position at which the board 2 is positioned can be arbitrarily determined based on information such as the size of the board 2, distribution of positions at which components are mounted, distribution of positions at which components are sucked from the component feed unit and held, and so forth.

Furthermore, when component mounting in the first board conveying/holding device and component mounting in the second board conveying/holding device are performed simultaneously, mounting operations can be performed more efficiently and thus mounting time can be shortened.

Furthermore, when board conveyance from the loader to the first board conveying/holding device, board conveyance from the first board conveying/holding device to the second board conveying/holding device, and board conveyance from the second board conveying/holding device to the unloader are performed simultaneously, board conveying operations can be performed more efficiently and thus the mounting time can be shortened.

It is noted that the present invention is not limited to the above embodiment, but can be applied in other various aspects.

For example, due to the zigzag positions of the boards 2, 2 in one component mounting apparatus, when other component feed units such as a tray-type component feed unit 8C, 18C, which can house, for example, semiconductor chips or the like without reducing the successively disposed number of already positioned component feed units for example, cassette feed units, disposed in a zigzag manner in an area in which no board 2 is placed, an automatic tray replacement device 300 may be provided to automatically replace the tray-type component feed unit 18C as shown with an alternate long and two dot-chain line in FIG. 3. Furthermore, although not specifically shown, while the tray-type component feed unit 8C is manually placed by an operator, the automatic tray replacement device 300 may be provided to automatically replace the tray-type component feed unit 8C as in the case of the tray-type component feed unit 18C. Furthermore, automatic component feed unit replacement devices may be provided for other component feed units 8A, 8B, 18A, 18B to automatically replace the component feed units 8A, 8B, 18A, 18B. Consequently, since stopping of the mounting operation due to shortage of components in the component feed unit or the like during component mounting is prevented, practical production capacity, that is, real productivity, can be improved. That is, components are continuously fed and mounted at a high speed. Furthermore, when the component feed units and other constituent elements of the component mounting apparatus such as their respective automatic replacement devices or the like are modulated, they are appropriately replaced in response to further improvement of the mounting apparatus and thus the component mounting apparatus can be advanced. That is, while basic elements are assumed as a foundation, the component mounting apparatus can be advanced only by replacing a module of each constituent element. Furthermore, as described above, when constituent elements are modulated, a model change of the board or the component can be responded to only by appropriately replacing the module of the constituent element even if the model of a board or a component is changed. Thus, productivity per device installation area (that is, area productivity) can also be improved.

Furthermore, the component mounting work area 200 of the mounting apparatus is divided into two areas, the first mounting area 201 and the second mounting area 202, along the component conveying direction. However, the area does not need to be evenly divided into two areas, but may be divided into two areas in arbitrary proportions.

Furthermore, if the mounting operation in the first mounting area 201 and the mounting operation in the second mounting area 202 can interfere with each other due to the size of the mounting areas or the board, operations may be controlled by the control unit 1000 so that respective mounting operations may be performed independently in a non-interference area, whereas either one mounting operation is on standby in an interference area.

Furthermore, the component mounting position is not limited to the origin position of one support rail unit 21 closer to the recognition camera 9, 19 and the component feed unit 8A, 18A, but can be set to be at an arbitrary position.

Furthermore, on the support rail units 21, 22, the position at which the board 2 is positioned is not limited to either one end portion, but may be positioned in the central portion by utilizing the board stopper 32 or the like. Furthermore, in the above embodiment, the board 2 is positioned at the left side end portion in the first board conveying/holding device 3, while the board 2 is positioned at the right side end portion in the second board conveying/holding device 13. However, as required, the board 2 may be positioned at the right side end portion in the first board conveying/holding device 3, while the board 2 may be positioned at the left side end portion in the second board conveying/holding device 13. In this case, at least the board stoppers 32 are preferably positioned on both left and right sides of each board conveying/holding device as shown with solid lines and chain lines in FIGS. 2 and 8.

Thus, the position at which the board 2 is positioned on the support rail unit 21, 22 can be optimally determined based on the size of the board 2, positions at which components are mounted on the board 2, positions of the recognition cameras 9, 19, the component feed units 8A, 8B, 18A, 18B and so forth, the position of the component feed unit which takes components most frequently and so forth among the component feed units 8A, 8B, 18A, 18B.

Furthermore, two ball screw shafts for moving support rail units 21, 22 in parallel are disposed in each board conveying/holding device 3, 13, but a simpler structure can be achieved by, for example, disposing one ball screw shaft in the center and guide members on both sides thereof.

Figure 31:
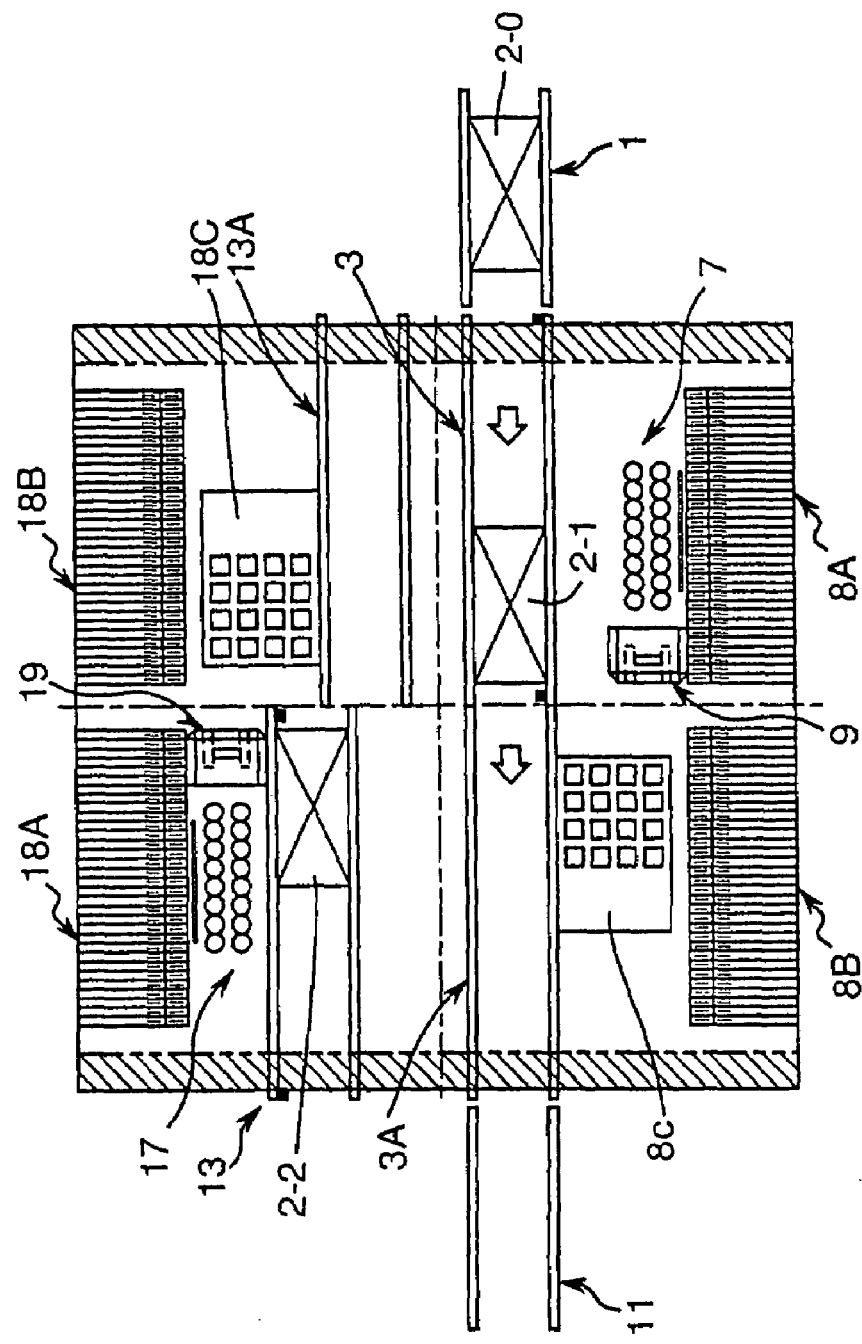
FIG. 31 is a plan view showing a state of a first board conveying/holding device in the component mounting apparatus of FIG. 29 when boards are being replaced.
Figure 32:
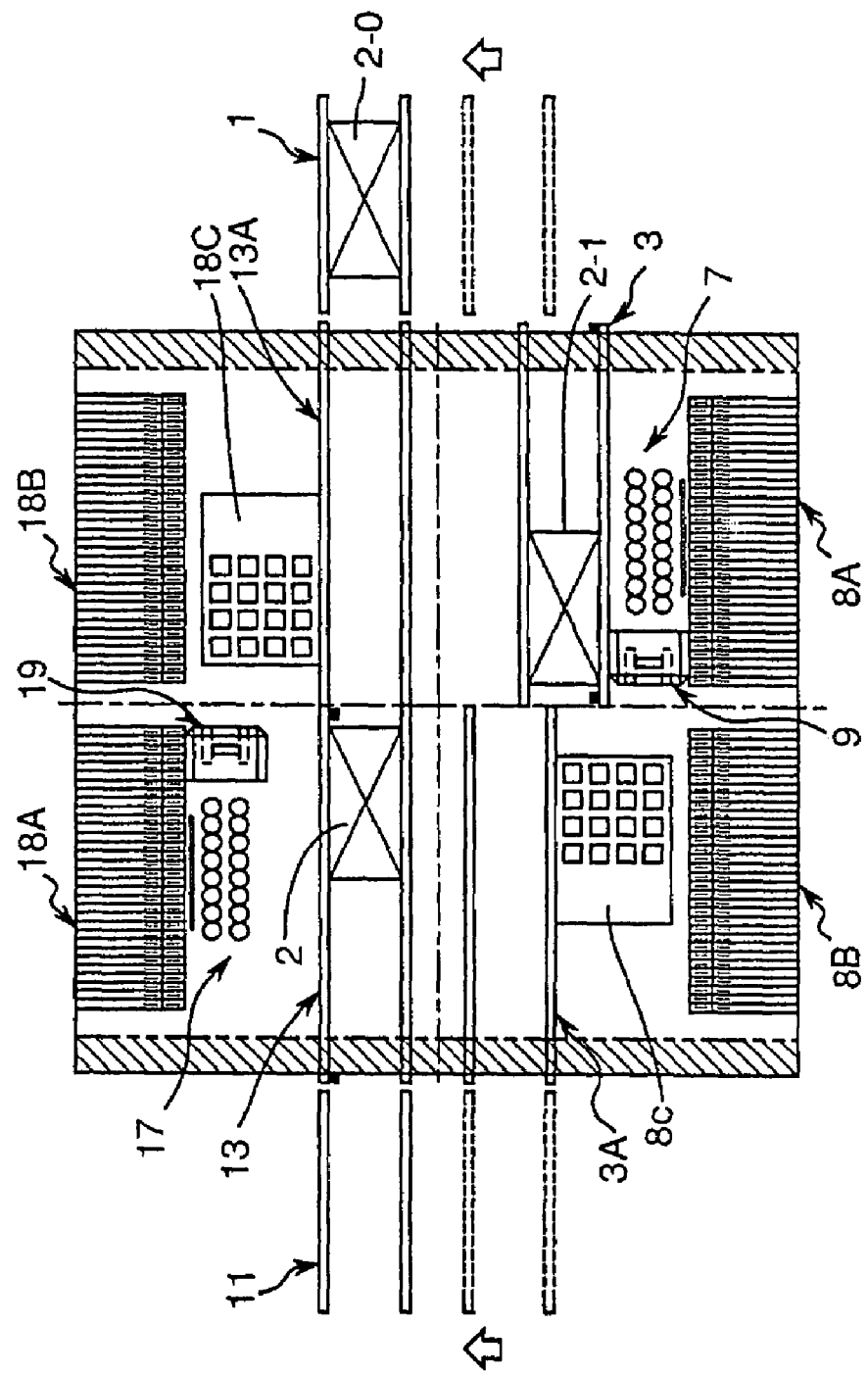
FIG. 32 is a plan view showing a state of a second board conveying/holding device in the component mounting apparatus of FIG. 29 when boards are being replaced.

Furthermore, as shown in FIGS. 29 to 32, a board conveying device 3A, which is fixed in the vicinity of the component feed unit 8C of the first board conveying/holding device 3, performs only conveyance of the board, and cannot move in the Y-axis direction. Meanwhile, a board conveying device 13A, which is fixed in the vicinity of the component feed unit 18C of the second board conveying/holding device 13, performs only conveyance of the board, and cannot move in the Y-axis direction. Consequently, when the mounting operation in the first board conveying/holding device 3 is finished and the mounting operation is not finished on the side of the second board conveying/holding device 13, while the first board conveying/holding device 3 is disposed adjacent to the board conveying device 3A as shown in FIG. 31, a board 2-1 held by the first board conveying/holding device 3 is carried out to the board conveying device 3A and then carried out further to the unloader 11, while a new board 2-0 can be carried in from the loader 1 to the first board conveying/holding device 3. Furthermore, when the mounting operation in the second board conveying/holding device 13 is finished and the mounting operation on the side of the first board conveying/holding device 3 is not finished, while the second board conveying/holding device 13 is disposed adjacent to the board conveying device 13A as shown in FIG. 32, a board 2-2 held by the second board conveying/holding device 13 can be carried out to the unloader 11, while a new board 2-0 can be carried in from the loader 1 via the board conveying device 13A to the second board conveying/holding device 13. It is noted that the loader 1 and the unloader 11 are preferably moved between the positions shown with dotted lines and solid lines, respectively, in the Y-axis direction.

Figure 33:
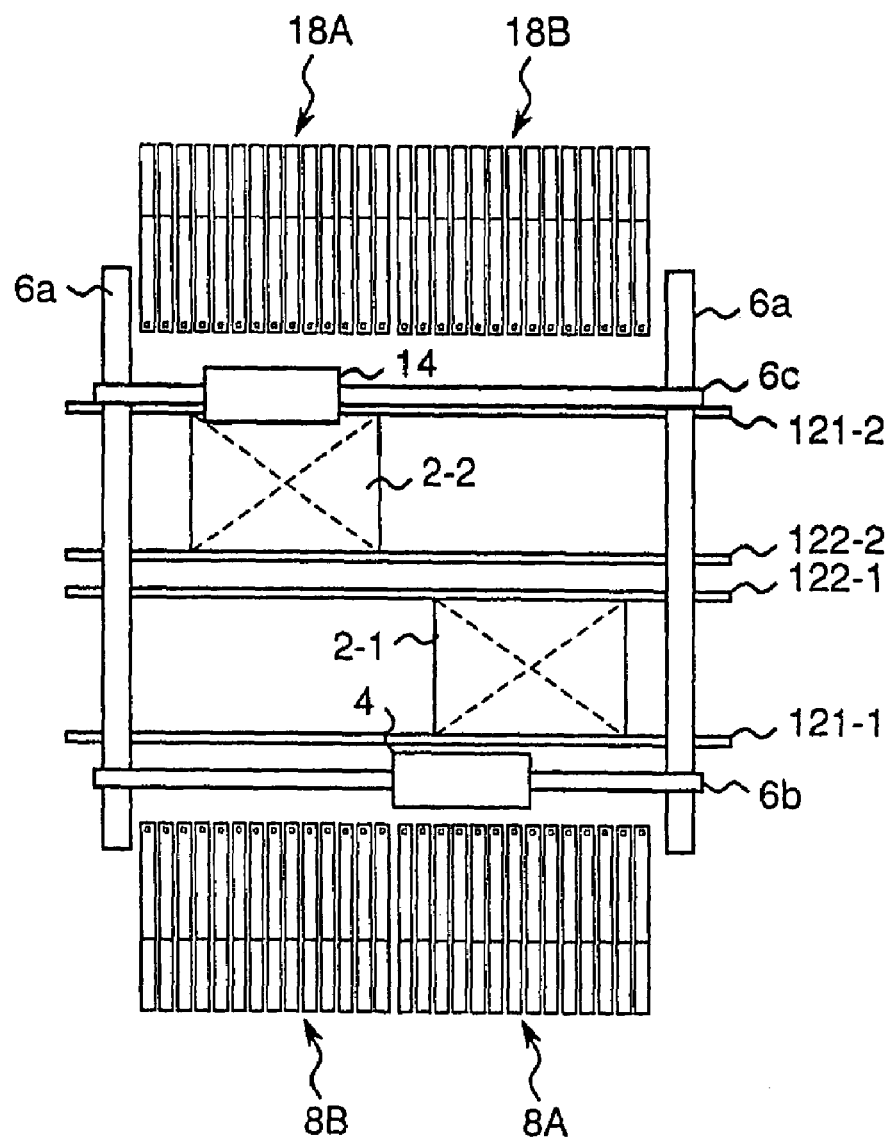
FIG. 33 is a plan view showing a component mounting apparatus according to yet another embodiment of the present invention.

Furthermore, when the respective support rail units 121-1, 122-1, 121-2, 122-2 of the first board conveying/holding device 3 and the second board conveying/holding device 13 have a length equal to or longer than the width of the component mounting work area 200 along the board conveying direction as shown in FIG. 33, boards can be carried in and out irrespective of the mounting operation of the other board conveying/holding device as in the case of the modifications in FIGS. 29 to 32.

Figure 34:
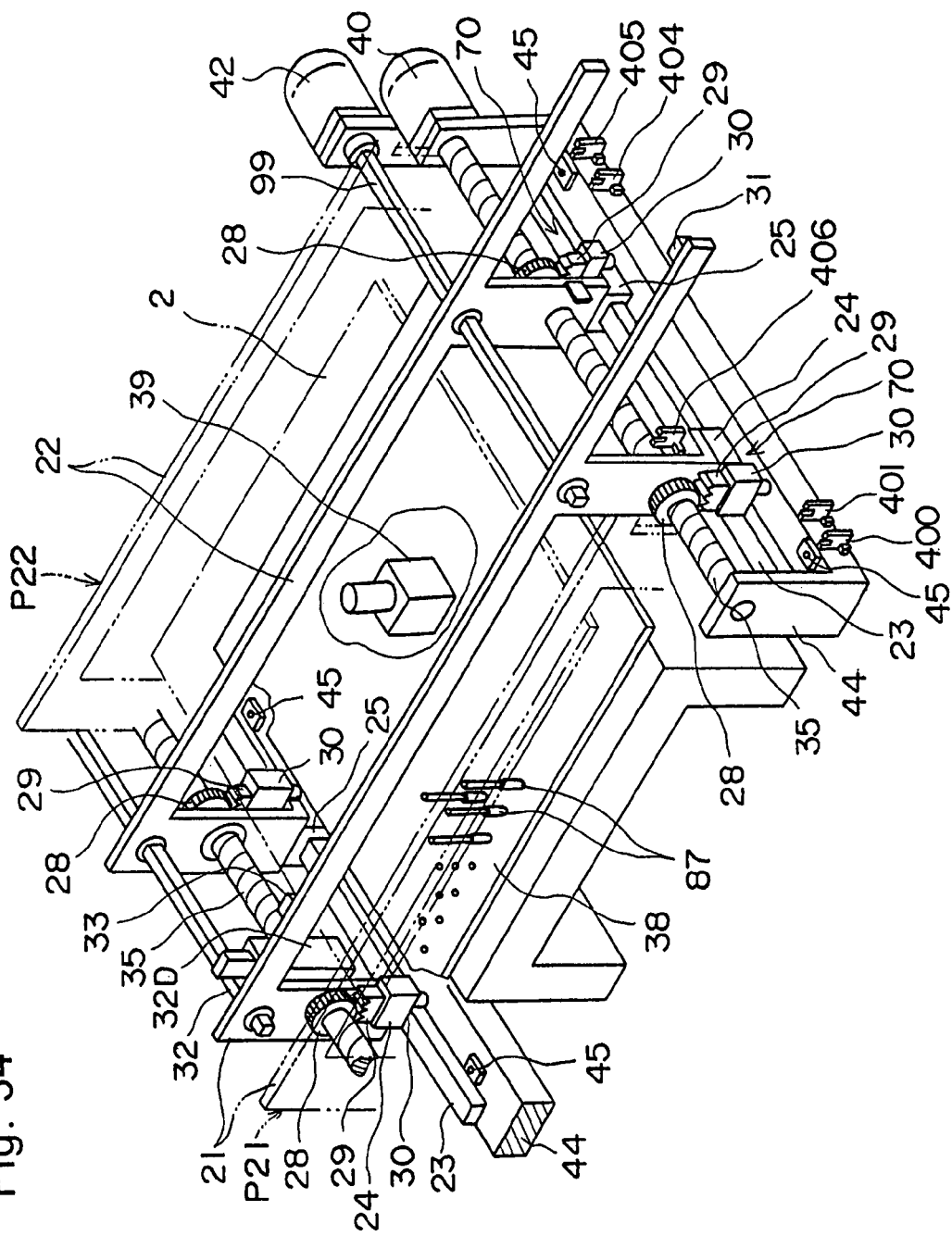
FIG. 34 is a perspective view showing a modification of a board conveying/holding device in a component mounting apparatus according to the yet another embodiment of the present invention.
Figure 35:
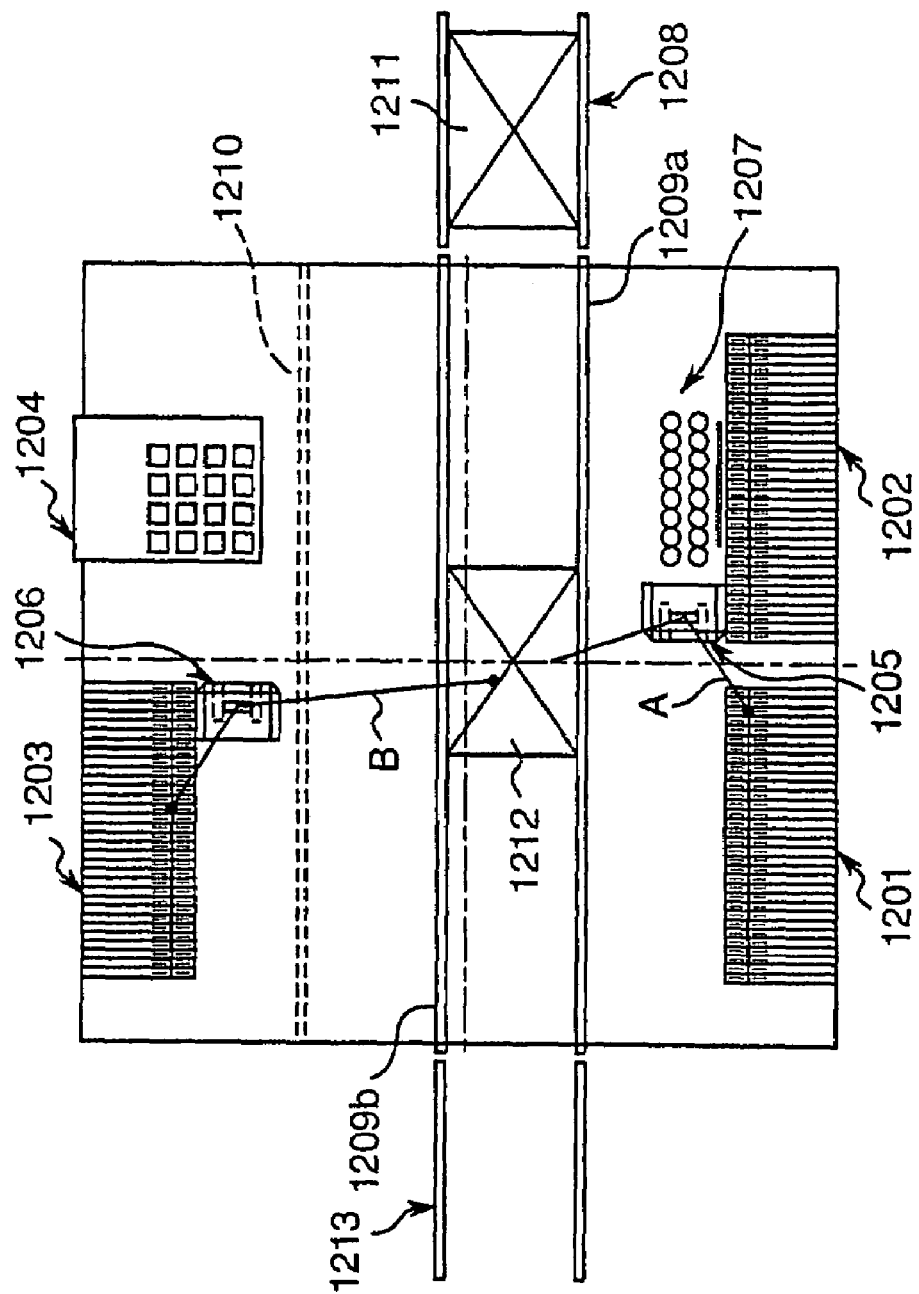
FIG. 35 is a plan view of a conventional component mounting apparatus.

Furthermore, the selective lock mechanism 70 does not need to be positioned on the side of one support rail unit 21, but may be disposed at the other support rail unit 22 as well, as shown in FIG. 34, and thus both of the support rail units 21, 22 may be used as support rail units on the locked side. Consequently, for example, distance adjustment according to the board width does not necessarily need to be performed by fixing the front-side support rail unit 21-1 with respect to the front-side origin position and moving a rear-side support rail unit 22-1 in the first mounting area 201, but can be performed by fixing the rear-side support rail unit 22-1 with respect to the rear-side origin position and moving the front-side support rail unit 21-1. Therefore, when the board conveying direction is changed to a direction reverse to that in the above embodiment or the like, as described above, the reference position of the support rail units 21, 22 can be easily and reliably changed from the front-side reference which is based on the front-side origin position, to the rear-side reference which is based on the rear-side origin position.

It is noted that the selective lock mechanism 70 is not limited to a gear mechanism composed of the rack gear and the gear described above, but a clutch mechanism or the like can also be employed.

Figure 36:
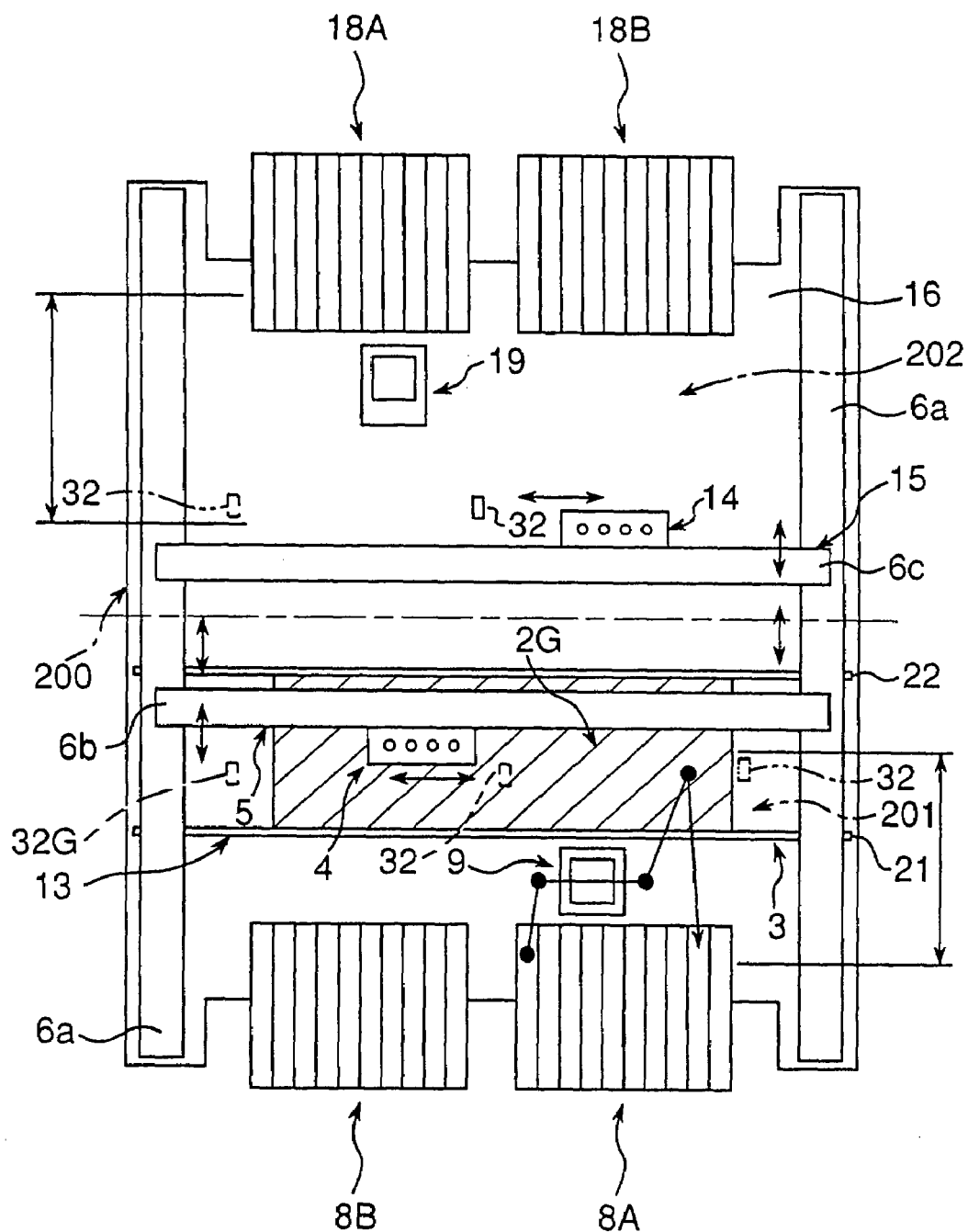
FIG. 36 is a general schematic layout plan of a component mounting apparatus according to yet another embodiment of the present invention.

Furthermore, FIG. 36 shows a component mounting apparatus according to yet another embodiment of the present invention. In this component mounting apparatus, while the first and second board conveying/holding devices 3, 13 are disposed adjacent to each other, a long board 2G placed across the first and second board conveying/holding devices 3, 13 (shown with a shaded portion in the figure) is carried in and the first and second board conveying/holding devices 3, 13 are synchronously moved to either the first mounting area 201 or the second mounting area 202 in parallel to mount components. In the example in FIG. 36, the first and second board conveying/holding devices 3, 13 are synchronously moved in parallel into the first mounting area 201, and components held from the component feed units 8A, 8B by the head 4 are mounted onto the long board 2G placed across the first and second board conveying/holding devices 3, 13. After mounting, the first and second board conveying/ holding devices 3, 13 are returned to the conveying positions on the central side, and then the board is carried out to the downstream side. Or, the first and second board conveying/ holding devices 3, 13 are synchronously moved in parallel into the second mounting area 202, and components held from the component feed units 18A, 18B by the head 14 are mounted onto the long board 2G placed across the first and second board conveying/holding devices 3, 13. After mounting, the first and second board conveying/holding devices 3, 13 are returned to the conveying positions on the central side, and then the board is carried out to the downstream side. It is noted that reference numeral 32G denotes a board stopper for positioning when the long board 2G is carried into the first and second board conveying/holding devices 3, 13. Consequently, usually as shown in FIG. 2, the first and second board conveying/holding devices 3, 13 are separately driven to independently mount components in the first mounting area 201 and the second mounting area 202. However, when the long board 2G placed across the first and second board conveying/holding devices 3, 13 is carried in and components are mounted thereon, the above operations are performed so that components can be appropriately mounted onto boards having totally different sizes in one component mounting apparatus by driving the first and second board conveying/holding devices 3, 13.

It is noted that arbitrary embodiments among the above various embodiments can be appropriately combined to exert their respective effects.

According to one aspect of the present invention, the selective lock mechanism releases the engagement with the first nut of the first rail-like holding member and rotation of the first nut relative to the first rail-like holding member is allowed. Then, by rotating the screw shaft, only the second rail-like holding member is moved and the position of the second rail-like holding member relative to the first rail-like holding member is changed, while the selective lock mechanism is engaged with the first nut of the first rail-like holding member to thereby rotate the screw shaft so that the first rail-like holding member and the second rail-like holding member can be integrally moved in parallel. Therefore, only by performing a locking operation and an unlocking operation of the selective lock mechanism, a gap changing operation for changing the position of the second rail-like holding member relative to the first rail-like holding member and a moving operation for integrally moving the first rail-like holding member and the second rail-like holding member in parallel can be performed selectively, reliably and easily. After the plate-like member is carried into the conveying position, it can be moved to a desired work position and held, and thus a desired work can be performed efficiently. At the same time, after the desired work is finished, the plate-like member can be carried out to the conveying position and thus the plate-like member can be carried in, held, and carried out efficiently and rapidly.

According to another aspect of the present invention, one component mounting work area of one mounting apparatus is divided into two areas, a first mounting area and a second mounting area, so that two boards are placed to mount components thereon. Then, the board is moved forward and backward at each mounting area so that components are fed, recognized, and mounted on the end edge side of the mounting area close to the component feed unit. For example, the board in the first mounting area is positioned at the front-side end edge of the mounting area, while the board in the second mounting area is positioned at the rear-side end edge of the mounting area. Therefore, the recognition unit and the electronic circuit board can approach each other to have the shortest distance therebetween irrespective of the size of the electronic circuit board when a mounting operation is performed. Consequently, for a member for sucking and holding a component, for example, a working head, the distances between positions for three operations—suction, recognition, and mounting of components—are minimized. Thus, the mounting time can be shortened and the production efficiency can be improved. In particular, when components are conventionally mounted on a board in the vicinity of the board conveying position, the distances between positions for three operations—suction, recognition, and mounting of components—are long for a small board and thus the mounting time is long. In the present invention, however, regardless of whether the board is small or large, the board is positioned for mounting operations so that the distances between positions for three operations—suction, recognition, and mounting of components—becomes short. Therefore, the mounting time can be substantially reduced. In particular, when the component feed units are disposed almost at the entire end edge along the board conveying direction in the component mounting work area in each mounting area, the recognition unit is disposed on the central side of the component mounting work area and a position at which the board is positioned in each board conveying/holding device is positioned on the central side of the component mounting work area so that the distances between positions for the three operations, including suction, recognition, and mounting of components, becomes shorter. Thus, the mounting time can be further improved. Furthermore, since one component mounting work area is divided into two, the moving distance of the working heads is reduced and thus the mounting time can be improved.

Furthermore, when two boards are positioned diagonally, that is, in a zigzag manner, in one component mounting work area in one component mounting apparatus, a mounting efficiency per unit area can be improved as compared with a conventional device, in which only one board is placed.

Furthermore, due to the zigzag positions of the boards in one component mounting apparatus, other component feed units such as a tray-type component feed unit 8C, 18C in which, for example, semiconductor chips or the like can be housed without reducing the successively disposed number of already-positioned component feed units, for example, cassette feed units or the like, can be positioned in a zigzag manner in an area in which no board 2 is placed. In this case, the component feed unit constituted by the tray-type component feed unit or the like can be positioned closer to the board and thus component feeding efficiency can be improved.

Furthermore, when maintenance of the mounting apparatus is performed, rail-like holding members on the locked side and rail-like holding members on the moved side are moved to positions that are distant from the component mounting positions and receded from above the support plate for supporting each other from below. Consequently, in this case, when various maintenance work for the mounting apparatus such as, for example, replacement of the support pins or the support plates for supporting an electronic circuit board 2 or replacement of the nozzles for sucking and holding components in the nozzle station can be easily performed without trouble. Furthermore, the support plates can be easily replaced in a batch and thus time required to change positions of the support pins can be shortened.

Furthermore, if operations are controlled and sensors and stoppers are positioned so that only the positions of the first board conveying/holding device and the second board conveying/holding device are changed and the board is placed in the board conveying direction in the second board conveying/holding device once and then the board is moved in a direction reverse to the board conveying direction and positioned when the board is positioned in the second board conveying/holding device, the first board conveying/holding device and the second board conveying/holding device have exactly the same structure and become common with each other.

Furthermore, by including the selective lock mechanism to perform the locking operation and the unlocking operation, the Y-direction moving operation, in which a rail-like holding member on the locked side is moved integrally with rail-like holding member on the moved side, and the distance (width) adjusting operation according to the board width, in which the rail-like holding member on the locked side is fixed and only the rail-like holding member on the moved side is moved, can be selected. The drive shaft for the distance adjustment according to the board width for adjusting the distance between the first and second rail-like holding members according to the board width and the drive shaft for conveying the board can be commonly used (unified). Therefore, the number of drive shafts can be reduced. Thus, the drive mechanism for the distance adjustment according to the board width and the drive mechanism for conveying the board can be simplified.

Furthermore, when one motor is driven to drive rotation of two ball screw shafts synchronously and move the first and second rail-like holding members, the two ball screw shafts can be easily driven synchronously and the first and second rail-like holding members can be reliably moved in parallel.

Furthermore, when the support plate having the support pins and the first and second rail-like holding members are separated and independently driven, the movement mechanism is made lighter and simplified as compared with the case where the support plate and the first and second rail-like holding member are integrally moved. Thus, the moving operation can be faster at a lower cost.

When the board positioning stopper and the board arrival detecting sensor are disposed at the front and rear end portions in the board conveying direction in each board conveying/holding device, the board can be positioned at any one of the front and rear end portions in the board conveying direction. Therefore, in each mounting area, a board positioning position at which the board is positioned, can be arbitrarily determined based on information such as the size of the board, distribution of positions at which components are mounted, distribution of positions at which components are sucked from the component feed unit and held, and so forth.

Furthermore, when component mounting in the first board conveying/holding device and component mounting in the second board conveying/holding device are performed simultaneously, the mounting operations can be performed more efficiently and thus the mounting time can be improved.

Furthermore, when board conveyance from the loader to the first board conveying/holding device, board conveyance from the first board conveying/holding device to the second board conveying/holding device, and board conveyance from the second board conveying/holding device to the unloader are performed simultaneously, the board conveying operations can be performed more efficiently and thus the mounting time can be improved.

According to another aspect of the present invention, the two plate-like member conveying/holding devices (that is, the first plate-like member conveying/holding device and the second plate-like member conveying/holding device) are disposed adjacent to each other, and a plate-like member to be subjected to a prescribed work is carried in or out at the plate-like member conveying position in the work device. After the plate-like member is carried in, the devices hold the plate-like members and move to their respective work positions so that they can independently perform the prescribed work. Therefore, the plate-like members can be carried in and out at the plate-like member conveying positions, while the work for the plate-like members can be performed at the work positions. That is, respective operations can be performed at optimal positions. Therefore, work efficiency of each operation can be improved and there is no portion which is used only for a plate-like member conveying operation and cannot be used for work operations. Thus, the entire installation area of the work device can be effectively utilized.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A method for mounting components, said method comprising:
   carrying in a board from a loader to a first board conveying/holding device by the loader and the first board conveying/holding device;
   moving the first board conveying/holding device holding the carried-in board to a side of one component feed unit;
   mounting components in the one component feed unit onto the board held by the first board conveying/holding device;
   carrying the board from the first board conveying/holding device to a second board conveying/holding device by the first board conveying/holding device and the second board conveying/holding device;
   moving the second board conveying/holding device holding the carried-in board to a side of the other component feed unit;
   mounting components in the other component feed unit onto the board by the second board conveying/holding device; and
   carrying the board from the second board conveying/holding device to an unloader by the second board conveying/holder device and the unloader.

2. A method for mounting components according to claim 1, wherein the component mounting in the first board conveying/holding device and the component mounting in the second board conveying/holding device are simultaneously performed.

3. A method for mounting components according to claim 1, wherein, while the board conveyance from the loader to the first board conveying/holding device, the board conveyance from the first board conveying/holding device to the second board conveying/holding device, and the board conveyance from the second board conveying/holding device to the unloader are performed on a board conveyance path in one line, and the one component feed unit and the other component feed unit are opposed to each other in a direction perpendicular to an extending direction of the board conveyance path, the components are mounted on a half area of the board on a side of the one component feed unit in the first board conveying/holding device and the components are mounted on a half area of the board on a side of the other component feed unit in the second board conveying/holding device.

4. A method for mounting components according to claim 1, wherein the board conveyance from the loader to the first board conveying/holding device, the board conveyance from the first board conveying/holding device to the second board conveying/holding device, and the board conveyance from the second board conveying/holding device to the unloader are simultaneously performed.

5. A method for mounting components according to claim 1, wherein, while the board conveyance from the loader to the first board conveying/holding device, the board conveyance from the first board conveying/holding device to the second board conveying/holding device, and the board conveyance from the second board conveying/holding device to the unloader are performed on a board conveyance path in one line, the one component feed unit and the other component feed unit are opposed to each other in a direction perpendicular to an extending direction of the board conveyance path and each component recognition unit is disposed in a vicinity of each component feed unit on a side of the board conveyance path, the component mounting of the first board conveying/holding device is performed by holding the components from the one component feed unit, recognizing them by the component recognition unit disposed in the vicinity of the one component feed unit on the side of the board conveyance path, and then mounting them on a half area on the side of the one component feed unit of the board held by the first board conveying/holding device in the first board conveying/holding device, and component mounting of the second board conveying/holding device is performed by holding the components from the other component feed unit, recognizing them by the component recognition unit disposed in the vicinity of the other component feed unit on the side of the board conveyance path, and then mounting them on a half area of the board on the side of the other component feed unit of the board held by the second board conveying/holding device in the second board conveying/holding device.

6. A work device for a plate-like member, comprising:
  a first plate-like member conveying/holding device which can carry in and out a plate-like member at a plate-like member conveying position and hold the carried-in plate-like member;
  a second plate-like member conveying/holding device which can be adjacent to the first plate-like member conveying/holding device at the plate-like member conveying position, carry in the plate-like member by the first plate-like member conveying/holding device via the first plate-like member conveying/holding device, hold the plate-like member carried in by the first plate-like member conveying/holding device, and carry out the held plate-like member at the plate-like member conveying position;
  a first moving device for moving the first plate-like member conveying/holding device in a direction crossing the plate-like member conveying direction between the plate-like member conveying position and a first work position at which a prescribed work is performed for the plate-like member held by the first plate-like member conveying/holding device; and
  a second moving device for moving the second plate-like member conveying/holding device in a direction crossing the plate-like member conveying direction between the plate-like member conveying position and a second work position at which a prescribed work is performed for the plate-like member held by the second plate-like member conveying/holding device,
  wherein the plate-like member is carried in and held by the first plate-like member conveying/holding device positioned at the plate-like member conveying/holding position by the first plate-like member conveying/holding device, the first plate-like member conveying/holding device is moved to the first work position by the first moving device, and the prescribed work is performed for the plate-like member held by the first plate-like member conveying/holding device,
  the plate-like member held by the first plate-like member conveying/holding device is carried in from the first plate-like member conveying/holding device positioned at the plate-like member conveying/holding position to the second plate-like member conveying/holding device positioned at a position adjacent to the first plate-like member conveying/holding device by the first plate-like member conveying/holding device and the second plate-like member conveying/holding device and held by the second plate-like member conveying/holding device, the second plate-like member conveying/holding device is moved to the second work position by the second moving device, and the prescribed work is performed to the plate-like member held by the second plate-like member conveying/holding device, and
  the plate-like member held by the second plate-like member conveying/holding device is carried out from the second plate-like member conveying/holding device at the plate-like member conveying/holding position by the second plate-like member conveying/holding device.

7. A work device for a plate-like member according to claim 6, wherein a work area of the work device is divided into two, a first work area and a second work area, assuming the plate-like member conveying direction at the plate-like member conveying position as a border, and
  during a work for the plate-like member, the first moving device moves the first plate-like member conveying/holding device to the first work position in the first work area in which the prescribed work is performed for the plate-like member held by the first plate-like member conveying/holding device, while the second moving device moves the second plate-like member conveying/holding device to the second work position in the second work area in which the prescribed work is performed for the plate-like member held by the second plate-like member conveying/holding device.

8. A work device for a plate-like member according to claim 7, wherein the plate-like member is a board onto which components are to be mounted, the work device for performing the work for the plate-like member is a component mounting apparatus for mounting the components onto the board and the first and second plate-like member conveying/holding devices are first and second board conveying/holding device; and a component mounting work area in the component mounting apparatus, in which the components are mounted, is divided into a first mounting area and a second mounting area along a board conveying direction, the first board conveying/holding device can be moved to a first component mounting position as the first work position in the first mounting area by the first moving device, while the second board conveying/holding device can be moved to a second component mounting position as the second work position in the second mounting area by the second moving device, and the components are independently mounted onto a board held by each board conveying/holding device in each mounting area.

9. A work device for a plate-like member according to claim 6, wherein the plate-like member is a board onto which components are to be mounted, the work device for performing the work for the plate-like member is a component mounting apparatus for mounting the components onto the board and the first and second plate-like member conveying/holding devices are first and second board conveying/holding device; and a component mounting work area in the component mounting apparatus, in which the components are mounted, is divided into a first mounting area and a second mounting area along a board conveying direction, the first board conveying/holding device can be moved to a first component mounting position as the first work position in the first mounting area by the first moving device, while the second board conveying/holding device can be moved to a second component mounting position as the second work position in the second mounting area by the second moving device, and the components are independently mounted onto a board held by each board conveying/holding device in each mounting area.

10. A work device for a plate-like member according to claim 9, wherein a first component feed unit for feeding the components to be mounted onto the board is disposed at an end edge portion in the first mounting area on an opposite side of the second mounting area, a first component recognition unit is disposed in a vicinity of the first component feed unit and on a side of the first work position, and the work device further comprises a working head which can move in the first mounting area, holds the components from the first component feed unit, and mounts the components onto the board held by the first board conveying/holding device positioned at the first component mounting position after the components are recognized by the first component recognition unit, and a second component feed unit for feeding the components to be mounted onto the board is disposed at an end edge portion in the second mounting area on an opposite side of the first mounting area, a second component recognition unit is disposed in a vicinity of the second component feed unit and one a side of the second work position, and the work device further comprises a working head which can move in the second mounting area, holds the components from the second component feed unit, and mounts the components onto the board held by the second board conveying/holding device positioned at the second component mounting position after the components are recognized by the second component recognition unit.

11. A work method for a plate-like member, comprising:

while a first plate-like member conveying/holding device which can carry in and out and hold a plate-like member, and a second plate-like member conveying/holding device which can carry in and out and hold a plate-like member, are positioned adjacent to each other at a plate-like member conveying position, carrying the plate-like member into the first plate-like member conveying/holding device by the first plate-like member conveying/holding device, carrying in and holding the carried-in plate-like member by the second plate-like member conveying/holding device via the first plate-like member conveying/holding device by the first plate-like member conveying/holding device, and carrying in and holding a subsequent plate-like member by the first plate-like member conveying/holding device by the first plate-like member conveying/holding device;

moving the first plate-like member conveying/holding device from the plate-like member conveying position to a first work position in a direction crossing a plate-like member conveying direction, and moving the second plate-like member conveying/holding device from the plate-like member conveying position to a second work position in a direction crossing the plate-like member conveying direction;

performing a prescribed work for the plate-like member held by the first plate-like member conveying/holding device at the first work position, and performing a prescribed work for the plate-like member held by the second plate-like member conveying/holding device at the second work position;

moving the first plate-like member conveying/holding device from the first work position to the plate-like member conveying position in a direction crossing to the plate-like member conveying direction, while moving the second plate-like member conveying/holding device from the second work position to the plate-like member conveying position in a direction crossing to the plate-like member conveying direction; and while the first plate-like member conveying/holding device and the second plate-like member conveying/holding device are positioned adjacent to each other at the plate-like member conveying position, carrying out the plate-like member held by the second plate-like member conveying/holding device from the second plate-like member conveying/holding device by the second plate-like member conveying/holding device, while carrying out the plate-like member held by the first plate-like member conveying/holding device from the first plate-like member conveying/holding device to the second plate-like member conveying/holding device by the first plate-like member conveying/holding device and the second plate-like member conveying/holding device.

12. A work method for a plate-like member according to claim 11, wherein, when a work area of the work device is divided into two, a first work area and a second work area assuming the plate-like member conveying direction at the plate-like member conveying position as a border and the plate-like member conveying/holding devices are moved to the work positions;

the first plate-like member conveying/holding device is moved to the first work position in the first work area, in which the prescribed work is performed for the plate-like member held by the first plate-like member conveying/holding device, while the second plate-like member conveying/holding device is moved to the second work position in the second work area, in which the prescribed work is performed for the plate-like member held by the second plate-like member conveying/holding device.

13. A work method for a plate-like member according to claim 12, wherein, when the plate-like member is a board onto which components are to be mounted, the work device for performing the work for the plate-like member is a component mounting apparatus for mounting the components onto the board, the first and second plate-like member conveying/holding devices are first and second board conveying/holding devices, and a component mounting work area in the component mounting apparatus, in which components are mounted is divided into a first mounting area and a second mounting area along a board conveying direction;

the first board conveying/holding device can be moved to a first component mounting position as the first work position in the first mounting area, while the second board conveying/holding device can be moved to a second component mounting position as the second work position in the second mounting area by the second moving device, and components are independently mounted onto a board held by each board conveying/holding device in each mounting area.

14. A work method for a plate-like member according to claim 11, wherein, when the plate-like member is a board onto which components are to be mounted, the work device for performing the work for the plate-like member is a component mounting apparatus for mounting the components onto the board, the first and second plate-like member conveying/holding devices are first and second board conveying/holding devices, and a component mounting work area in the component mounting apparatus, in which components are mounted is divided into a first mounting area and a second mounting area along a board conveying direction;

the first board conveying/holding device can be moved to a first component mounting position as the first work position in the first mounting area, while the second board conveying/holding device can be moved to a second component mounting position as the second work position in the second mounting area by the second moving device, and components are independently mounted onto a board held by each board conveying/holding device in each mounting area.

15. A work method for a plate-like member according to claim 14, wherein, in the first mounting area, the components are held by a working head from a first component feed unit installed at an end edge portion on an opposite side of the second mounting area in the first mounting area during the prescribed work, and, after the components held by the working head are recognized by a first component recognition unit disposed in a vicinity of the first component feed unit and on a side of the first work position, the components held by the working head are mounted onto the first board conveying/holding device positioned at the first component mounting position, while independently from the above component holding, component recognition, and component mounting, in the second mounting area, the components are held by a working head from a second component feed unit installed at an end edge portion on an opposite side of the second mounting area in the second mounting area, and, after the components held by the working head are recognized by second component recognition unit disposed in a vicinity of the second component feed unit and on a side of the second work position, the components held by the working head are mounted onto the second board conveying/holding device positioned at the second component mounting position.

16. A work method for a plate-like member according to claim 14, wherein the plate-like member is held across both the first and second plate-like member conveying/holding devices, and the first and second plate-like member conveying/holding devices are synchronously moved in parallel to either one of the first mounting area and the second mounting area to mount the components.

* * * * *